United States Patent
Chen et al.

(10) Patent No.: US 7,057,009 B2
(45) Date of Patent: *Jun. 6, 2006

(54) LIGHT-EMITTING ORGANIC OLIGOMER COMPOSITIONS

(75) Inventors: Shaw H. Chen, Penfield, NY (US); Yanhou Geng, Rochester, NY (US)

(73) Assignee: University of Rochester, Rochester, NY (US)

( * ) Notice: Subject to any disclaimer, the term of this patent is extended or adjusted under 35 U.S.C. 154(b) by 79 days.

This patent is subject to a terminal disclaimer.

(21) Appl. No.: 10/199,099

(22) Filed: Jul. 22, 2002

(65) Prior Publication Data

US 2003/0039838 A1    Feb. 27, 2003

Related U.S. Application Data

(60) Provisional application No. 60/364,145, filed on Mar. 15, 2002, provisional application No. 60/322,016, filed on Sep. 14, 2001, provisional application No. 60/307,065, filed on Jul. 20, 2001.

(51) Int. Cl.
C08G 64/00 (2006.01)

(52) U.S. Cl. .................. 528/370; 528/377; 528/423; 528/425; 428/690; 428/917

(58) Field of Classification Search .............. 528/397, 528/401, 370, 377, 423, 425; 521/82; 428/421, 428/690, 917; 427/407.1

See application file for complete search history.

(56) References Cited

U.S. PATENT DOCUMENTS

| | | | |
|---|---|---|---|
| 5,026,894 A | 6/1991 | Tour et al. | |
| 5,621,131 A | 4/1997 | Kreuder et al. | |
| 5,708,130 A | 1/1998 | Woo et al. | |
| 5,741,921 A | 4/1998 | Kreuder et al. | |
| 5,750,641 A | 5/1998 | Ezzell et al. | |
| 5,763,636 A | 6/1998 | Kreuder et al. | |
| 5,777,070 A | 7/1998 | Inbasekaran et al. | |
| 5,840,217 A | 11/1998 | Lupo et al. | |
| 5,859,211 A | 1/1999 | Kreuder et al. | |
| 5,876,864 A | 3/1999 | Kim et al. | |
| 5,962,631 A | 10/1999 | Woo et al. | |
| 6,132,641 A | 10/2000 | Rietz et al. | |
| 6,169,163 B1 | 1/2001 | Woo et al. | |
| 6,211,369 B1 | 4/2001 | Salbeck et al. | |
| 6,255,447 B1 | 7/2001 | Woo et al. | |
| 6,309,763 B1 | 10/2001 | Woo et al. | |
| 6,416,887 B1 | 7/2002 | Tokito et al. | |
| 6,477,284 B1 | 11/2002 | Oda et al. | |
| 2002/0013451 A1 | 1/2002 | Huang et al. | |

FOREIGN PATENT DOCUMENTS

EP    0 676 461 A2    10/1995

(Continued)

OTHER PUBLICATIONS

Claims U.S. Appl. No. 10/898,223.*

(Continued)

Primary Examiner—Duc Truong
(74) Attorney, Agent, or Firm—Oliff & Berridge, PLC

(57) ABSTRACT

Photonic materials include light-emitting organic oligomer compositions that include at least one light-emitting oligomer. The oligomer compositions include oligofluorenes having chiral and/or achiral pendants. The oligomer compositions also include spiro-linked oligofluorenes and fully spiro-configured terfluorenes. Methods for syntheisizing light-emitting organic oligomer compositions include preparing fluorene-based oligomers by convergent/divergent synthesis.

15 Claims, 12 Drawing Sheets

FOREIGN PATENT DOCUMENTS

| EP | 1 149 827 A1 | 10/2001 |
|---|---|---|
| WO | WO 97/05184 | 2/1997 |
| WO | WO 97/33323 | 9/1997 |
| WO | WO 00/46321 | 8/2000 |
| WO | WO 01/42331 A1 | 6/2001 |

OTHER PUBLICATIONS

A. E. A. Contoret et al., "Polarized Electroluminescence from an Anisotropic Nematic Network on a Non-contact Photoalignment Layer", Advanced Materials, 2000, vol. 12, pp. 971-974.

T. Miteva et al., "Improving the Performance of Polyfluorene-Based Organic Light-Emitting Diodes via End-capping", Advanced Materials, 2001, vol. 13, No. 8, pp. 565-570.

Y. Yoshida et al., "Color-Tunable Highly Polarized Emissions from Uniaxially Aligned Thin Films of Thiophene/Phenylene Co-oligomers", Advanced Materials, 2000, vol. 12, No. 21, pp. 1587-1591.

G. Kläner et al., "Colorfast Blue-Light-Emitting Random Copolymers Derived from Di-n-hexylfluorene and Anthracene", Advanced Materials, 1998, vol. 10, No. 13, pp. 993-997.

M. Oda et al., "Circularly Polarized Electroluminescense from Liquid-Crystalline Chiral Polyfluorenes", Advanced Materials, 2000, vol. 12, pp. 362-365.

A. Donat-Bouillud et al., "Light-Emitting Diodes from Fluorene-Based π-Conjugated Polymers", Chemical Materials, pp. A-F.

J. Lee et al., "Color Tuning in Polyfluorenes by Copolymerization with Low Band Gap Comonomers", Synthetic Metals, vol. 102, 1999, pp. 1087-1088.

H. van Mullekom et al., "Band-Gap Engineering of Donor—Acceptor-Substituted π-Conjugated Polymers", Chem. Eur. J., 1998, vol. 4, No. 7, pp. 1235-1243.

U.S. Appl. No. 60/307,065, filed Jul. 2001, Chen et al.

U.S. Appl. No. 60/322,016, filed Sep. 2001, Chen et al.

U.S. Appl. No. 60/364,145, filed Mar. 2002, Chen et al.

J. Raimundo et al., "Proquinoid Acceptors as Building Blocks for the Design of Efficient π-Conjugated Fluorophores with High Electron Affinity", Chem. Commun., 2000, pp. 949-940.

W. Yu et al., "New Efficient Blue Light Emitting Polymer for Light Emitting Diodes", Chem. Commun., 1999, pp. 1837-1838.

S. Tokito et al., "Acene Containing Polyfluorenes for Red, Green and Blue Emission in Organic Light-Emitting Diodes", Proceedings of SPIE, vol. 4105, 2001, pp. 69-74.

J. Morin et al., "Blue Light-Emitting Devices from New Conjugated Poly(N-substituted-2, 7-carbazole) Derivatives", Applied Physics Letters, 2002, vol. 80, No. 3, pp. 341-343.

Y. He et al., "High-Efficiency Organic Polymer Light-Emitting Heterostructure Devices on Flexible Plastic Substrates", Applied Physics Letters, 2000, vol. 76, No. 6, pp. 661-663.

L. Picciolo et al., "Organic Light-Emitting Devices with Saturated Red Emission Using 6,13-Diphenylpentacene", Applied Physics Letters, 2001, vol. 78, No. 16, pp. 2378-2380.

K. Whitehead et al., "Highly Polarized Blue Electroluminescence from Homogeneously Aligned Films of Poly(9,9-Dioctylfluorene)", Applied Physics Letters, 2000, vol. 76, No. 20, pp. 2946-2948.

G. Klaerner et al., "Polyfluorene Derivatives: Effective Conjugation Lengths from Well-Defined Oligomers", Macromolecules, 1998, vol. 31, pp. 2007-2009.

S. Lee et al., "Molecular Design of Fluorene-based Polymers and Oligomers for Organic Light-Emitting Diodes", Elsevier, Thin Solid Films 363, 2000, pp. 76-80.

C. Seliskar et al., "Characterization of New Excimer Pumped UV Laser Dyes", Laser Chem., vol. 13, pp. 19-28.

Fukuda et al., "Fusible Conducting Poly(9-alkylfluorene) and Poly(9,9-dialkyfluorene) and Their Characteristics", Japanese Journal of Applied Physics, 1989, vol. 28, pp. L1433-L1435.

Fukuda et al., "Synthesis of Fusible and Soluble Conducting Polyfluorene Derivatives and Their Characteristics" Journal of Polymer Science, Polymer Chemistry Edition, 1993, vol. 31, pp. 2465-2471.

Brown et al., "Polynuclear and Halogenated Structures in Polyphenylenes Synthesized from Benzene, Biphenyl, and p-Terphenyl under Various Conditions: Characterization by Laser Desorption/Fourier Transform Mass Spectrometry", Journal of Polymer Science, Polymer Chemistry Edition, 1989, vol. 24, pp. 255-267.

Chen et al., "Synthesis, Characterization, and Optical Properties of Monodisperse Chiral Oligofluorenes", Journal of the American Chemical Society, 2002, vol. 104, pp. 8337-8347.

Chen et al., "Fully Spiro-Configured Terfluorenes as Novel Amorphous Materials Emitting Blue Light", Chemistry of Materials, 2002, vol. 14, pp. 463-470 and 1332-1339.

Y. Geng et al., "Fully Spiro-Configured Terfluorenes as Novel Amorphous Materials Emitting Blue Light", Chem. Mater., 2002, vol. 14, No. 1, pp. 463-470.

Y. Geng et al., "Synthesis, Characterization, and Optical Properties fo Monodisperse Chiral Oligofluorenes", J. Am. Chem. Soc., JACS Articles, pp. A-K.

D. Katsis et al., "Spiro-Linked Ter-, Penta-, and Heptafluorenes as Novel Amorphous Materials for Blue Light Emission", Chem. Mater., 2002, vol. 14, No. 3, pp. 1332-1339.

D. Neher, "Polyfluorenes Homopolymers: Conjugated Liquid-Crystalline Polymers for Bright Blue Emission and Polarized Electroluminescence", Macromol. Rapid Commun. 2001, vol. 22, No. 17, pp. 1366-1385.

M. Grell et al., "Polarized Luminescesnce from Oriented Molecular Materials", Advanced Materials, 1999, vol. 11, No. 11, pp. 895-905.

* cited by examiner

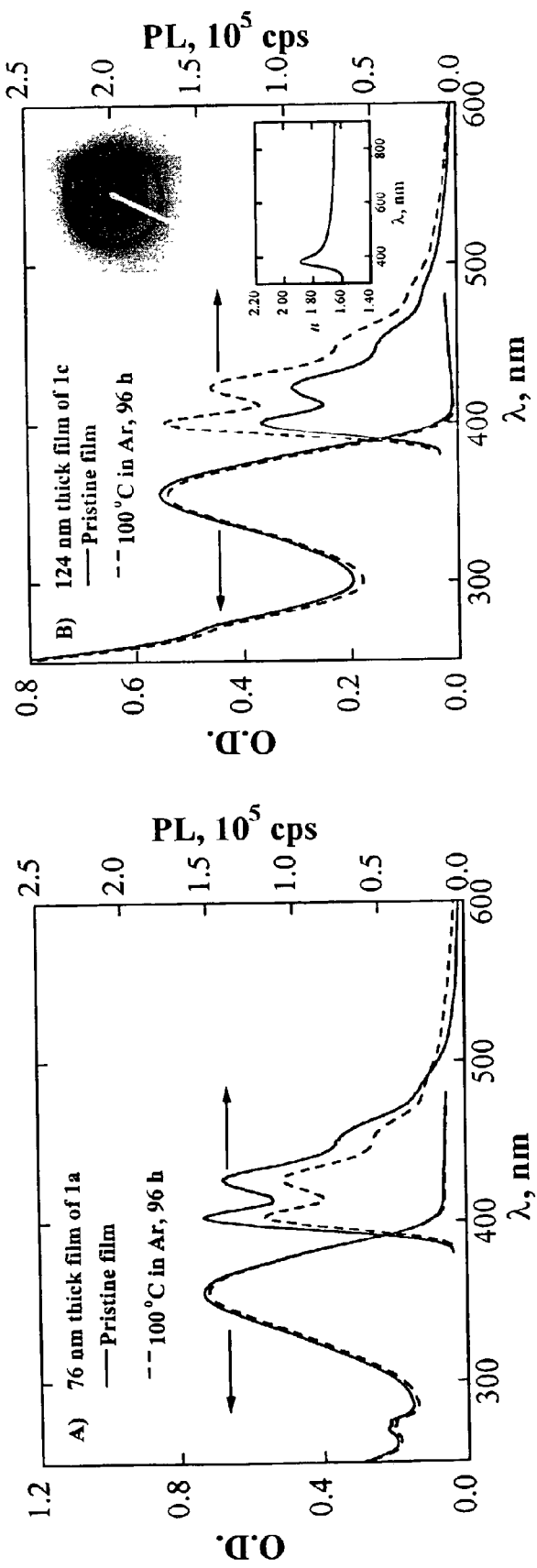

LIGHT-EMITTING ORGANIC OLIGOMER COMPOSITIONS

This non-provisional application claims the benefit of U.S. Provisional Applications Nos. 60/307,065, filed Jul. 20, 2001, 60/322,016, filed Sep. 14, 2001 and 60/364,145, filed Mar. 15, 2002. The entire disclosure of each and all of these provisional applications is hereby incorporated by reference herein in its entirety.

This invention was made with United States government support from the Army Research Office under Agreement Nos. DAAD19-99-1-0206, DAAD19-01-1-0676, and the National Science Foundation under Agreement Nos. CTS-9818234 and CTS-0204827. The United States government may have certain rights in this invention.

BACKGROUND OF THE INVENTION

This invention is directed to light-emitting organic oligomer compositions. This invention is also directed to methods for preparing such oligomer compositions. This invention is further directed to devices comprising films and coatings prepared from such oligomer compositions.

Developments in the field of electroluminescence have resulted in devices having access to the full color spectrum using polymers. These developments have further permitted refinements in device parameters such as brightness, power efficiency, and stability.

In spite of advances in luminescent polymers, these polymers have not been readily adapted for use in liquid crystal displays. It has been suggested that organic light-emitting devices could be employed as backlights in liquid crystal displays, if the devices produced polarized light, because such an application would make the use of polarizers and color filters in current liquid crystal displays redundant. To achieve an organic light-emitting backlight that does not require further processing of light with a polarizer and color filters, a device producing high polarization ratios is needed. One challenge associated with obtaining highly polarized light is obtaining a light-emitting device with highly aligned emitters.

To obtain such a device, organic materials that are highly anisotropic and can be oriented in a specific direction must be employed. A variety of techniques have been employed to obtain light-emitting devices having such orientation, including mechanical alignment, Langmuir-Blodgett deposition, liquid crystalline self-organization and alignment on specific substrates.

Efforts to obtain light-emitting devices having such orientation have involved further manipulation of the organic polymers themselves. Fukuda et al., Japanese Journal of Applied Physics, Vol. 28, pp. L1433–L1435 (1989), discloses polymers and oligomers of fluorenes substituted by alkyl groups at the 9-carbon position. According to Fukuda, fluorene monomers are treated for several days with oxidizing metal salts such as ferric chloride. The resulting structures are poly(fluorene-2,7-diyls). The polymers and oligomers of Fukuda are not satisfactory due to significant crosslinking and mislinking reactions during the polymerization. See Fukuda et al., Journal of Polymer Science, Polymer Chemistry Edition, Vol. 31, pp. 2465–2471 (1993).

Brown et al., Journal of Polymer Science, Polymer Chemistry Edition, Vol. 24, pp. 255–267 (1989), describes chemical defects that are obtained when polyfluorenes are obtained using known techniques. One such problem is that polynuclear structures and substitutions at positions other than the 2,7-positions result. Further, oxidative polymerization can fail to be regiospecific and, thus, fluorenes couple at other positions, such as the 3,5- and 3,6-positions. Also, branching can occur resulting in attachment of more than two fluorene molecules to a given fluorene molecule. Such trifunctional materials can crosslink during preparation of the polymer. In addition, materials produced by known methods can display high polydispersity, tendancy to crystallize, and low glass transition temperatures.

Other fluorenes and preparation techniques have been provided, for example, in U.S. Pat. Nos. 5,708,130, 5,962,631 and 6,169,163 to Woo et al. and U.S. Pat. No. 5,777,070 and PCT Publication No. WO 00/46321 to Inbasekaran et al. However, these approaches do not fully address the difficulties set forth above. The compounds and techniques taught by Woo and Inbasekaran yield polydisperse compositions. Such compositions are limited by the methods by which they can be deposited to create devices. The compositions further suffer from chemical impurities, distributed chain length and distributed chemical composition. Polydisperse oligomer and polymer compositions are not well suited conventional film formation processes. In the instance where vacuum sublimation is employed, because polydisperse compositions comprise molecules having a variety of different molecular weights, an appropriate vapor pressure cannot be selected so that the composition can be evenly applied to a substrate. Polydisperse compositions also do not spin coat well because the wide distribution of high molecular weight constituent molecules results in a non-homogeneous film that is also difficult to align across a large area. Some constituents may crystallize, and aggregates may form. A film formed from polydisperse compositions can include aggregates that are quenching regions, reducing the efficiency of devices formed from such films. Such aggregates can also cause instability in emissive color over time.

SUMMARY OF THE INVENTION

There is still a need for organic light-emitting devices that are useful in electronics, optics, photonics and optoelectronics. For example, liquid crystal display technology that is currently widely used is greatly limited due to power inefficiency. Approximately 95% of the energy provided by a backlight in a liquid crystal display is lost as the light is filtered through dichroic polarizers and color filters.

This invention provides oligomer compositions and methods for producing oligomer compositions that can be readily processed into thin films by vacuum deposition and/or spin coating. Furthermore, oligomer compositions according to embodiments of this invention can emit polarized light having color that can be tuned by varying the chemical makeup of the constituent oligomers.

Compositions according to embodiments of this invention can be monodisperse conjugated organic oligomer compositions. Because embodiments of such compositions comprise oligomers that are of relatively low molecular weight (such as less than 5,000 g/mole), readily soluble in benign solvents (such as methylene chloride, chloroform, THF, toluene, etc.), and are monodisperse, rather than polydisperse, such compositions can be produced with greater chemical purity. Further, monodisperse oligomer compositions according to this invention do not comprise constituent compounds of distributed chain length and chemical composition, which, as a result, have distributed properties. Monodisperse oligomer compositions according to this invention are easily processed into uniform, randomly oriented, uniaxially aligned, and helically stacked thin films having temporal stability of emissive color.

Monodisperse compositions have an absence of significant chain length distribution (i.e., substantially all molecules have the same number of monomer units or residues) or molecular weight distribution. As used in this application, monodisperse compositions include those compositions having a polydispersity factor of less than about 3. The polydispersity factor is the ratio of the weight average molecular weight of molecules in a composition to the number average molecular weight of molecules in a composition. In embodiments, oligomer compositions according to this invention have a polydispersity factor of from about 1 to about 2. In some such embodiments, oligomer compositions according to this invention have a polydispersity factor of from about 1 to about 1.5. In embodiments, oligomer compositions according to this invention have a polydispersity factor of about 1.

Embodiments of this invention include light-emitting organic oligomer compositions capable of spontaneous uniaxial alignment mediated by nematic mesomorphism above the glass transition temperatures of the compositions. Embodiments of this invention include light-emitting organic oligomer compositions having orientational order parameters of at least 0.4. Embodiments of this invention include light-emitting organic oligomer compositions having polarization ratios of at least 5.

Embodiments of this invention include light-emitting organic oligomer compositions comprising at least one light-emitting oligomer. In embodiments, the oligomer compositions comprise fluorene-based oligomers. Embodiments of this invention are directed to oligofluorene compositions comprising oligofluorenes having chiral and/or achiral pendants. In embodiments, the oligomer compositions comprise spiro-linked oligofluorenes. In some embodiments, the oligomer compositions comprise fully spiro-configured terfluorenes.

Embodiments of this invention include light-emitting organic oligomer compositions having a capability for spontaneous helical stacking mediated by cholesteric mesomorphism above the glass transition temperature of the composition. Embodiments of this invention also include light-emitting organic oligomer compositions having a capability for forming isotroipc films.

Embodiments of this invention include oligomer compositions comprising light-emitting organic oligomers, the oligomers comprising a spirobifluorene having at least four pendant fluorenes, the pendant fluorenes being spiro-linked to aromatic moieties. Embodiments of this invention include oligomer compositions comprising light-emitting organic oligomers, the oligomers comprising a spirobifluorene having at least four pendant fluorenes. Embodiments of this invention include light-emitting organic oligomers, the oligomers comprising a spirobifluorene having at least four pendant fluorenes, the pendant fluorenes being spiro-linked to aromatic moieties.

Embodiments of this invention include methods for synthesizing light-emitting organic oligomer compositions. Preferred methods include synthesizing fluorene-based oligomer compositions.

Oligomer compositions according to embodiments of this invention can be used in electronics, optics, photonics and optoelectronics applications. For example, oligomer compositions according to this invention can be used to prepare films or coatings which may be used in light-emitting devices. In various exemplary embodiments, oligomer compositions according to this invention can be used as emitting layers in such light-emitting devices. Further, embodiments of oligomer compositions according to this invention can be employed as protective layers in electronic devices or as fluorescent coatings in a wide variety of applications.

These and other features and advantages of this invention are described in, or are apparent from, the following detailed description of embodiments of compositions and methods according to this invention.

BRIEF DESCRIPTION OF THE FIGURES

Various embodiments of this invention will be described in detail, with reference to the following figures, wherein:

FIGS. 1(a)–5(a) are thermograms of achiral oligomer compositions according to embodiments of this invention as a function of temperature, and FIGS. 1(b)–5(b) are graphs showing absorbance and emission intensity of such compositions as a function of wavelength;

FIGS. 6(a)–7(a) are thermograms of chiral oligomer compositions according to this invention as a function of temperature, FIGS. 6(b)–8(b) are graphs showing absorbance and emission intensity as a function of wavelength, FIGS. 6(c)–8(c) are circular dichroism spectra for various chiral oligomer compositions according to this invention, and FIGS. 6(d)–8(d) are dissymmetry spectra for various chiral oligomer compositions according to this invention;

FIG. 10 FIGS. 10(a), 10(b) and 10(c) are graphs showing absorbance and emission intensity of spiro-linked oligomer compositions as a function of wavelength;

FIGS. 12(a) and 12(b) are graphs showing absorbance and emission intensity as a function of wavelength, along with electron diffraction (inset) of fully spiro-configured oligomer compositions.

DETAILED DESCRIPTION OF EMBODIMENTS

Figure 1A:
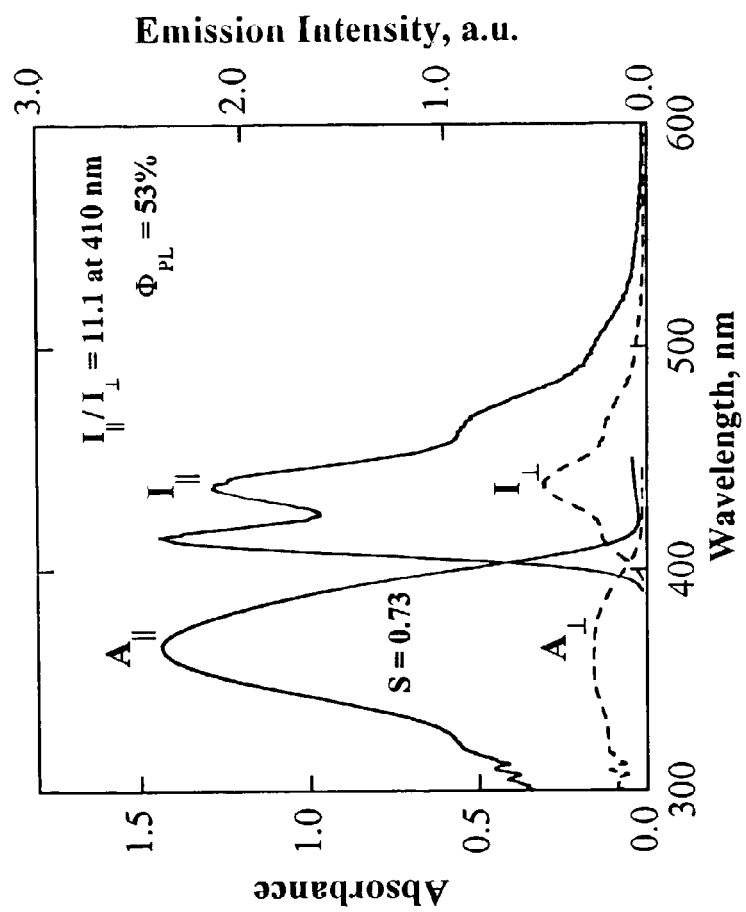
Figure 1B:
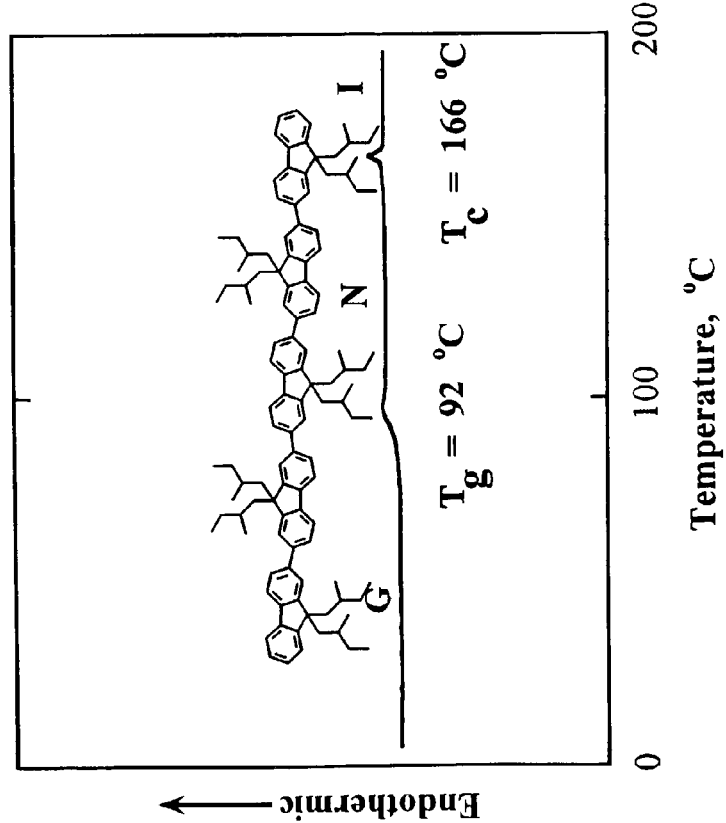

Embodiments of this invention include light-emitting organic oligomer compositions comprising at least one light-emitting oligomer.

Embodiments of oligomer compositions according to this invention are monodisperse. Monodisperse compositions have an absence of significant chain length distribution (i.e., substantially all molecules have the same number of monomer units or residues) or molecular weight. As used in this application, monodisperse compositions include those compositions having a polydispersity factor of less than about 3. In embodiments, oligomer compositions according to this invention have a polydispersity factor of from about 1 to about 2. In embodiments, oligomer compositions according to this invention have a polydispersity factor of from about 1 to about 1.5. In some embodiments, oligomer compositions according to this invention have a polydispersity factor of about 1.

The substantial uniformity in shape and size of the constituent oligomers in embodiments of oligomer compositions according to this invention results in improved chemical purity over known compositions. Furthermore, because embodiments of compositions according to this invention do not have a significantly distributed molecular length within the composition, the compositions do not suffer from the effects of varying properties throughout the composition. Embodiments of oligomer compositions according to this invention can be easily processed into uniform thin films having temporal stability of emissive color.

Embodiments of this invention, particularly compositions comprising achiral oligomers, are capable of spontaneous uniaxial alignment mediated by nematic mesomorphism above the glass transition temperature. Moreover, the unaxial alignment can be frozen in the solid state (i.e., below the glass transition temperature), for example, for use in efficient and stable linearly polarized light-emitting diodes. Such compositions, which emit linearly polarized light, are also potentially useful in the manufacture of devices such as efficient light sources for LCDs.

Embodiments of this invention, particularly compositions comprising oligomers having chiral pendants, emit circularly polarized light. These compositions can be processed into solid films in which conjugated oligomers are helically stacked. Such compositions, which are capable of emitting circularly polarized light, are potentially useful in the manufacture of devices such as stereoscopic electroluminescent displays. The potential of such devices is described in Chen et al., Journal of the American Chemical Society, Vol. 104, pp. 8337–8347 (2002), which is incorporated herein by reference in its entirety.

Embodiments of this invention, particularly compositions comprising oligomers having spiro-linked elements, emit unpolarized light. These compositions can be processed into isotropic solid films in which all molecules are randomly oriented. Such compositions, which are capable of emitting unpolarized light, are potentially useful in the manufacture of devices such as electroluminescent flat-panel displays. The potential of such compositions is described in Chen et al., Chemistry of Materials, Vol. 14, pp. 463–470 and 1332–1339 (2002), which is incorporated herein by reference in its entirety.

Embodiments of oligomer compositions according to this invention exhibit a high degree of uniaxial alignment. In embodiments, oligomer compositions according to this invention exhibit an orientational order parameter (S) of at least about 0.4. In other embodiments, oligomer compositions according to this invention exhibit an orientational order parameter (S) of from about 0.4 to about 1.0. In embodiments, oligomer compositions according to this invention exhibit an orientational order parameter (S) of from about 0.5 to about 1.0. In embodiments, oligomer compositions according to this invention exhibit an orientational order parameter (S) of from about 0.7 to about 1.0. In some embodiments, oligomer compositions according to this invention exhibit an orientational order parameter of about 0.84.

In embodiments, oligomer compositions according to this invention, particularly achiral oligomer compositions, exhibit a polarization ratio (PR) of at least about 5. In embodiments, oligomer compositions according to this invention exhibit a polarization ratio (PR) of from about 5 to about 50. In embodiments, oligomer compositions according to this invention exhibit a polarization ratio (PR) of from about 12 to about 40. In some embodiments, oligomer compositions according to this invention exhibit a polarization ratio of about 16.

Embodiments of the oligomer compositions can include segments of fluorene residues placed in a predetermined sequence including an aromatic linking unit.

Embodiments of this invention include oligomer compositions comprising conjugated oligomers described by the following formula:

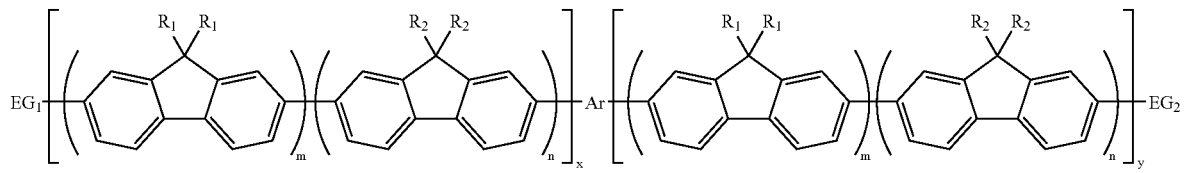

where:

R$_1$ and R$_2$ are substituted or unsubstituted, chiral or achiral, alkyl or alkoxy groups;

EG$_1$ and EG$_2$ are endgroups;

Ar is a group including one or more aromatic substituents; and m and n are from 0 to about 10 and m+n≧1;

x and y are from about 1 to about 5; and (m+n)(x+y) is at least about 2 and preferably from about 2 to about 20.

In this formula, and in every other formula in this disclosure, it should be understood that when a variable appears more than once within a single formula (e.g., R$_1$ and R$_2$), the variable can have a different value for each appearance.

Conjugated oligomers according to embodiments of this invention include segments of fluorene residues placed in a predetermined sequence including an aromatic linking unit. The aromatic group and each of the fluorene residues may be linked at the 2- and 7-carbons of the fluorene residues. The fluorene residues preferably include two functional groups at the 9-carbon of each fluorene residue. The terminal fluorene residues each preferably possess an endgroup at the one of the 2- and 7-carbons that is not bonded to an adjacent fluorene residue.

The conjugated oligomers in a composition of the invention preferably possess uniform chain lengths.

Depending on whether a particular oligomer comprises achiral or chiral pendants, the resulting oligomer will be achiral or chiral. Conjugated achiral oligomers according to this invention include, but are not limited to, the following oligomers:

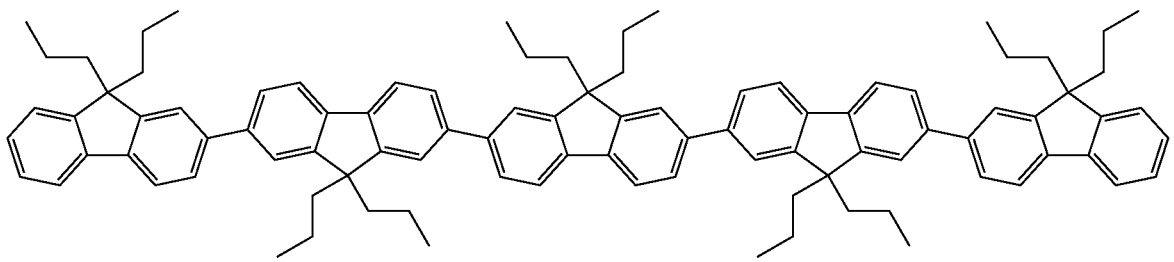
F(Pr)5
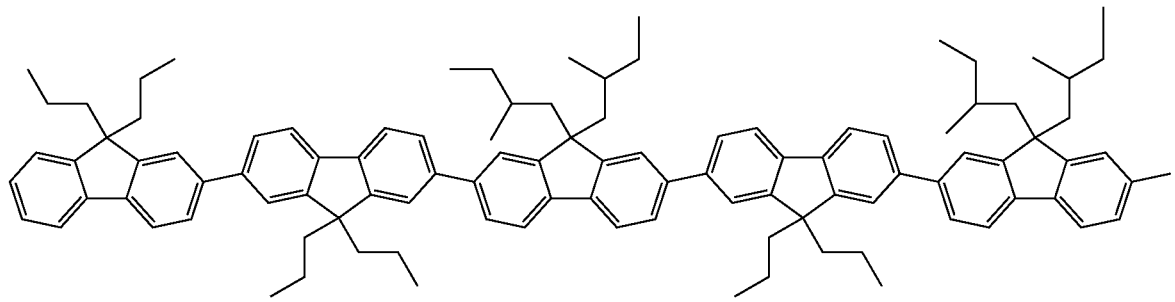
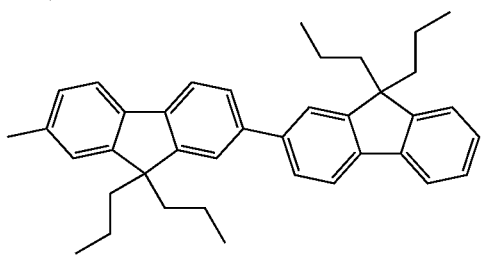
F(Pr)5F(MB)2
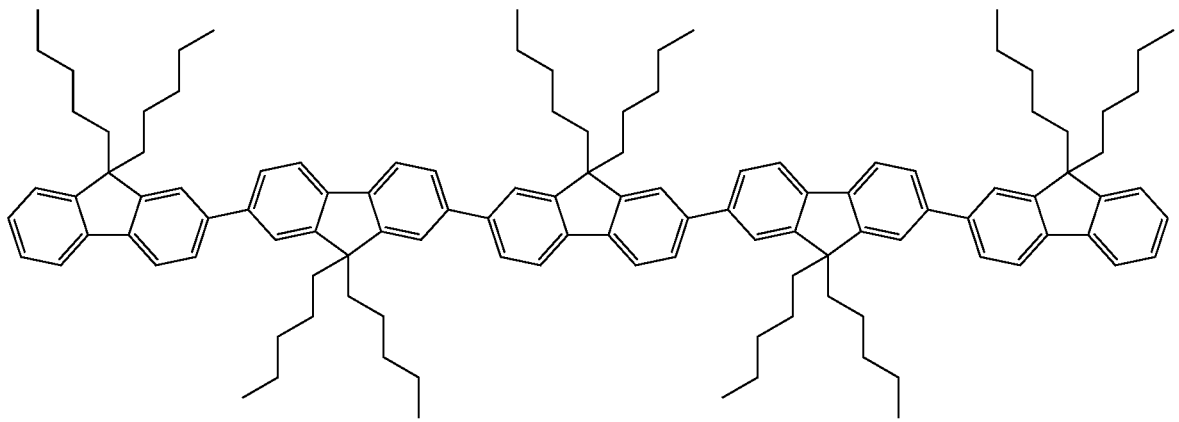
F(Pe)5
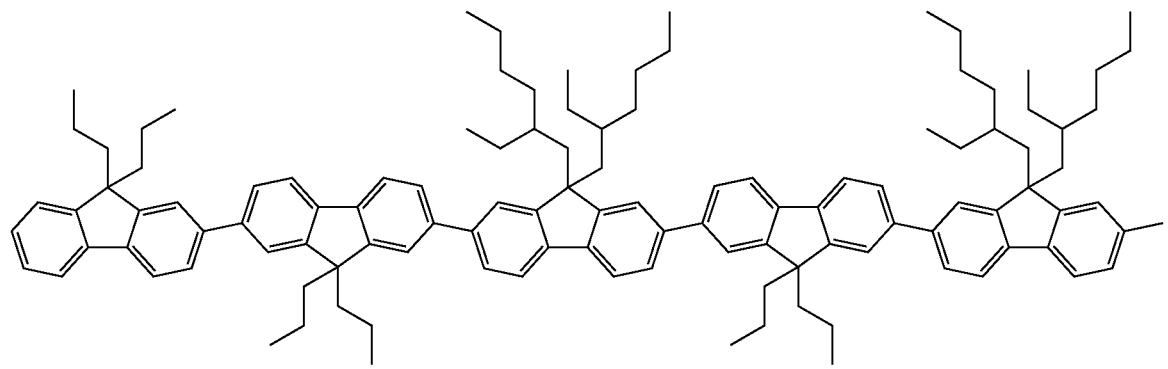

-continued
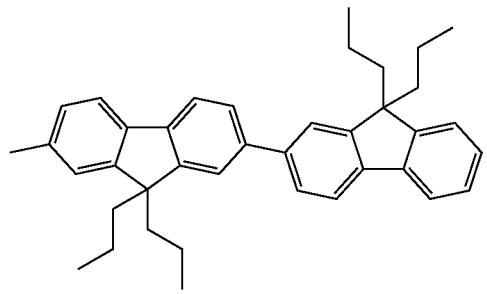
F(Pr)5F(EH)2
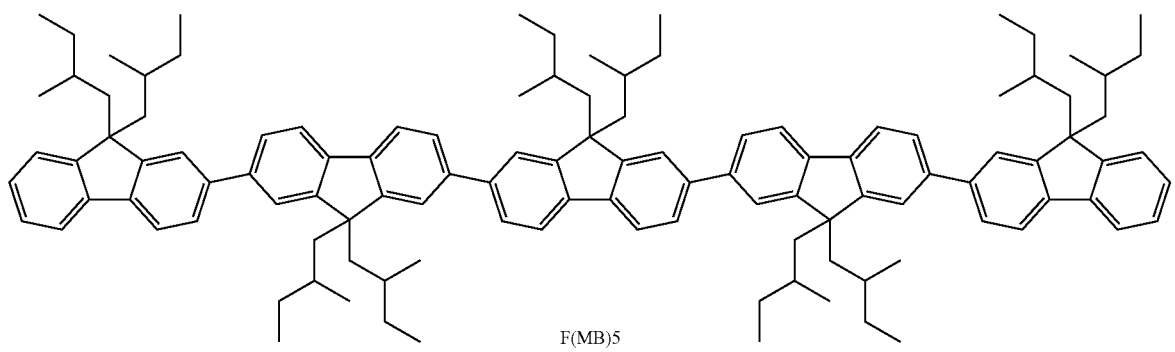
F(MB)5
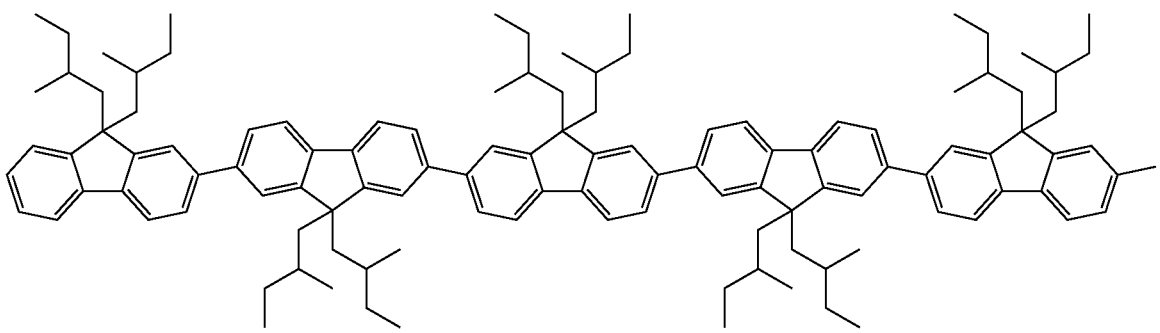
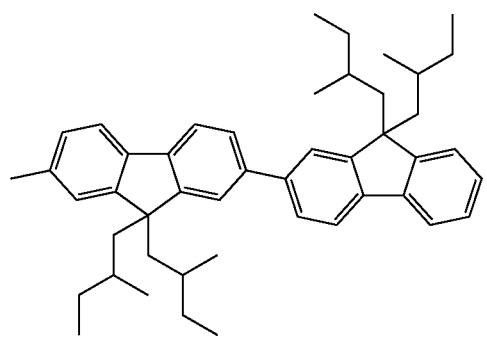
F(MB)7

-continued
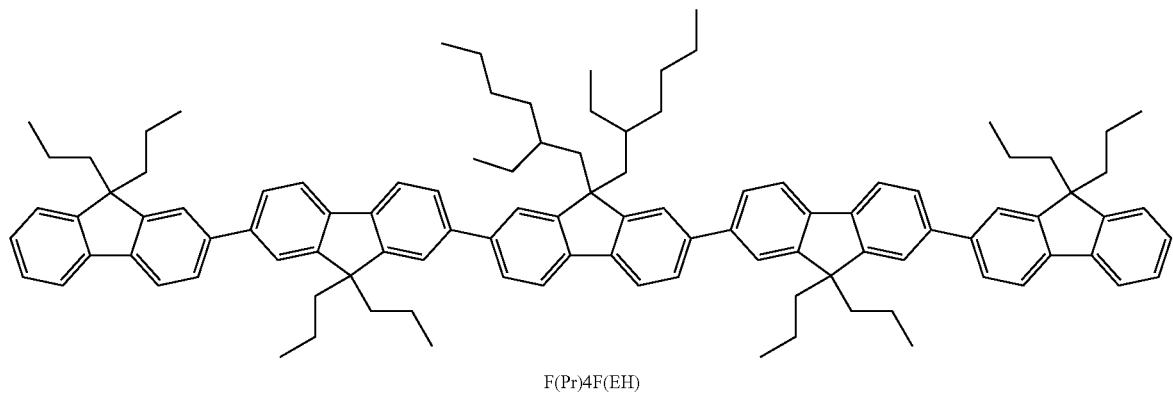
F(Pr)4F(EH)
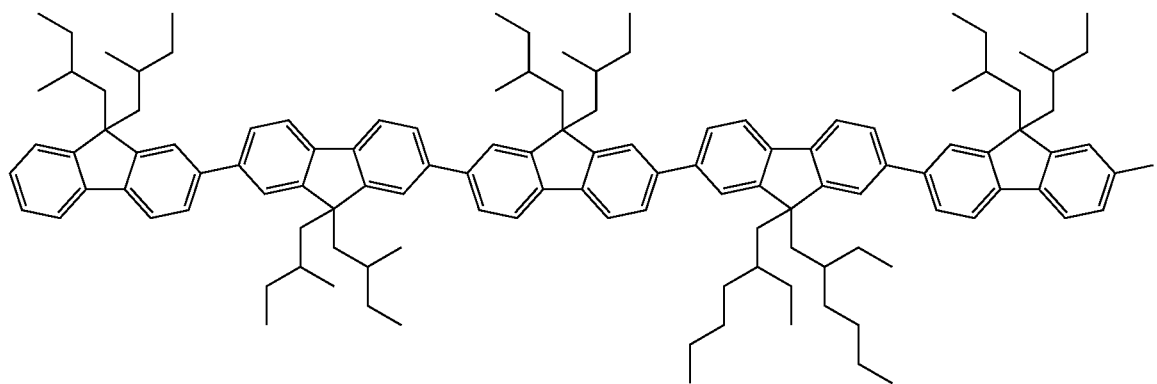
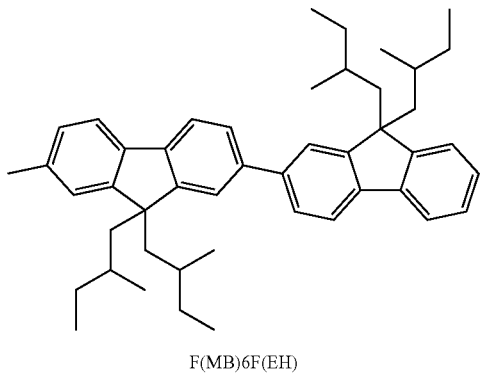
F(MB)6F(EH)
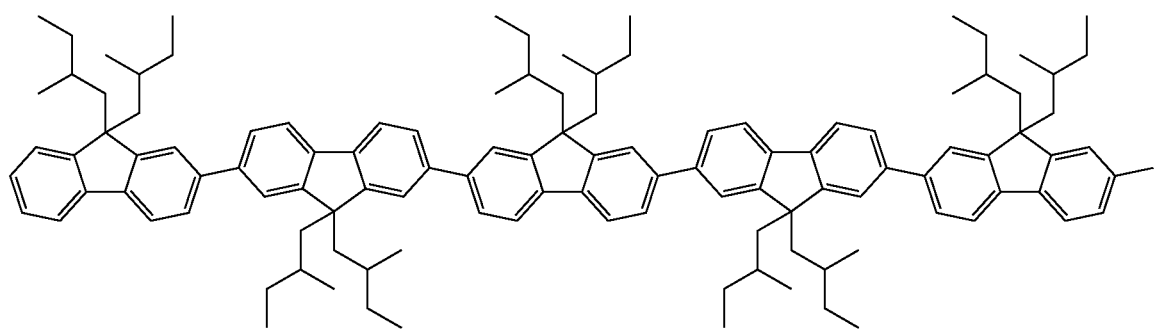

-continued
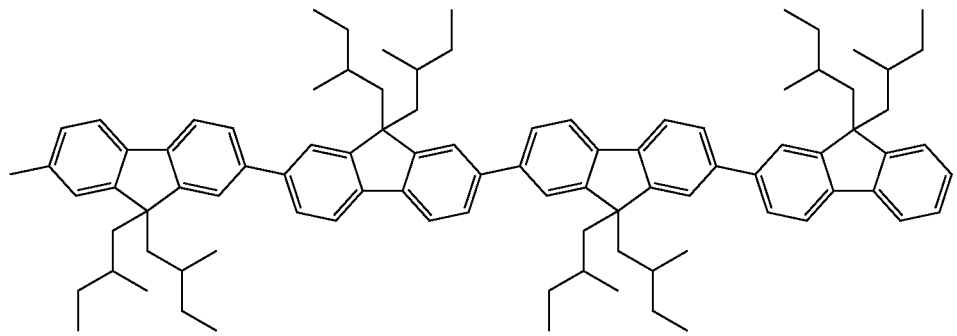
F(MB)9
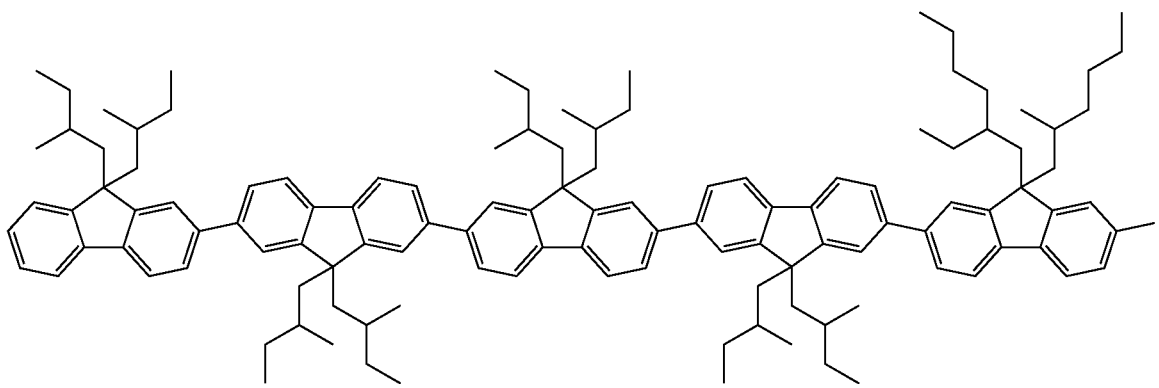
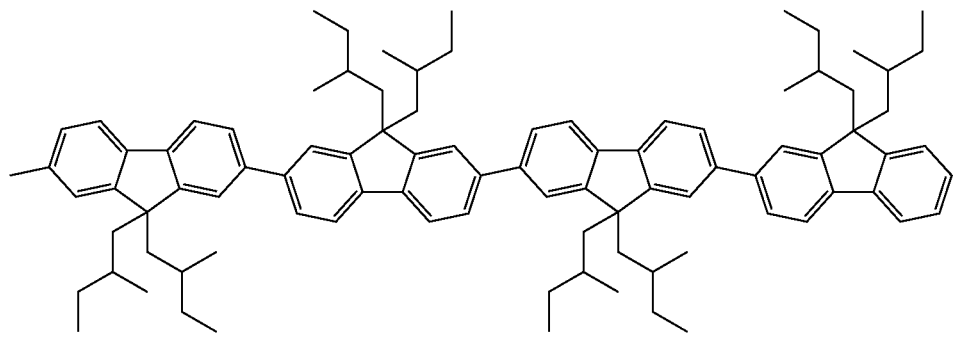
F(MB)8F(EH)
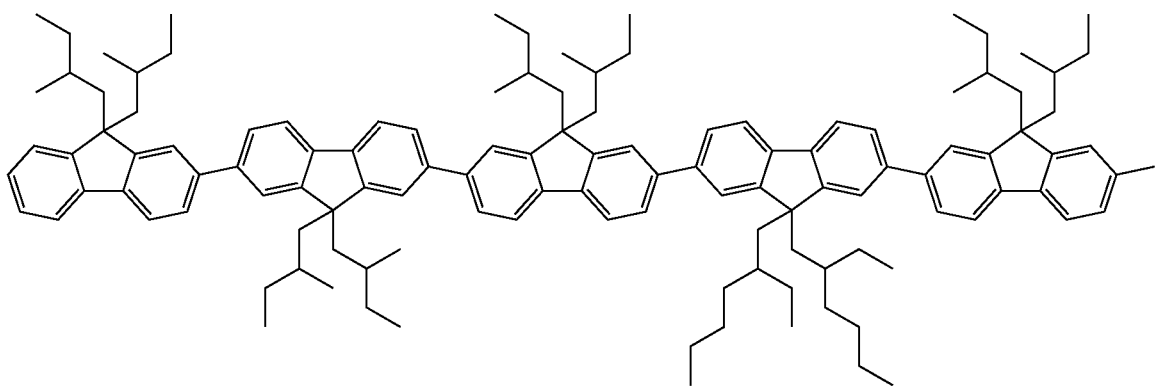

-continued
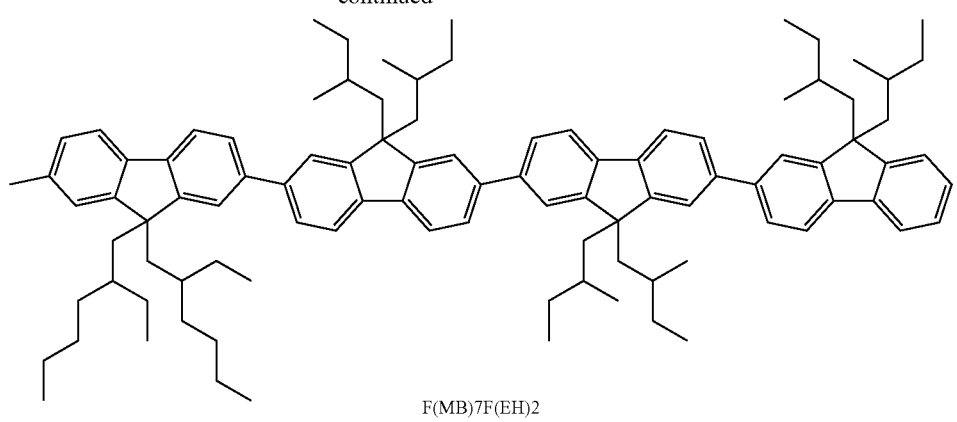
F(MB)7F(EH)2
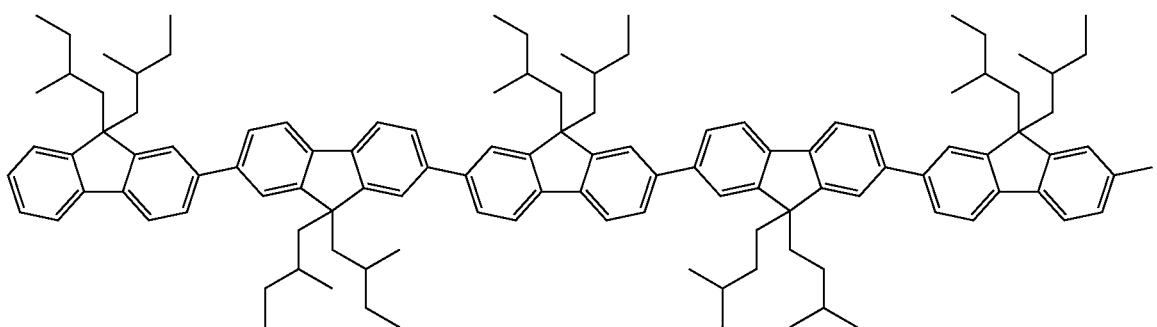
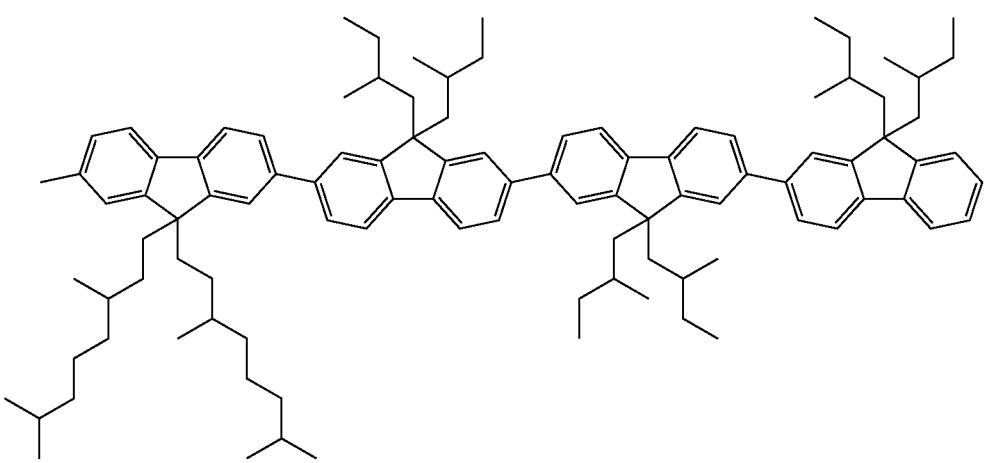
F(MB)7F(DMO)2
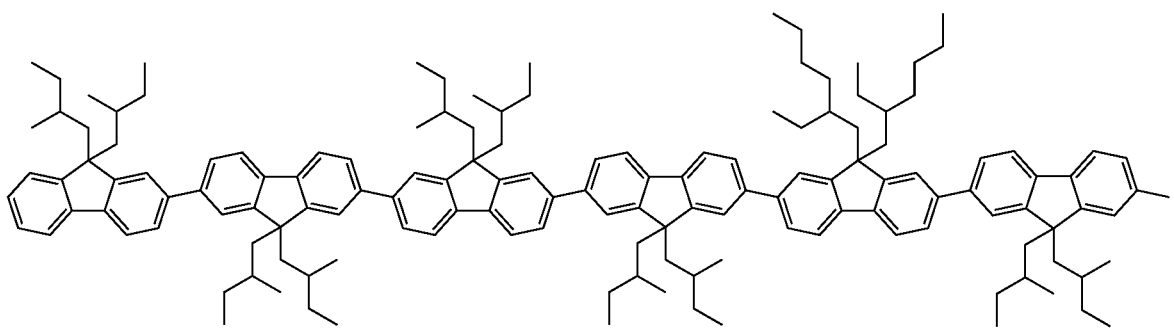

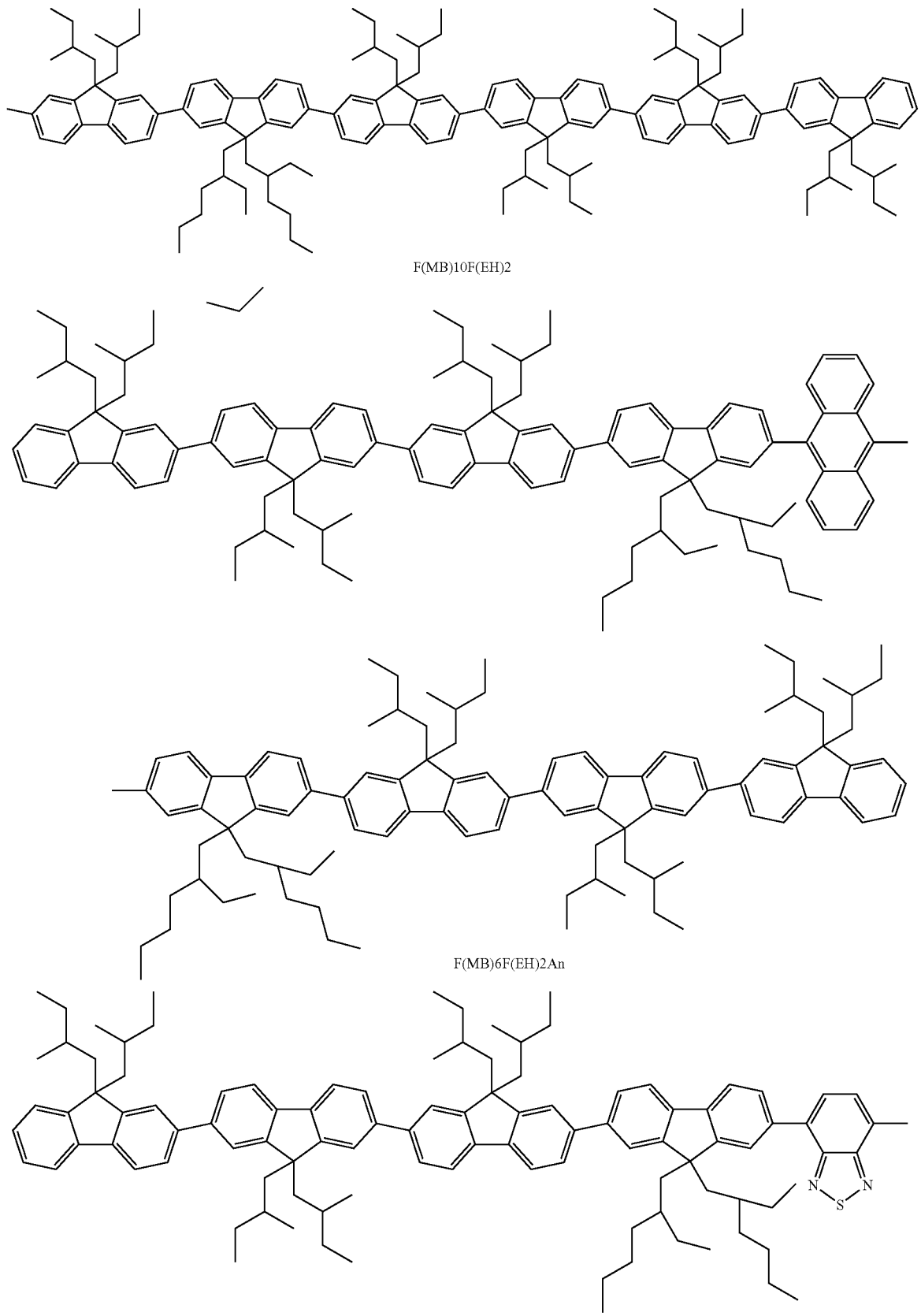
F(MB)10F(EH)2
F(MB)6F(EH)2An

-continued
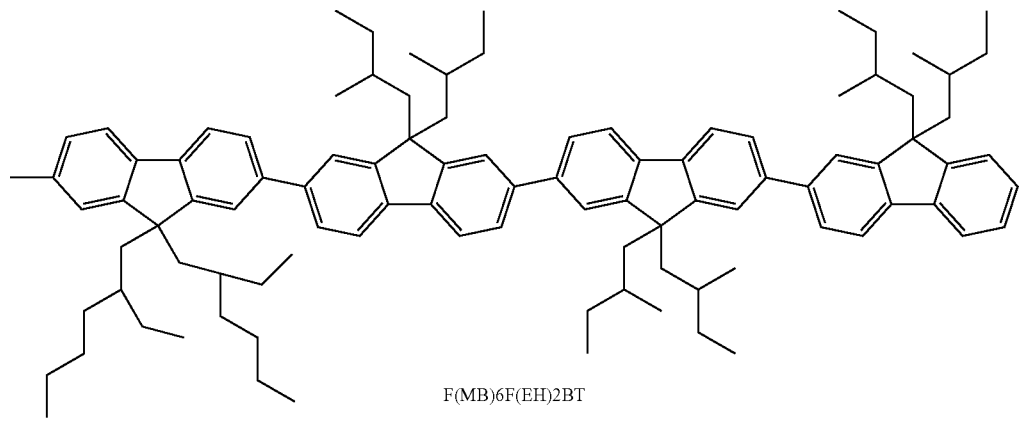
F(MB)6F(EH)2BT
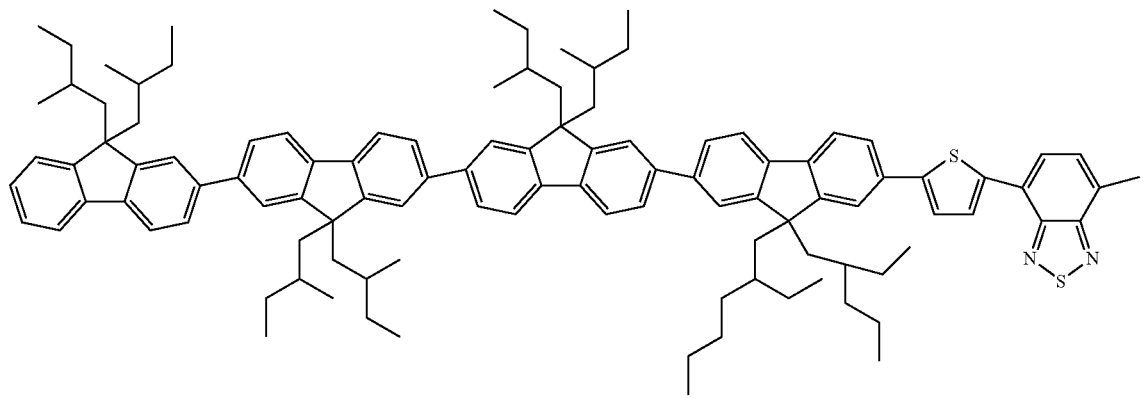
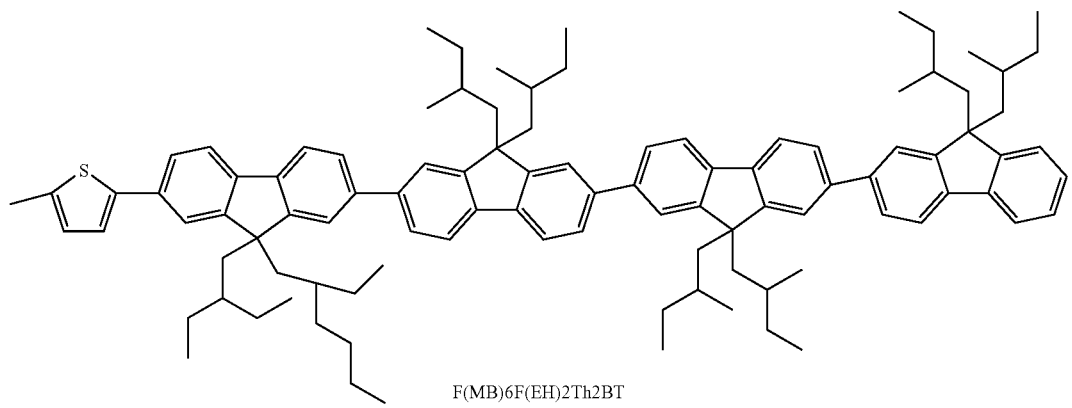
F(MB)6F(EH)2Th2BT

Conjugated chiral oligomers according to this invention include, but are not limited to, the following oligomers:
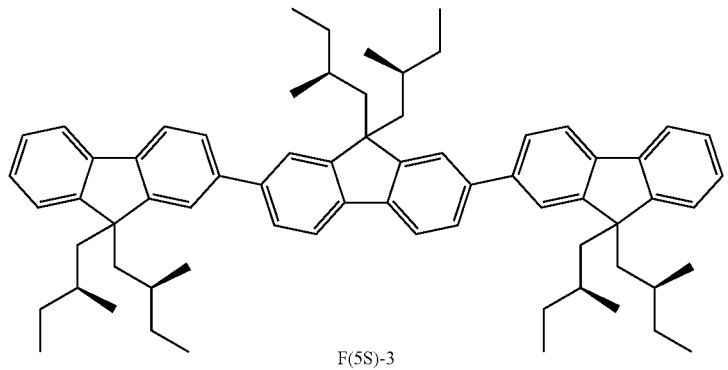
F(5S)-3
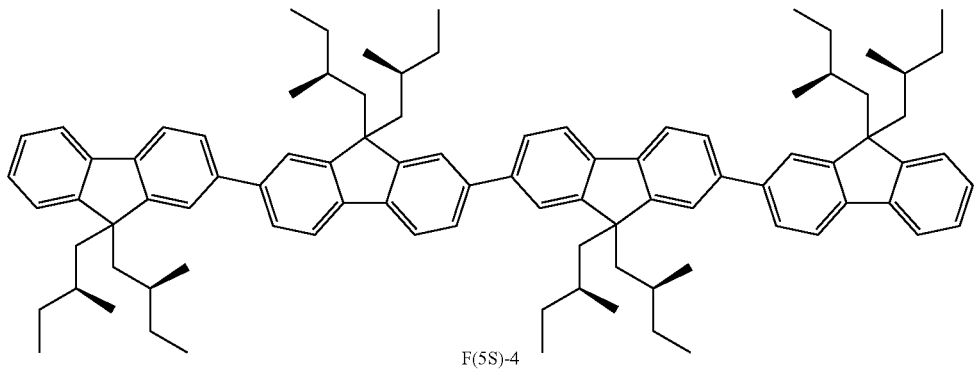
F(5S)-4
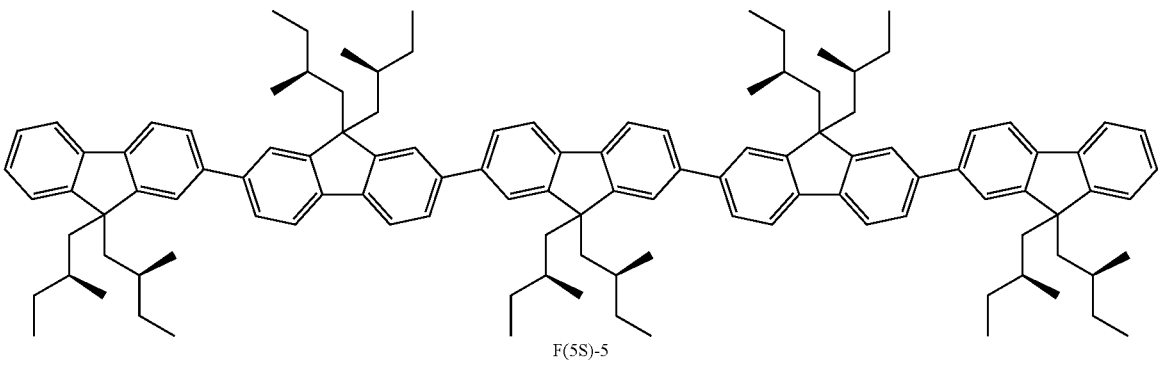
F(5S)-5
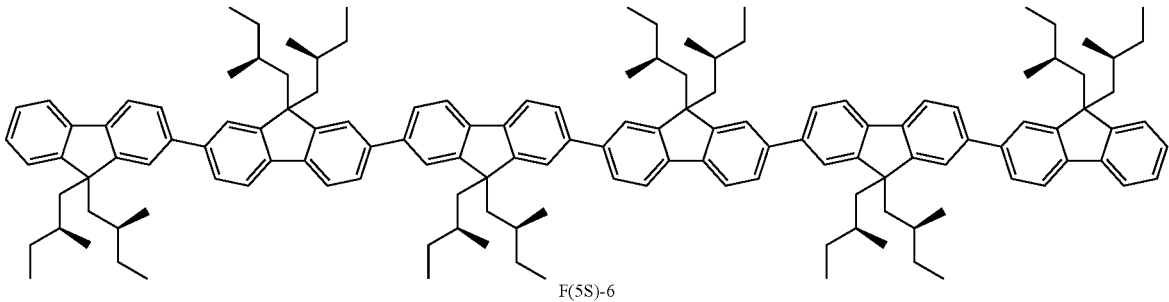
F(5S)-6

-continued
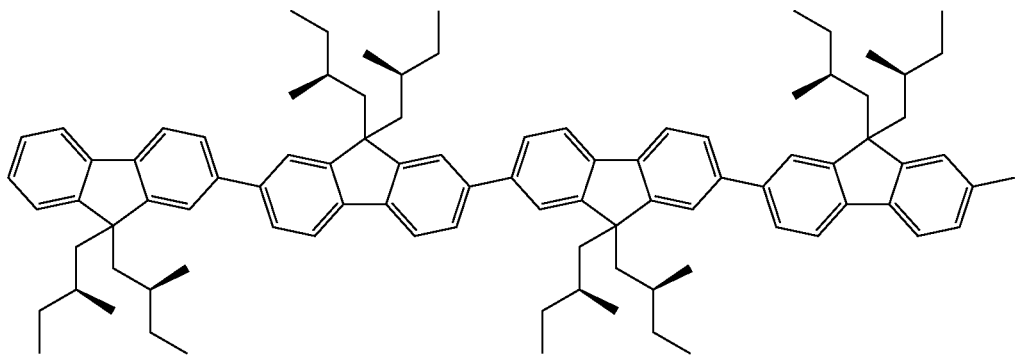
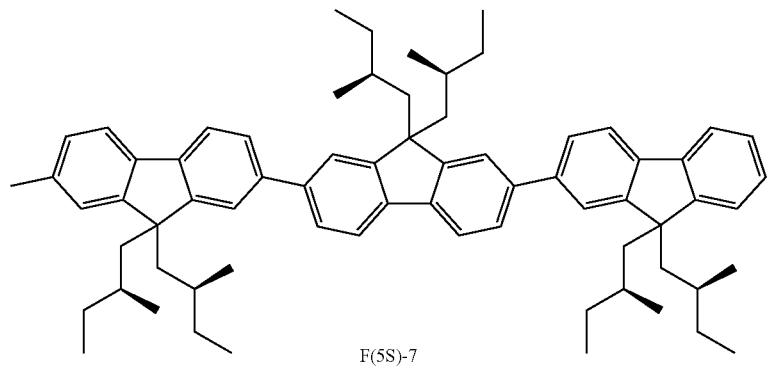
F(5S)-7
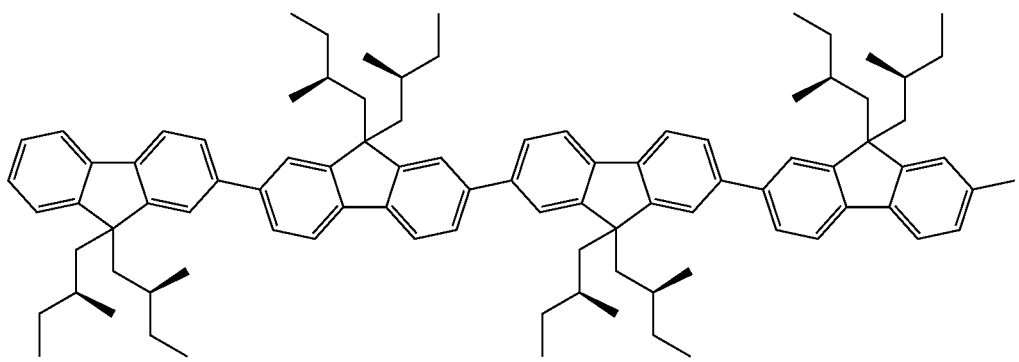
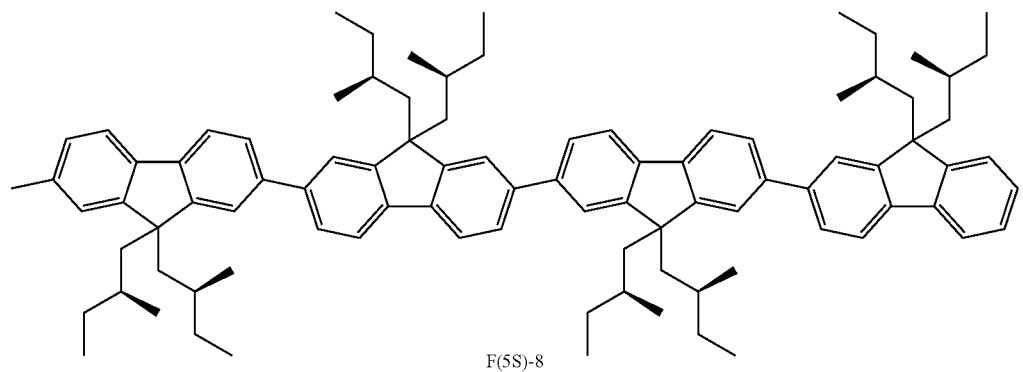
F(5S)-8

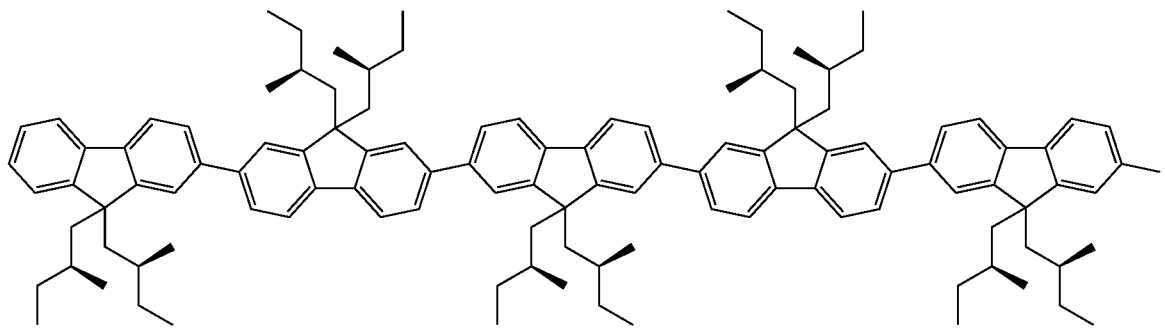
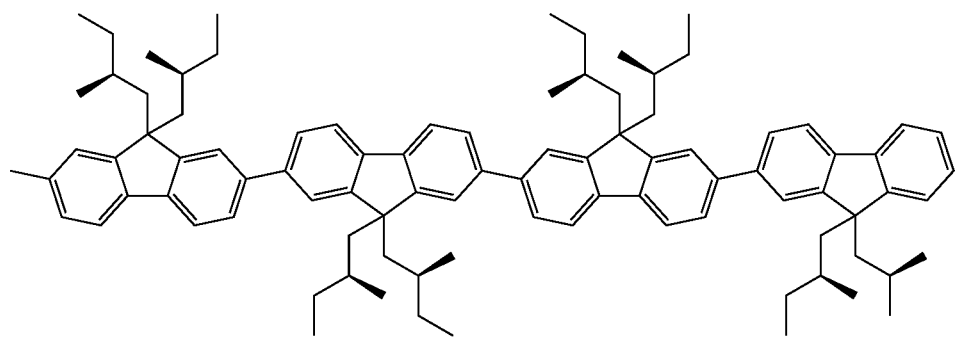
F(5S)-9
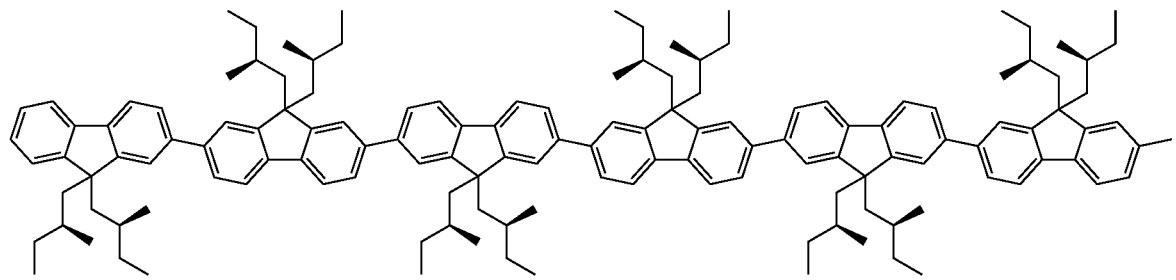
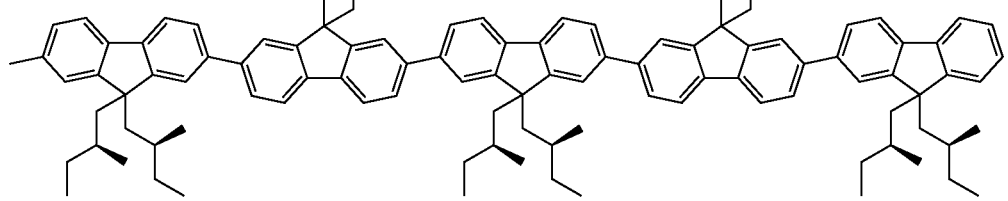
F(5S)-11
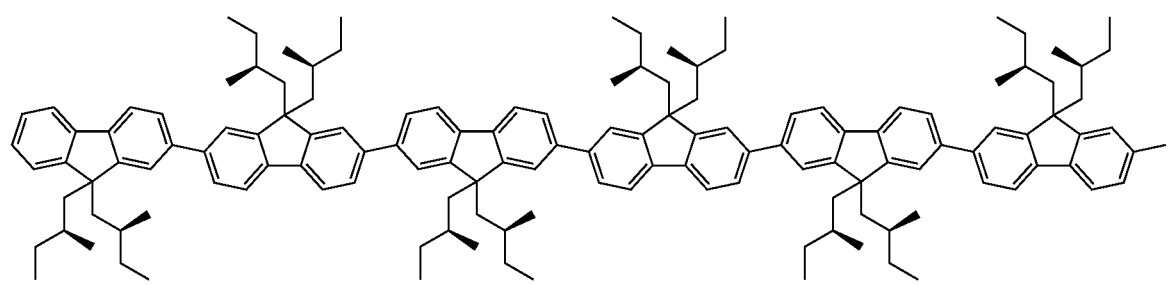

-continued
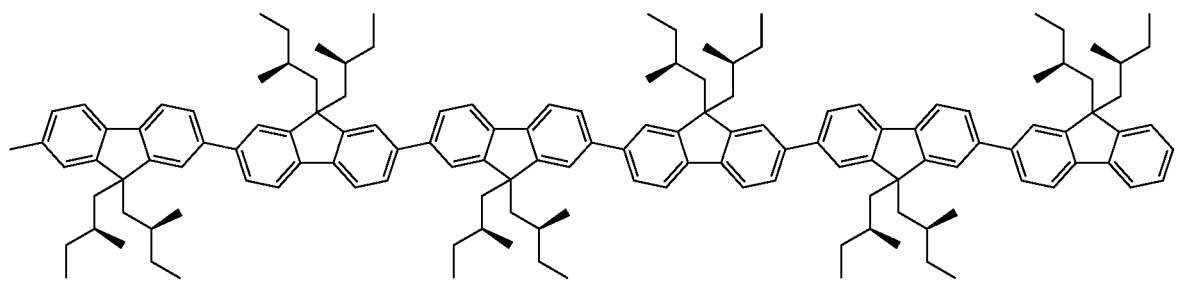
F(5S)-12
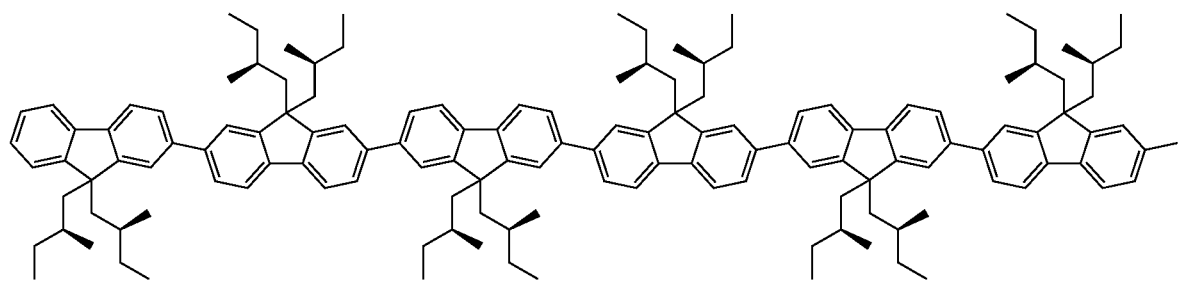
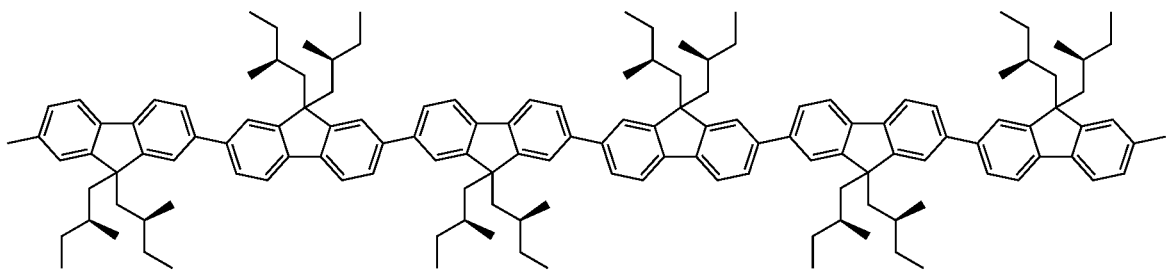
F(5S)-16
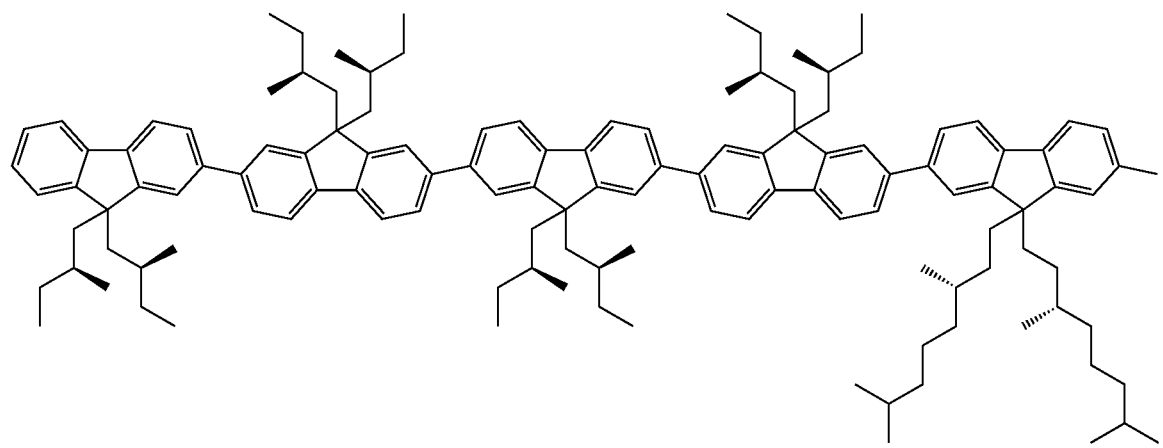

-continued
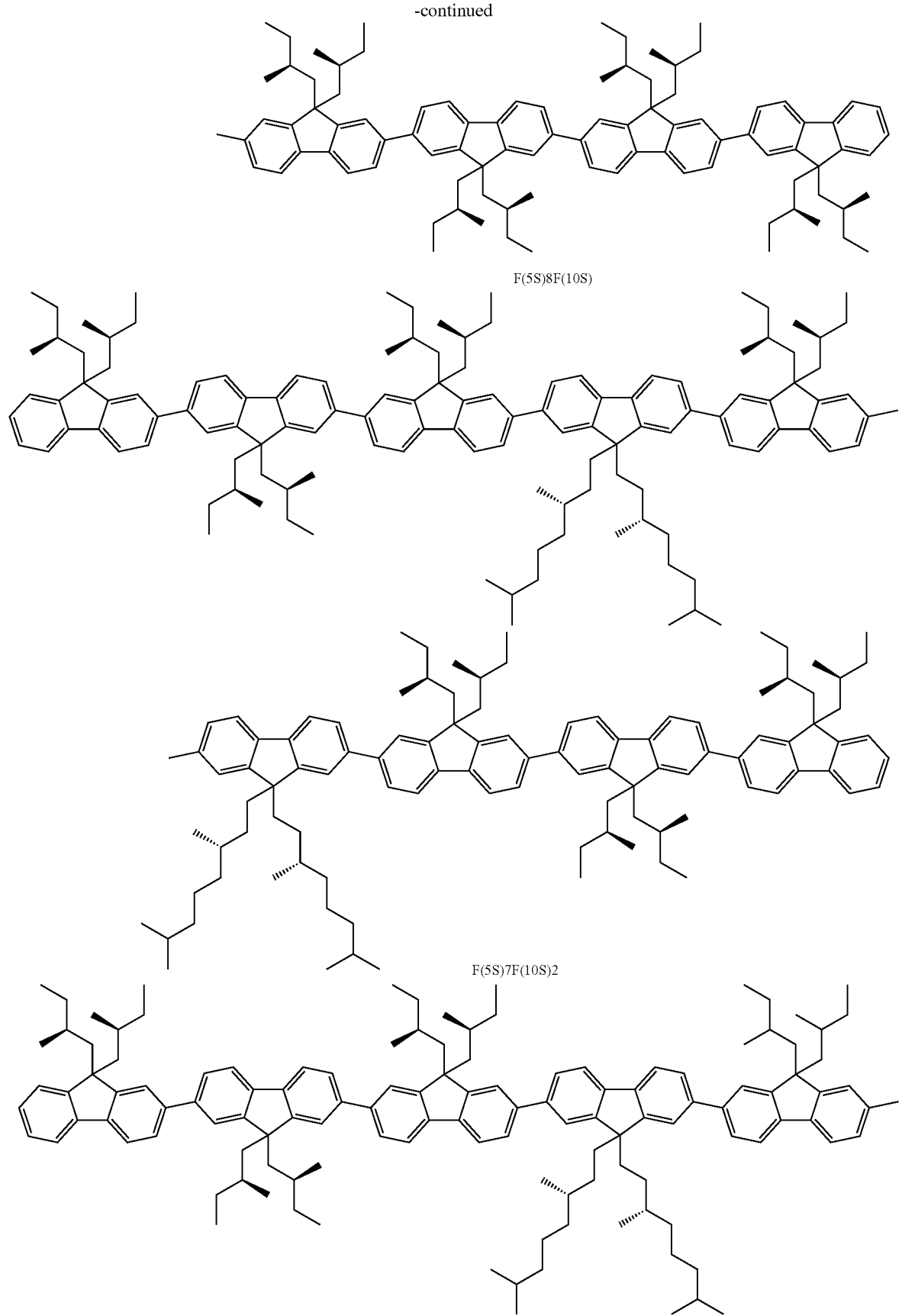

-continued

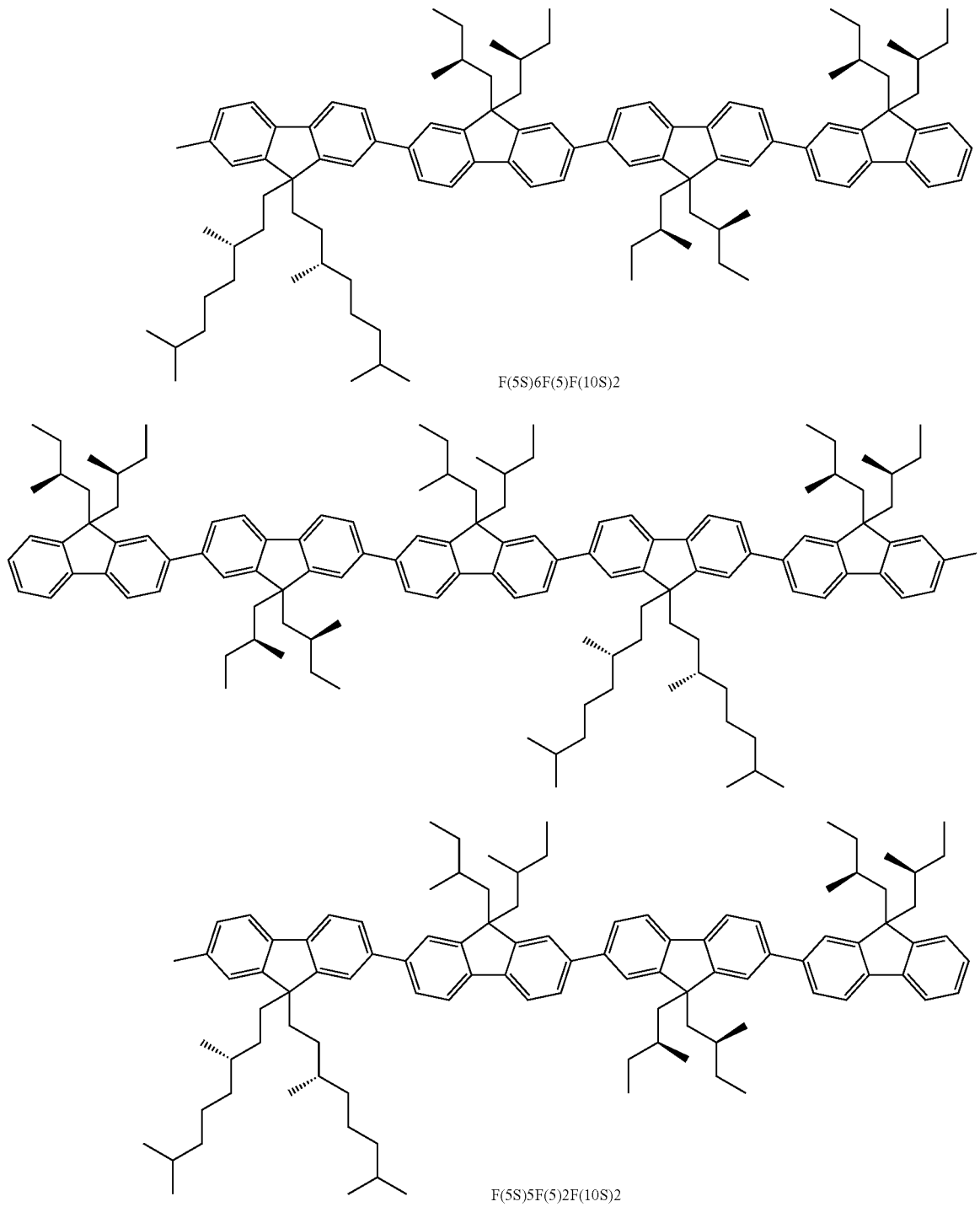

F(5S)6F(5)F(10S)2

F(5S)5F(5)2F(10S)2

As indicated above, $R_1$ and $R_2$ can be substituted or unsubstituted, chiral or achiral, alkyl or alkoxy pendant groups. $R_1$ and $R_2$ can take any form that is appropriate to the particular application of the conjugated oligomers according to this invention. In various exemplary embodiments, $R_1$ and $R_2$ are selected to enhance stability of the resulting compositions. In some such embodiments, pendant groups are selected that have sizes, shapes and/or properties that will deter the resulting oligomer composition from crystallizing. Selecting achiral pendants can result in an oligomer composition that emits and absorbs linearly polarized light. On the other hand, selecting chiral pendants can result in an oligomer composition that emits and absorbs circularly polarized light.

In various embodiments of conjugated oligomers according to this invention, $R_1$ and $R_2$ are represented, independently and separately at each occurrence, by the formula $-C_qH_{2q+1}$ or $-O(CH_2CH_2)_qCH_3$. In various exemplary embodiments, q is from about 2 to about 20. In some such embodiments q is from about 2 to about 12. Though exemplary pendant groups are described by the above formula, the shape of the groups is not particularly limited. In various exemplary embodiments, $R_1$ and $R_2$ are branched alkyl and/or alkoxy groups. In other exemplary embodiments, $R_1$ and $R_2$ are straight-chain alkyl and/or alkoxy groups. In further embodiments of conjugated oligomers according to this invention, $R_1$ and $R_2$ include both branched and straight-chain alkyl and/or alkoxy groups. In still further embodiments, $R_1$ and $R_2$ include cyclic and multi-cyclic substituents.

$EG_1$ and $EG_2$ are endgroups, which may be selected to provide a desired property or properties to the molecule and/or composition. The endgroups in oligomers according to this invention can include any suitable endgroups. For example, the endgroups can be selected to enhance stability of the resulting oligomer compositions. The endgroups can be selected so that individual oligomers in an oligomer composition will not conjugate or crosslink with other oligomers. The endgroups can be selected to improve charge transport properties of the resulting compositions. Endgroups employed according to this invention include, but are not limited to, hydrogen, alkyl or perfluoroalkyl groups, aryl (e.g., phenyl), aralkyl and other moieties, such as moieties that are known to improve charge transport properties. It is preferred that the endgroups not comprise halogen groups.

Ar is a group including one or more aromatic substituents. This group can take any form that is appropriate to the particular application of the conjugated oligomers according to this invention. It can be selected to improve the emissive efficiency of the resulting oligomer composition. It can also be selected to tune the emission color of the resulting oligomers.

While many suitable Ar groups will be apparent to one skilled in the art, examples of groups that can be employed in conjugated oligomers according to this invention include, but are not limited to:

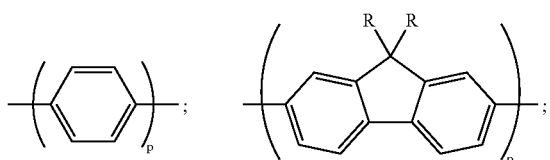

p = 1–10; R = $C_qH_{2q+1}$ or $(CH_2CH_2O)_qCH_3$, chiral or achiral, q = 1–20

-continued

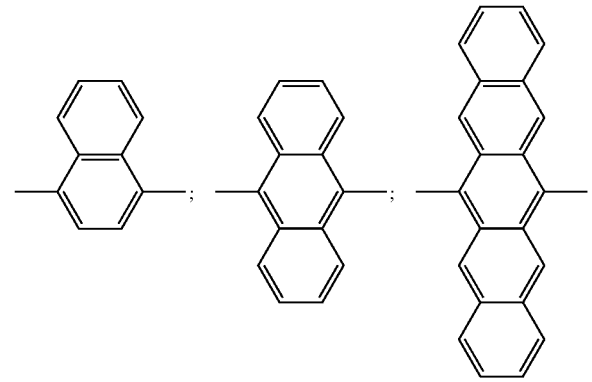

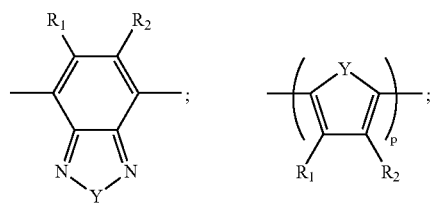

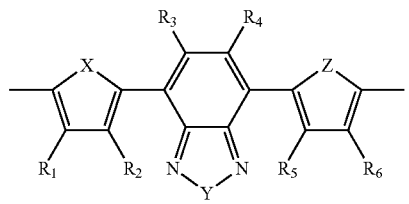

p = 1–10; $R_1$, $R_2$, $R_3$, $R_4$, $R_5$, $R_6$ = H, $C_qH_{2q+1}$ or $OC_qH_{2q+1}$ chiral or achiral, q = 1–20
X, Y, Z = O, S or N

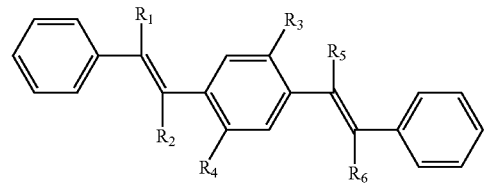

$R_1$, $R_2$, $R_5$, $R_6$ = H or CN
$R_3$, $R_4$ = H, CN, $OC_qH_{2q+1}$ or $C_qH_{2q+1}$, q = 1–20

Embodiments of oligomers according this invention are limited in length. The length of embodiments of conjugated oligomers according to this invention is given by (m+n)(x+y). (m+n)(x+y) can be at least about 2. In embodiments, (m+n)(x+y) is from about 2 to about 20. In some such embodiments, (m+n)(x+y) is from about 2 to about 12. In further embodiments, (m+n)(x+y) is from about 6 to about 12. The conjugated oligomer may or may not be symmetrical about the aromatic group.

Performance characteristics of embodiments of achiral oligomer compositions according to this invention are shown in FIGS. 1–5. FIGS. 1(a)–5(a) are graphs showing endothermy of achiral oligomer compositions according to this invention as a function of temperature. In FIGS. 1(a)–5(a), G is the glassy phase, N is the nematic phase and I is the isotropic phase. $T_g$ is the glass transition temperature 3 and $T_c$ is the clearing temperature. These graphs show that the achiral oligomer compositions resist crystallization on heating and cooling.

Each of FIGS. 1(b)–5(b) shows absorbance and emission intensity as a function of wavelength. In FIGS. 1(b)–5(b), A is absorbance, I is emission intensity, with subscripts indicating parallel and perpendicular to the nematic direction. S is the orientational order parameter and $\Phi_{PL}$ is the photoluminescence quantum yield. Emission intensity is shown in arbitrary units (a.u.). These emission and absorption spectra show that the achiral oligomer compositions emit and absorb strongly, but also that emission and absorption can be adjusted by manipulating structure.

Figure 2A:
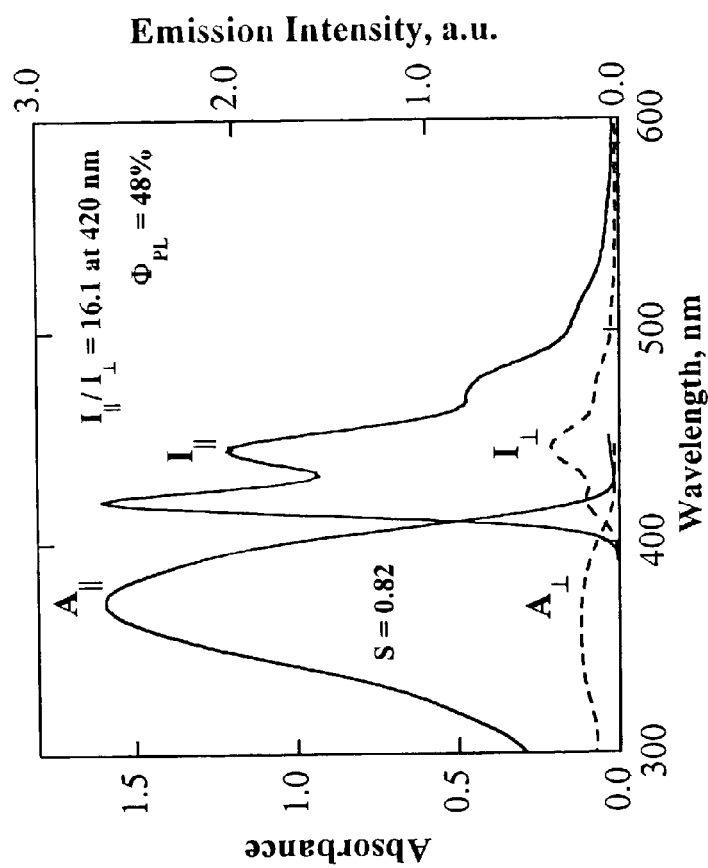
Figure 2B:
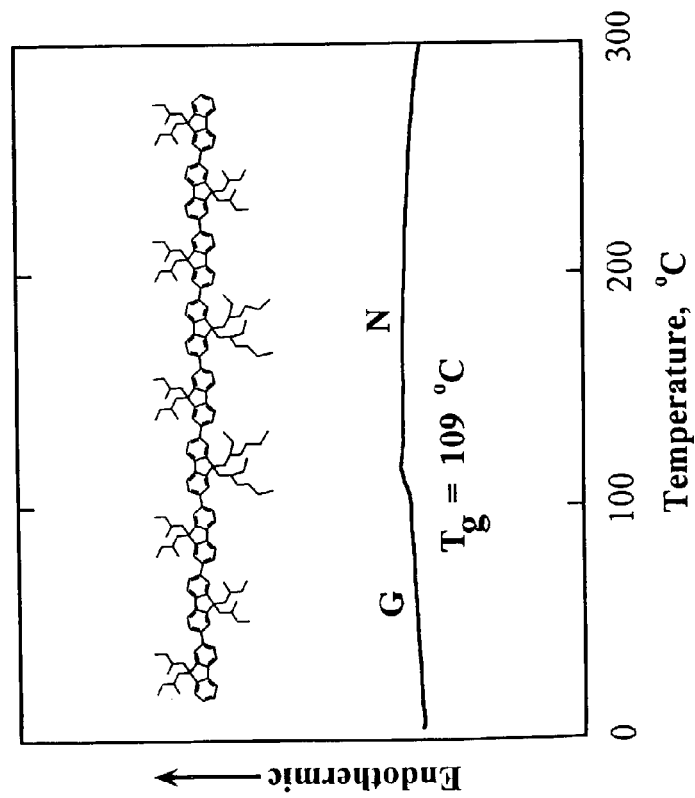
Figure 3A:
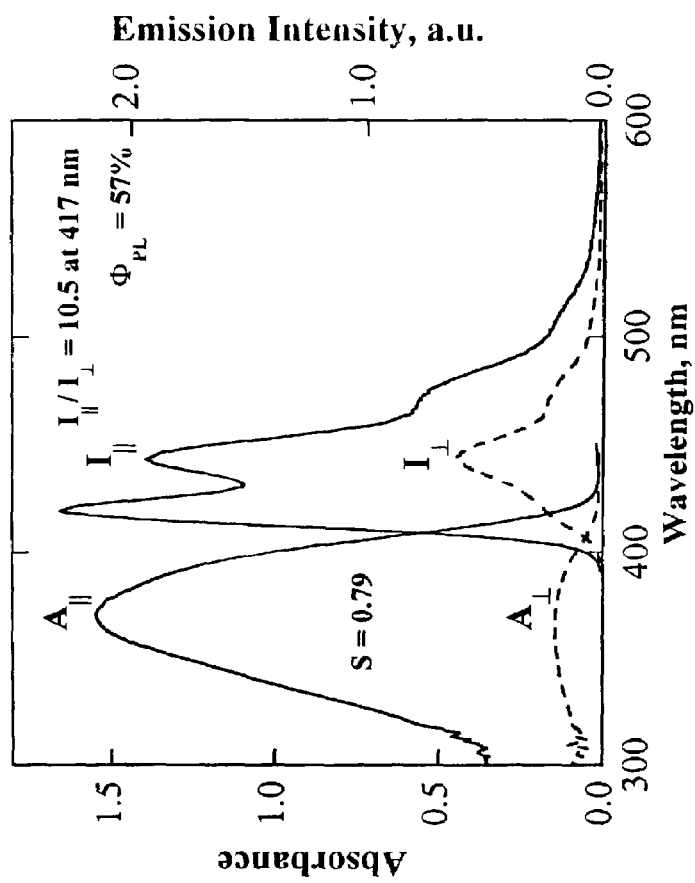
Figure 3B:
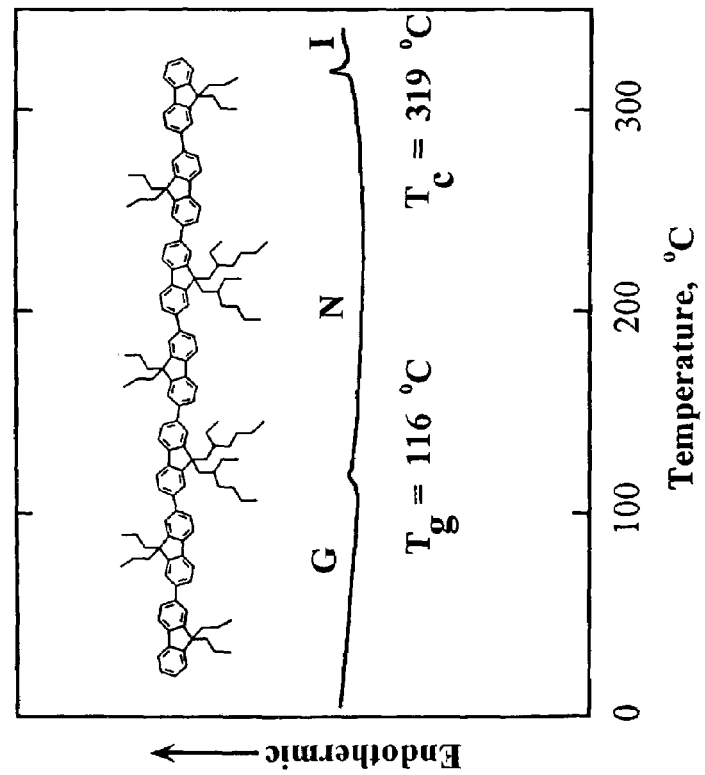
Figure 4A:
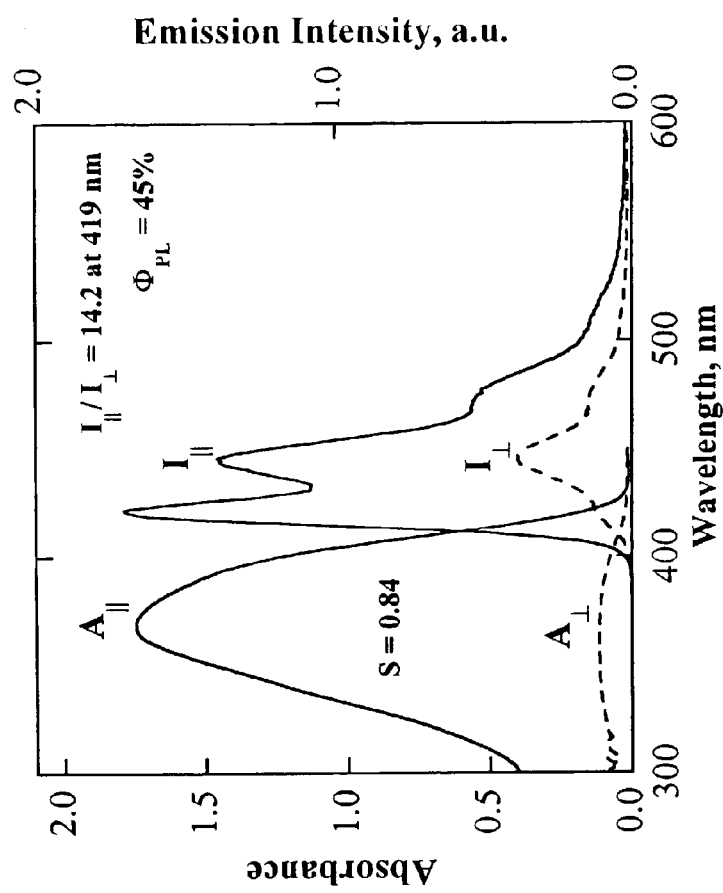
Figure 4B:
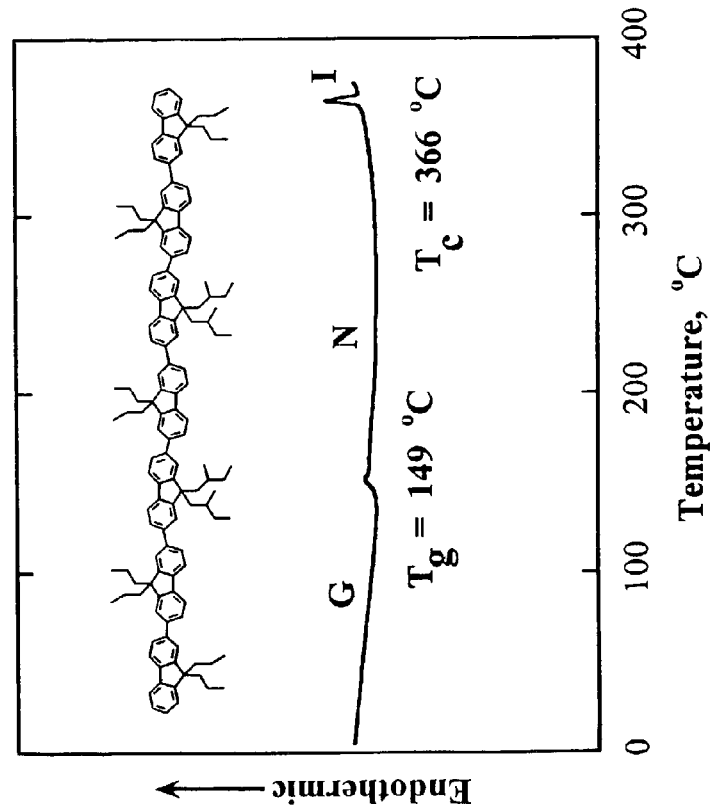
Figure 5A:
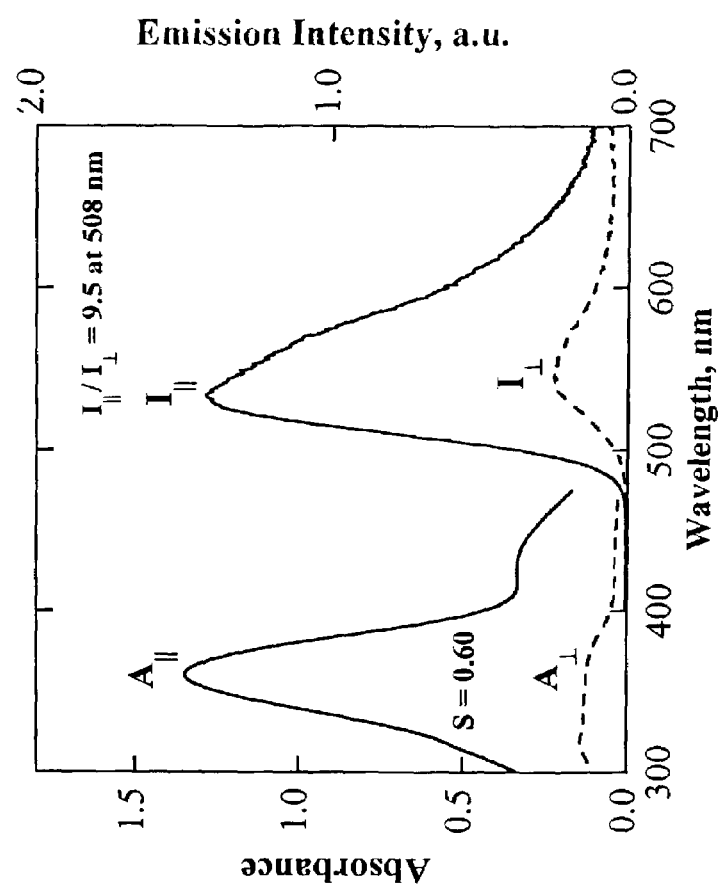
Figure 5B:
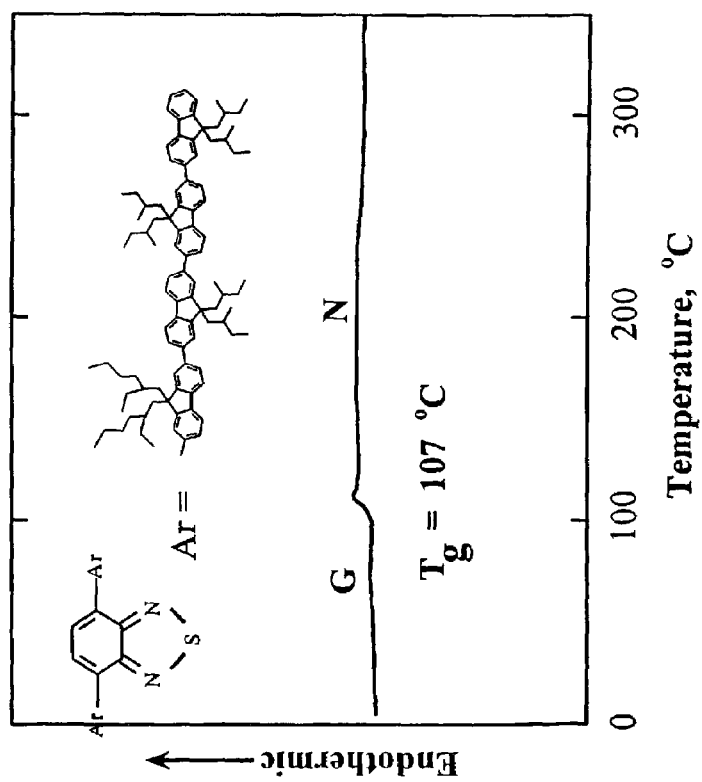
Figure 6A:
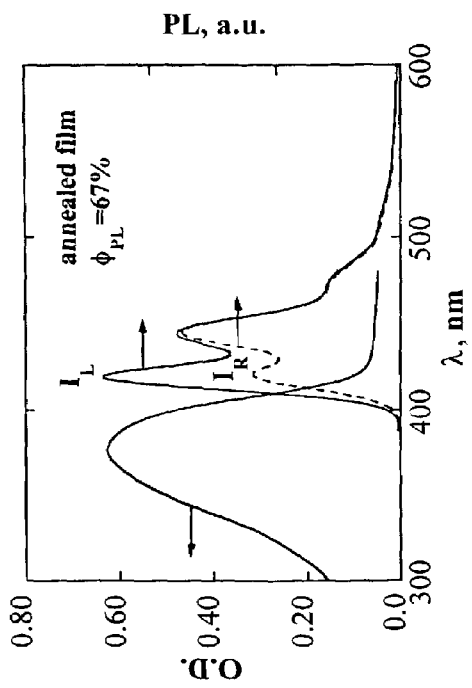
Figure 6B:
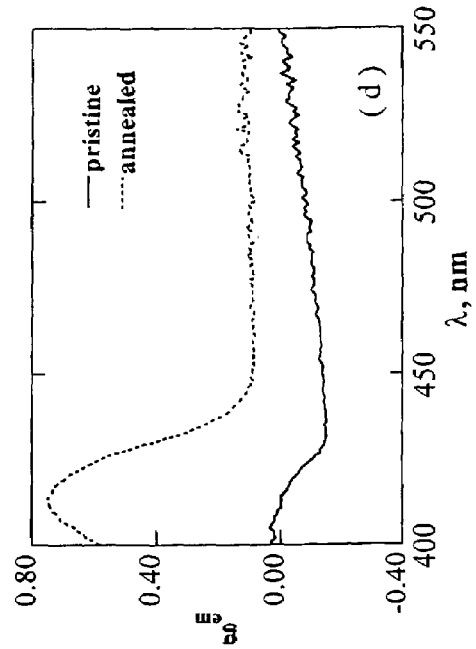
Figure 6C:
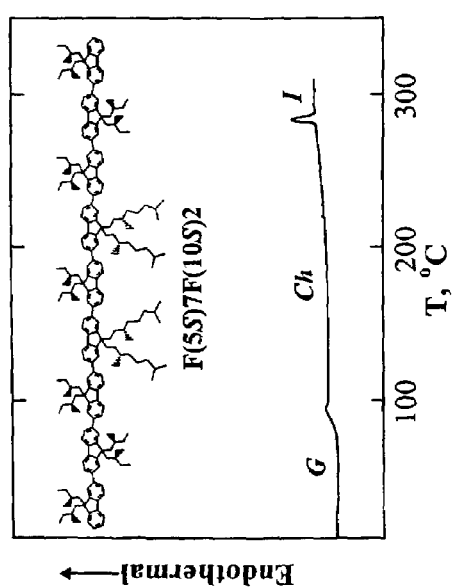
Figure 6D:
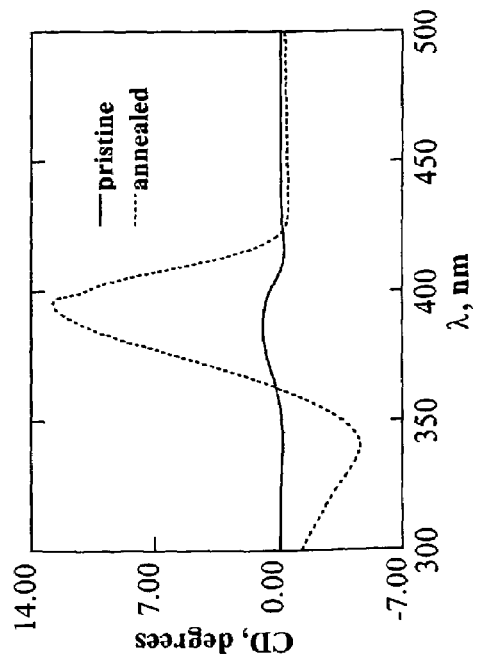
Figure 7B:
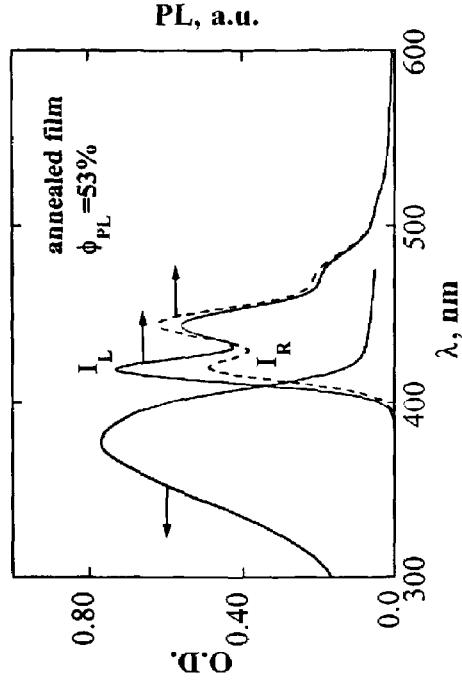
Figure 7D:
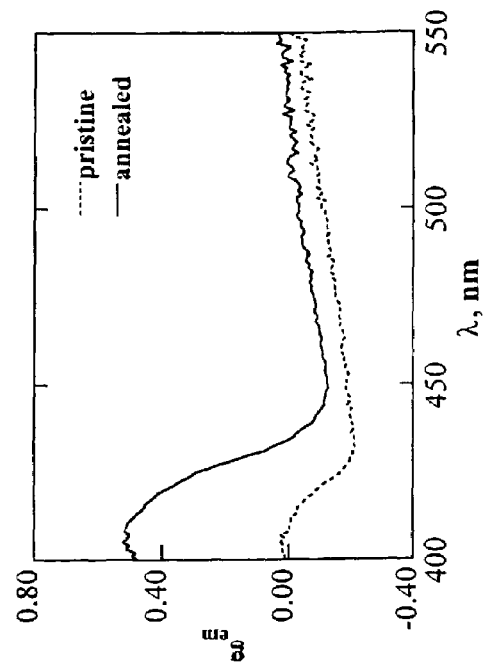
Figure 7A:
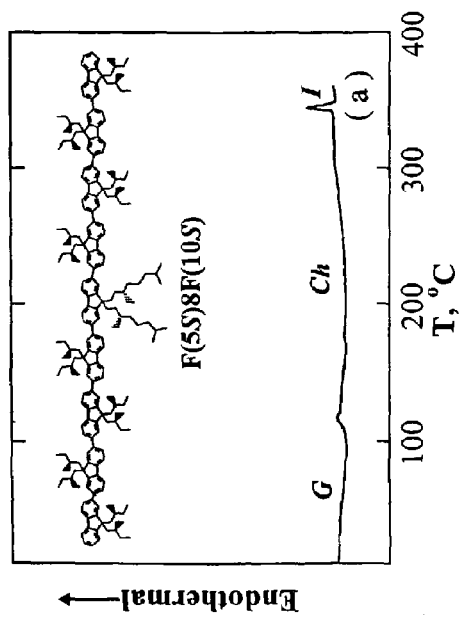
Figure 7C:
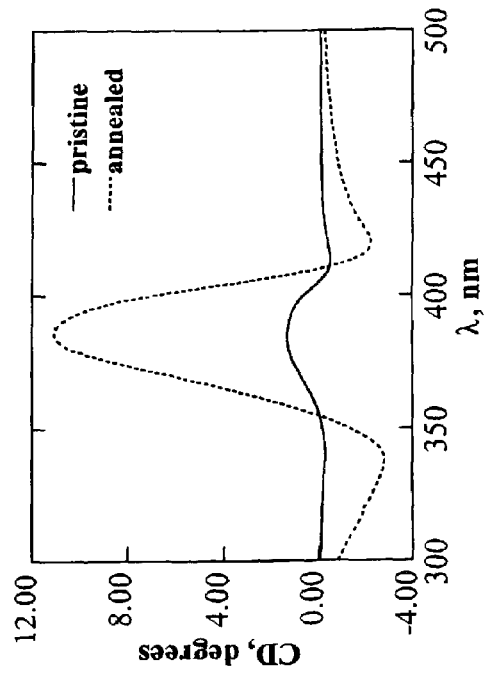
Figure 8B:
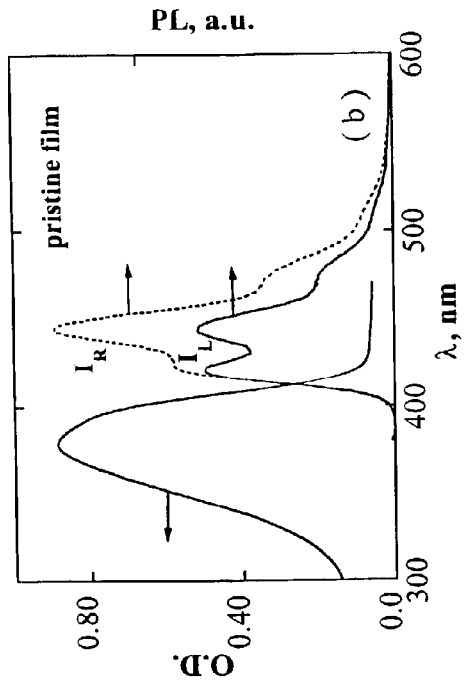
Figure 8D:
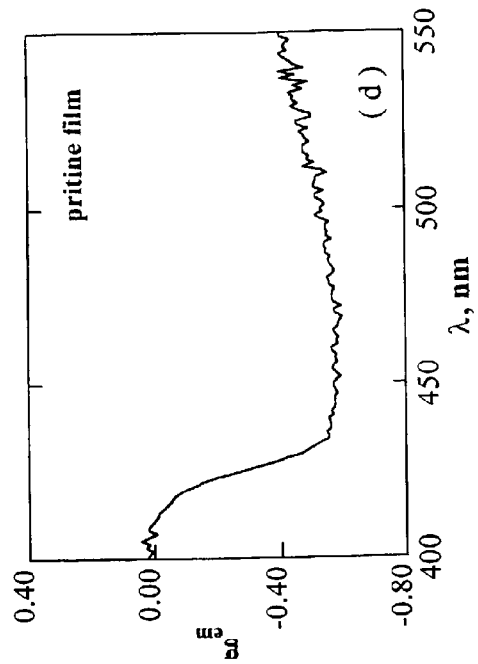
Figure 8A:
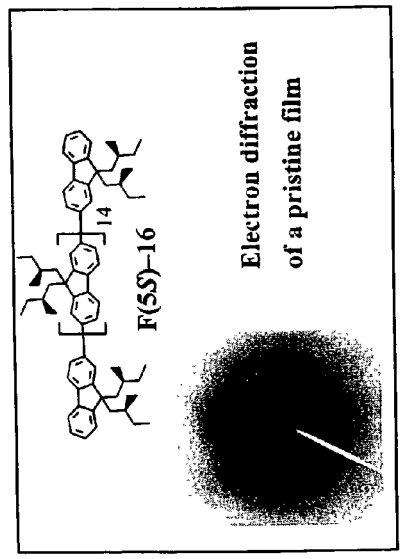
FIG. 8(a) is the electron diffraction pattern of a chiral oligomer.
Figure 8C:
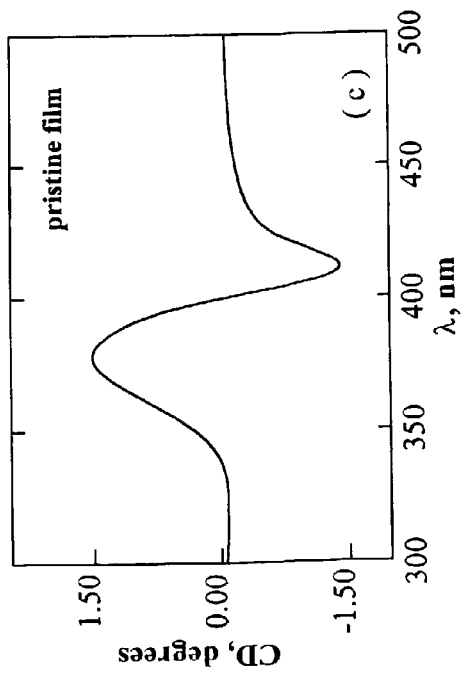

The results in FIG. 1 are for a film having a thickness of 85 nm. The results in FIG. 2 are for a film having a thickness of 92 nm. The results in FIG. 3 are for a film having a thickness of 78 nm. The results in FIG. 4 are for a film having a thickness of 81 nm. The results in FIG. 5 are for a film having a thickness of 80 nm.

Embodiments of chiral oligofluorene compositions according to this invention display cholesteric mesomorphism with morphological stability against crystallization. The phase transition temperatures of such chiral oligofluorene compositions increase with increases in the chain length of the constituent oligofluorenes. Accordingly, chiral oligomer compositions according to this invention provide stable emission and absorption of polarized light while being particularly useful in optoelectronic applications.

In contrast with the above-described achiral oligomer compositions, which emit and absorb linearly polarized light, embodiments of chiral oligomer compositions according to this invention display significant degrees of circular dichroism and circularly polarized fluorescence. Some chiral oligomer compositions according to this invention display a one-handed helical and/or braided cholesteric structure, which greatly increases such circular dichroism and circularly polarized fluorescence of the compositions. The braided and/or helical structure of such chiral compositions allows constituent molecules to organize into a cholesteric stack upon thermal annealing without encountering crystallization.

Performance characteristics of embodiments of chiral oligomer compositions according to this invention are shown in FIGS. 6–8. FIGS. 6(a)–7(a) are graphs showing endothermy of chiral oligomer compositions according to this invention as a function of temperature. In FIGS. 6(a)–7(a), G is the glassy phase, Ch is the cholesteric phase and I is the isotropic phase. FIG. 8(a) shows the electron diffraction pattern of an chiral oligomer. These graphs show that chiral oligomer compositions according to this invention resist crystallization on heating and cooling.

FIGS. 6(b)–8(b) are graphs showing absorbance (O.D.) and emission intensity (PL) as a function of wavelength. Emission intensity is given in arbitrary units (a.u.). In FIGS. 6(b)–8(b), $\Phi_{PL}$ is the photoluminescence quantum yield. These emission and absorption spectra show that chiral oligomer compositions according to this invention emit and absorb strongly, but also that emission and absorption can be adjusted by manipulating structure.

FIGS. 6(c)–8(c) are circular dichroism (CD) spectra and FIGS. 6(d)–8(d) are dissymmetry of circularly polarized emission ($g_{em}$) spectra for various chiral oligomer compositions according to this invention. In FIGS. 6(d)–8(d), $I_R$ and $I_L$, are right- and left-handed circularly polarized intensity, respectively, and the dissymmetry factor ($g_e$) is given by $2(I_L-I_R)/(I_L+I_R)$. The peaks in the dichroism spectra demonstrate the one-handed cholesteric structure of such chiral oligomer compositions according to this invention. The dissymmetry of circularyly polarized emission illustrate the extent of circular polarization in emitted light in embodiments of chiral oligomer compositions according to this invention.

The results in FIG. 6 are for a film having a thickness of 87 nm. The results in FIG. 7 are for a film having a thickness of 98 nm. The results in FIG. 8 are for a film having a thickness of 91 nm.

This invention is further directed to methods for synthesizing achiral and chiral oligomer compositions. In various embodiments of methods according to this invention, substitutions are made to monomers to prepare portions of the oligomer. Separately, substitutions are carried out to prepare linking portions suitable for reacting with the oligomer portions. After these elements are prepared, oligomer compositions are synthesized by carrying out further substitutions to combine the oligomer portions with the linking portions. By using methods according to this invention, monodisperse compositions can be prepared.

In various embodiments, methods for synthesizing oligomer compositions according to this invention include making substitutions to fluorene monomers to prepare portions of a fluorene oligomer. Embodiments of methods according to this invention can also include carrying out substitutions to prepare aromatic linking units suitable for reacting with the fluorene oligomer portions. In embodiments, after such elements are prepared, oligomer compositions according to this invention are synthesized by carrying out further substitutions to combine, simultaneously or sequentially, the fluorene oligomer portions with the aromatic linking portions.

In embodiments, the fluorene portion is formed by making a series of substitutions to a halofluorene. First, for example, the halofluorene can be converted to a fluorene boronic acid. In embodiments, the reaction is conducted by reacting the halofluorene with a butyllithium, such as n-butyllithium. After reacting the halofluorene and the butyllithium, the resultant composition can be reacted with a trialkylborate. In embodiments, the trialkylborate is tri-isopropyl borate. Hydrolysis of the resulting compound yields a fluorene boronic acid.

The resulting fluorene boronic acid can then be reacted with a dihalofluorene to obtain a fluorene dimer bearing a halogen. In embodiments, the dihalofluorene is an iodobromofluorene. To obtain the fluorene dimer, the fluorene boronic acid can be reacted with the dihalofluorene in the presence of a catalyst, such as palladium. In embodiments, the catalyst is present in the form of tetrakis(triphenylphosphine) palladium ($Pd(PPh_3)_4$). In embodiments, the resulting fluorene dimer is functionalized with a bromine.

The process by which a fluorene dimer functionalized with a halogen is obtained can be repeated as necessary to obtain fluorene portions having a requisite number of fluorene residues for a particular application. In embodiments, this portion of the method according to this invention is conducted once. In embodiments, this portion of the method is repeated as many as about 16 or more times. In various other embodiments, this portion of the method is repeated as many as about 12 times. In embodiments, this portion of the method is repeated as many as about 6 times. In embodiments, this portion of the method is repeated as many as about 3 times.

After obtaining the halogen-bearing fluorene oligomer having the desired number of fluorene residues, the halogenated fluorene oligomer is converted to a fluorene oligomer bearing an endgroup such as a dioxaborolane on one of the terminal fluorene residues. In embodiments, this reaction is conducted by reacting the halogen-bearing fluorene oligomer with a dioxaborolane. In embodiments, the dioxaborolane is 2-isopropoxy-4,4,5,5-tetramethyl-[1,3,2]dioxaborolane. The fluorene oligomer bearing a dioxaborolane, thus prepared, can then be reacted with an aromatic group to obtain the oligomer composition.

The aromatic portion can be integrated into the fluorene oligomer by any known or later-developed method. In embodiments, the aromatic group is prepared for reacting with the fluorene oligomer bearing a dioxaborolane, by functionalizing with halogen groups on each reactive terminus of the aromatic group. In embodiments, the aromatic group is functionalized with terminal iodines.

For example, an aromatic group including multiple fluorenes may be prepared for reaction with the fluorene portion bearing an oxaborolane group by reacting a fluorene bearing a halogen group and a trimethylsilyl with a fluorene bearing a terminal dioxaborolane. The fluorene bearing a halogen group and a trimethylsilyl can be prepared by reacting a dihalofluorene with trimethylsilyl chloride. The fluorene bearing a dioxaborolane can be prepared by reacting a dihalofluorene with a dioxaborolane, such as 2-isopropoxy-4,4,5,5-tetramethyl-[1,3,2]dioxaborolane. The resulting compounds are combined to obtain a fluorene trimer with terminal trimethylsilyls. The terminal trimethylsilyls on the fluorene trimer are then replaced with halogens. In various exemplary embodiments, the halogens are iodines.

Having obtained an aromatic group, by the above method or by any known or later developed method, the fluorene oligomer according to this invention is prepared by combining the fluorene portion, for example bearing a dioxaborolane, with the aromatic group prepared for reaction. In various exemplary embodiments, the fluorene oligomer bearing a dioxaborolane and the aromatic group are reacted in the presence of a catalyst such as palladium. In various exemplary embodiments, the palladium is present in the form of tetrakis(triphenylphosphine) palladium (Pd(PPh$_3$)$_4$). In various exemplary embodiments, the desired oligofluorene is finally obtained using Suzuki or Yamamoto coupling reactions. Upon completion of this reaction, a monodisperse oligomer composition in accordance with this invention is obtained.

Embodiments of the oligomer compositions according to this invention can include spiro-linked oligofluorene compositions.

Embodiments of this invention include spiro-linked oligofluorene compositions given by the following formula:

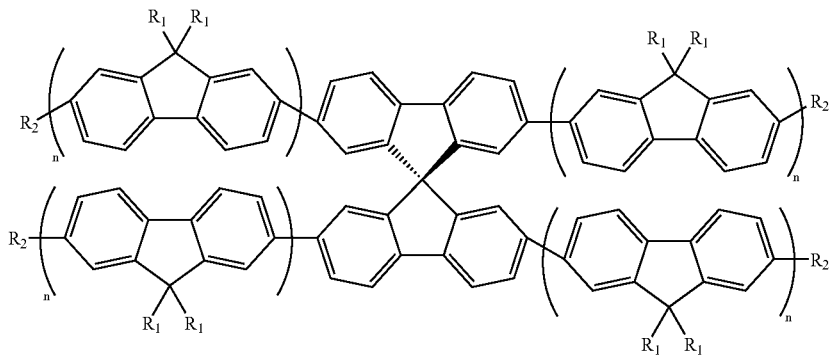

where:

n is an integer from 1 to 5; and

R$_1$ is H, C$_n$H$_{2n+1}$, C$_n$F$_{2n+1}$ or C$_n$H$_4$F$_{2n-3}$; and

R$_2$ is H, C$_n$H$_{2n+1}$, C$_n$F$_{2n+1}$, C$_n$H$_4$F$_{2n-3}$, p-(N,N-diarylamino)phenyl, or Ph-R$_2$', where r$_2$' is H, C$_n$H$_{2n+1}$, C$_n$F$_{2n+1}$ or C$_n$H$_4$F$_{2n-3}$.

As shown above, spiro-linked oligofluorenes according to preferred embodiments of this invention include at least two spiro-linked fluorene residues, and pendant fluorene segments. The pendant fluorene segments may be linked at the 2- and 7-carbons of the spiro-linked fluorene residues. The pendant fluorene segments may include one or more fluorene residues, which preferably include two functional groups at the 9-carbon of each fluorene residue. The terminal fluorene residues each preferably possess an endgroup at the one of the 2- and 7-carbons that is not bonded to an adjacent fluorene residue. The end groups can optionally be linked to the terminal fluorenes via a phenyl group. As with the oligomers described above, the spiro-linked oligofluorenes according to this invention possess uniform chain lengths.

Spiro-linked oligofluorenes according to this invention include, but are not limited to, the following oligomers:

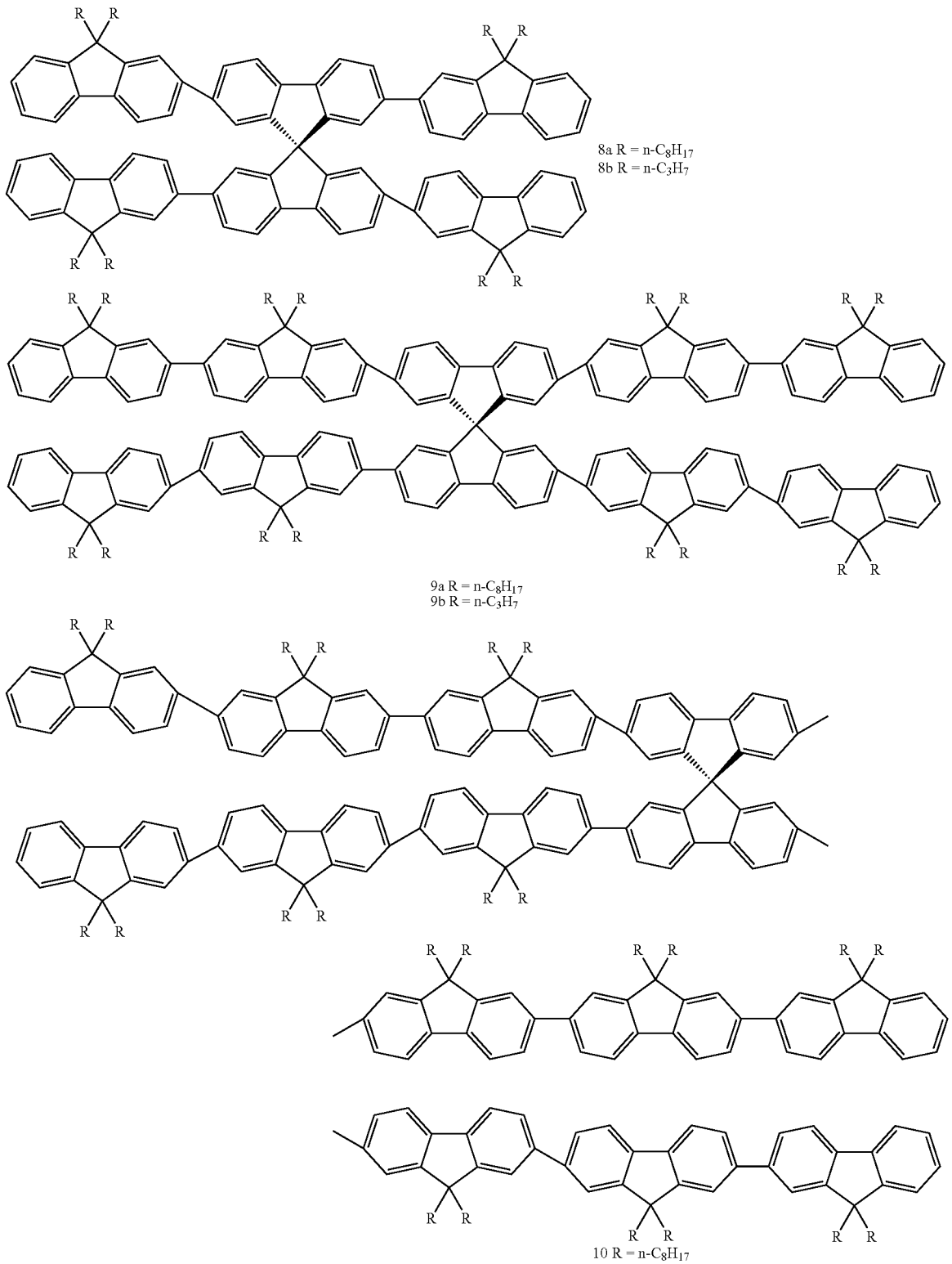

As indicated above, $R_1$ and $R_2$ can include H, $C_nH_{2n+1}$, $C_nF_{2n+1}$ or $C_nH_4F_{2n-3}$. $R_1$ and $R_2$ can take any form that is appropriate to the particular application of the spiro-linked oligofluorene compositions according to this invention. In various embodiments, $R_1$ and $R_2$ are selected to manipulate the characteristics of one or more resulting compositions. In some such embodiments, pendant groups are selected that have sizes, shapes and/or properties that will prevent the resulting oligomer composition from crystallizing. In embodiments, the pendant groups can be chiral.

As with the oligofluorenes described above, embodiments of the spiro-linked oligofluorenes are limited in length. The length of embodiments of spiro-linked oligofluorenes according to this invention is controlled by the selection of n. In various embodiments, n is from about 1 to about 5. In some such embodiments, n is any one or more of 1,2, 3, 4 or 5.

As with the oligofluorenes described above, spiro-linked oligofluorene compositions according to this invention are preferably monodisperse. Accordingly, the shape and size of the spiro-linked oligofluorene can result in improved chemical purity over known compositions. Further, embodiments of the spiro-linked oligofluorene compositions according to this invention can be easily processed into uniform thin films.

Various embodiments of spiro-linked oligofluorene compositions according to this invention are readily soluble and processable into thin films. Spiro-linked oligofluorenes according to this invention can be stable and efficient blue light emitters. In embodiments, spiro-linked oligofluorenes according to this invention resist thermally activated crystallization.

Figure 9:
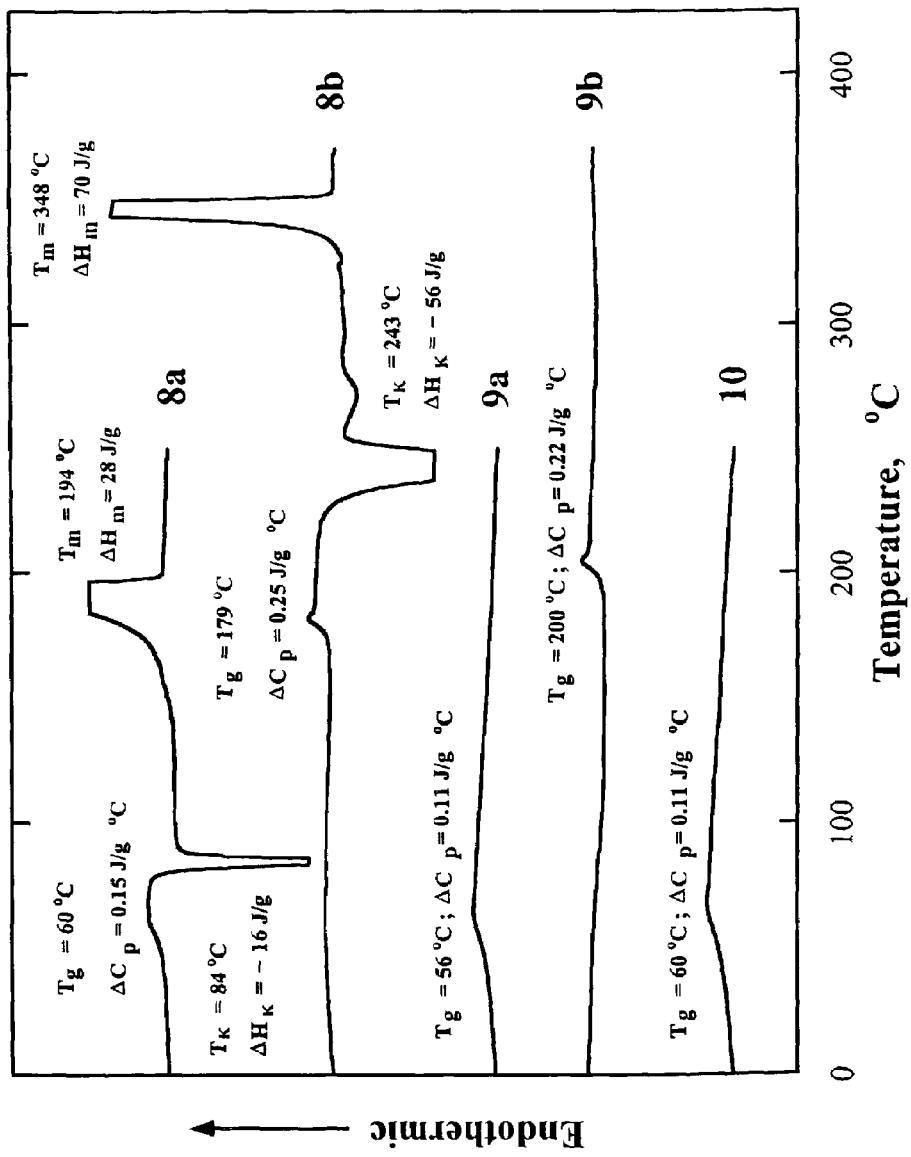
FIG. 9 is a thermogram of spiro-linked oligomer compositions according to this invention as a function of temperature.
Figure 10:
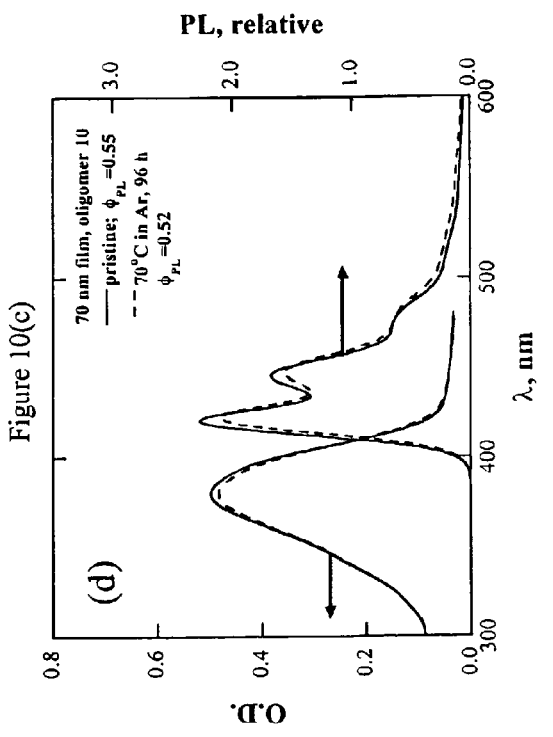
Figure 10:
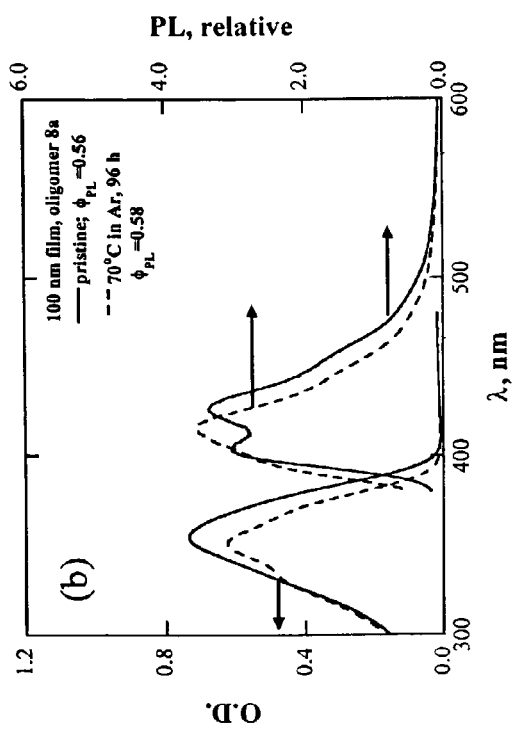
Figure 10:
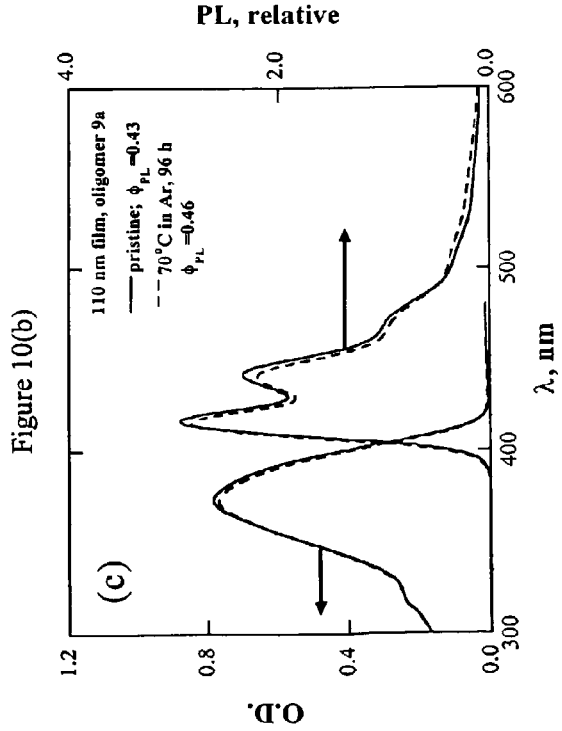

Performance characteristics of embodiments of spiro-linked oligofluorenes according to embodiments of this invention is exemplified in FIGS. 9 and 10. In FIGS. 9 and 10, the numeric references 8a, 8b, 9a, 9b and 10 refer to 2,2',7,7'-tetrakis(9,9-bis(n-octyl)fluorenyl)-9,9'-spirobi-fluorene, 2,2',7,7'-tetrakis(9,9-bis(n-propyl)fluorenyl)-9,9'-spirobi-fluorene, 2,2',7,7'-tetrakis(9,9,9',9'-tetra-n-octyl-2,2'-bifluorenyl)-9,9'-spirobifluorene, 2,2',7,7'-tetrakis(9,9,9',9'-tetra-n-propyl-2,2'-bifluorenyl)-9,9'-spirobifluorene and 2,2',7,7'-tetrakis(9,9,9',9',9'',9''-hexa-n-octyl-2,7';2',7''-terfluorenyl)-9,9'-spirobifluorene, respectively. FIG. 9 is a graph showing the endothermy of several spiro-linked oligomer compositions according to this invention as a function of temperature. In FIG. 9, $T_g$, is glass transition temperature, $T_m$, is melting point, and $T_k$ is crystallization temperature. FIG. 9 shows that these spiro-linked oligomer compositions resist crystallization on heating and cooling.

FIG. 10(a), 10(b) and 10(c) are graphs showing absorbance (OD) and emission intensity (PL) of spiro-linked oligomer compositions as a function of wavelength. Emission intensity is given in arbitrary units, and $\Phi_{PL}$ is the photoluminescence quantum yield. These emission and absorption spectra show that the spiro-linked oligomer compositions according to this invention emit and absorb strongly.

This invention is further directed to methods for synthesizing spiro-linked oligofluorene compositions. In embodiments of methods according to this invention, substitutions are made to various fluorene monomers to prepare fluorene segments. After these fluorene segments are prepared, spiro-linked oligomer compositions are synthesized by combining the fluorene segments with a spirobifluorene. By using methods according to this invention, monodisperse compositions can be prepared.

In embodiments, the fluorene segments may be formed by making a series of substitutions to a halofluorene. First, for example, the halofluorene can be converted to a fluorene boronic acid. In embodiments, the reaction may be conducted by reacting the halofluorene with a butyllithium, such as n-butyllithium. After reacting the halofluorene and the butyllithium, the resultant composition can be reacted with a trialkylborate. In embodiments, the trialkylborate may be tri-iso-propyl borate. Hydrolysis of the resulting compound yields a fluorene boronic acid.

The resulting fluorene boronic acid can then be reacted with a dihalofluorene to obtain a fluorene dimer bearing a halogen. In embodiments, the dihalofluorene may be an iodobromofluorene. To obtain the fluorene dimer, the fluorene boronic acid can be reacted with the dihalofluorene in the presence of a catalyst, such as palladium. In embodiments, the catalyst is present in the form of tetrakis(triphenylphosphine) palladium ($Pd(PPh_3)_4$). In embodiments, the resulting fluorene dimer is functionalized with a bromine. The process by which a fluorene dimer functionalized with a halogen is obtained can be repeated as necessary to obtain fluorene portions having a requisite number of fluorene residues for a particular application.

After obtaining the halogen-bearing fluorene oligomer having the desired number of fluorene residues, the halogenated fluorene oligomer is linked with the spirobifluorene, such as a 2,2',7,7'-tetrabromo-9,9'-spirobifluorene. In various exemplary embodiments, this conversion is accomplished by employing the Suzuki coupling reaction.

Oligomer compositions according to this invention can include fully spiro-configured terfluorenes.

Embodiments of oligomer compositions comprising fully spiro-configured terfluorenes are described by the following formula:

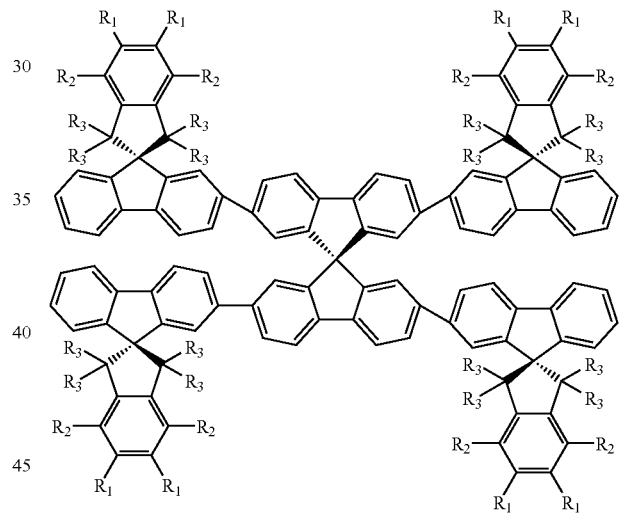

where:

$R_1$ and $R_2$ are H or Ar;

$R_3$ is H, F or $CH_3$; and

Ar is a phenyl, naphthyl, or heterocyclic aromatic group.

Fully spiro-configured terfluorenes according to preferred embodiments of this invention include at least two spiro-linked fluorene residues, and pendant fluorene segments. The pendant fluorene segments may be linked at the 2- and 7-carbons of the spiro-linked fluorene residues. The pendant fluorene segments may include one or more fluorene residues, which include spiro-linked functional groups at the 9-carbon of each fluorene residue. The spiro-linked functional groups can be aromatic moieties. The aromatic moieties can be further functionalized, for example, with aryl groups including, but not limited to, phenyl, naphthyl and heterocyclic aryl groups.

Fully spiro-configured terfluorenes according to this invention include, but are not limited to, the following oligomers:

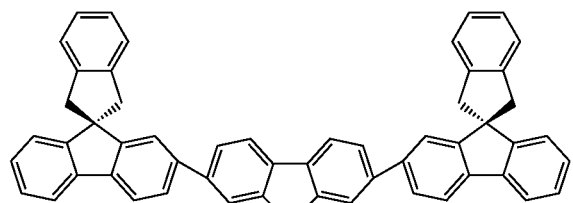
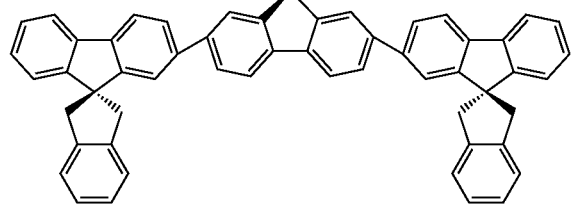

-continued
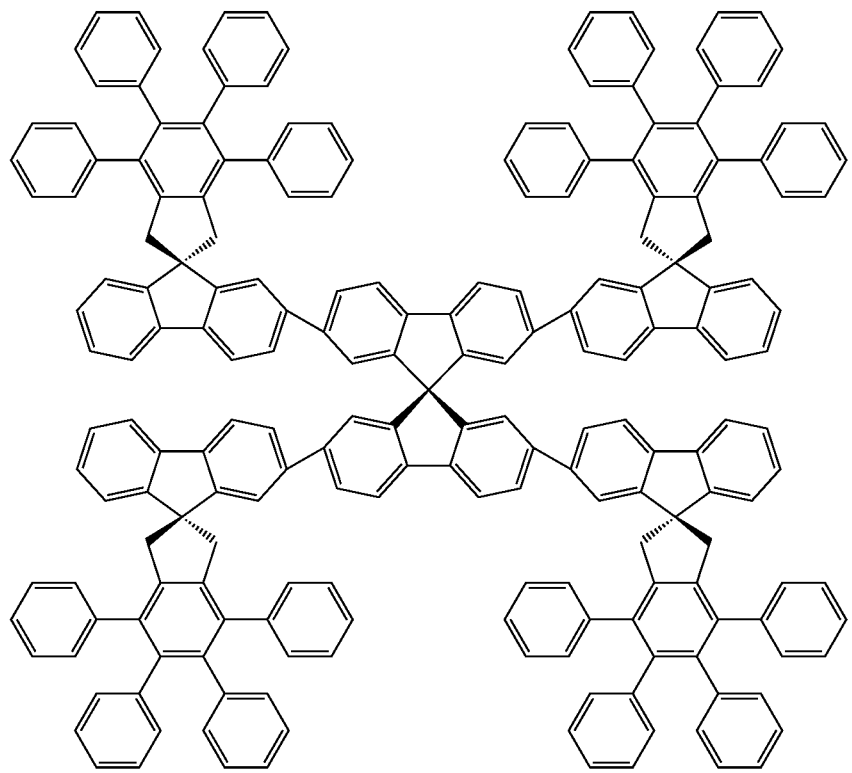
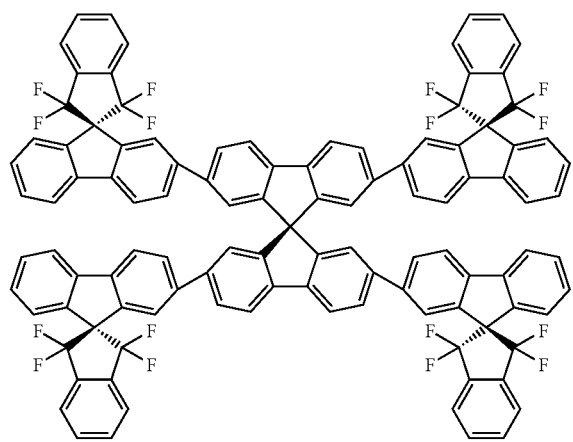

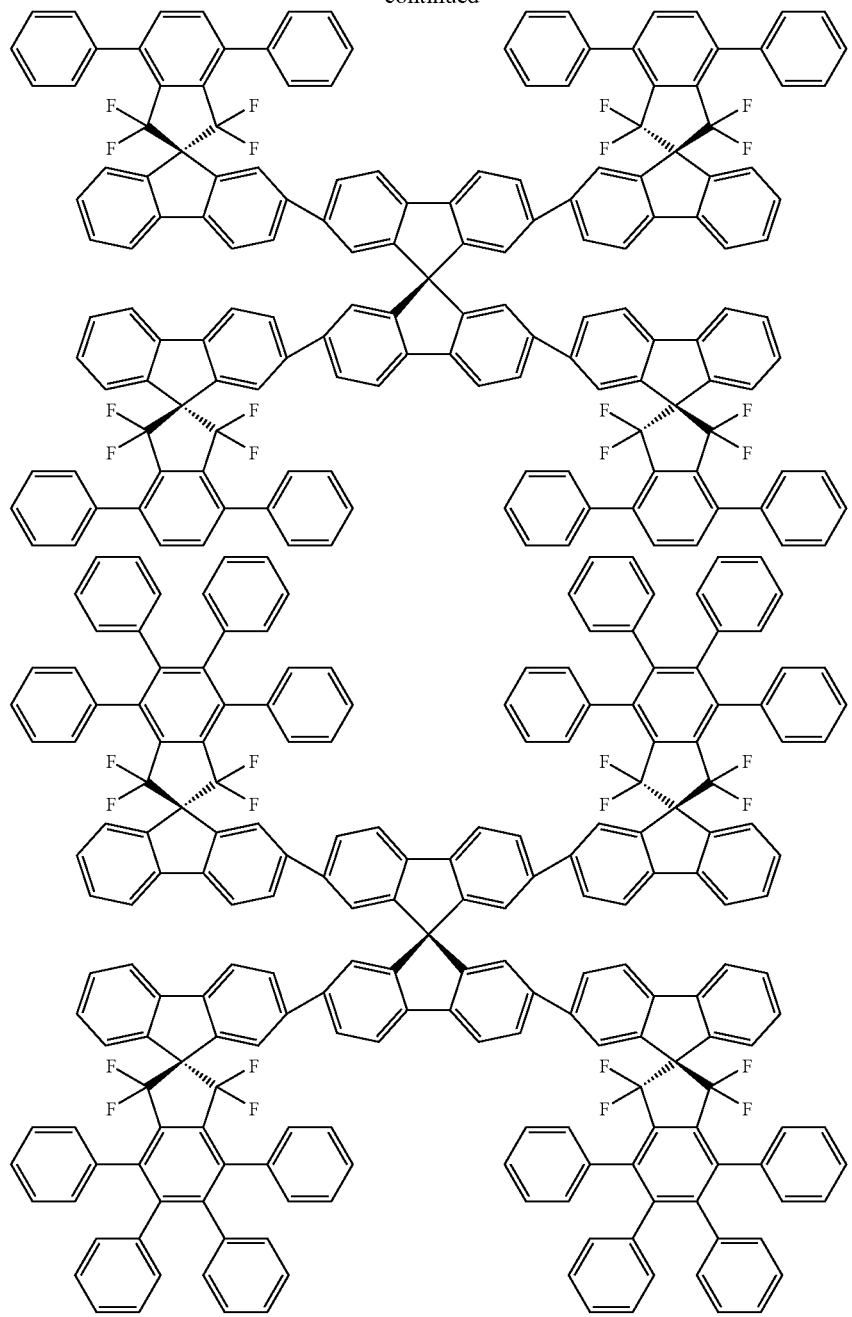
-continued

Embodiments of compositions comprising fully spiro-configured terfluorenes according to this invention are monodisperse. Accordingly, the shape and size of such fully spiro-configured terfluorenes in the compositions result in improved chemical purity over known compositions. Further, embodiments of fully spiro-configured terfluorenes according to this invention can be easily processed into uniform thin films.

In embodiments of fully spiro-configured terfluorene compositions according to this invention, stable blue light emission is achieved in compositions that can be fabricated as functional molecular glass in optoelectronic applications. This desirable result is possible because such fully spiro-configured terfluorene compositions have high glass transition temperatures relative to known compositions, and further are configured so as to prevent π-stacking.

Figure 11:
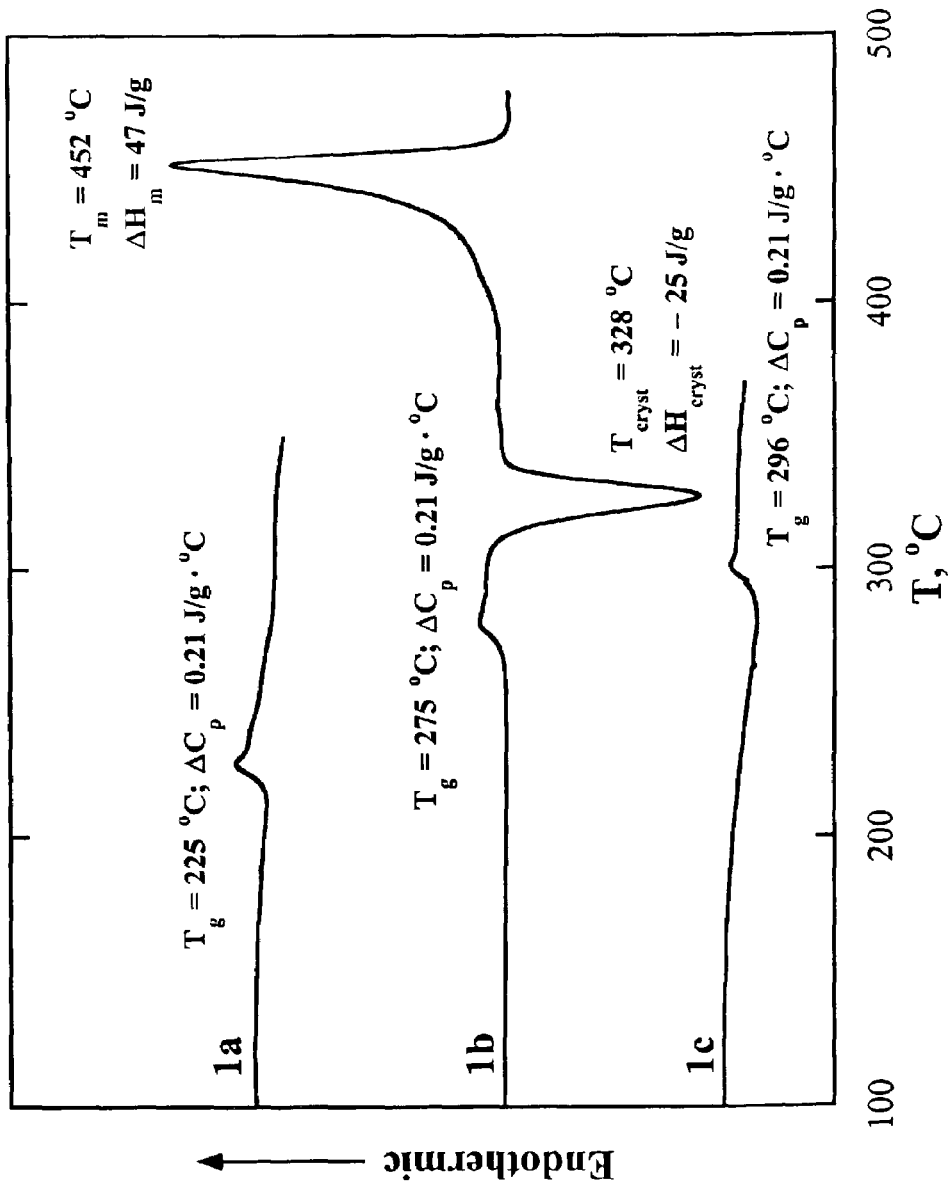
FIG. 11 is a graph showing thermograms of several fully spiro-configured oligomer compositions according to this invention as a function of temperature.

Performance characteristics of embodiments of fully spiro-configured terfluorene compositions according to this invention is exemplified in FIGS. 11, 12(a) and 12(b). In FIGS. 11, 12(a) and 12(b), the numeric references 1a, 1b, 1c refer to 2,2',7,7'-Tetrakis[spiro(fluorene-9,2'-inden)-2-yl]-9,9-spirobifluorene, 2,2',7,7'-Tetrakis[4',7'-diphenylspiro(fluorene-9,2'-inden)-2-yl]-9,9-spirobifluorene, and 2,2',7,7'-Tetrakis[4',5',6',7'-tetraphenylspiro(fluorene-9,2'-inden)-2-yl]-9,9-spirobifluorene, respectively. FIG. 11 is a graph showing the endothermy of several fully spiro-configured oligomer compositions according to this invention as a function of temperature. In FIG. 11, $T_g$, is glass transition temperature, $T_m$, is melting point, and $T_k$ is crystallization temperature. FIG. 11 shows that spiro-linked oligomer compositions according to this invention resist crystallization on heating and cooling. FIGS. 12(a) and 12(b) are graphs showing absorbance (OD) and emission intensity (PL) as a function of wavelength, along with electron diffraction and refractive index as a function of wavelength (inset in FIG. 12(b)) of fully spiro-configured oligomer compositions according to this invention. These emission and absorption spectra show that spiro-linked oligomer compositions according to this invention emit and absorb strongly.

This invention is further directed to methods for synthesizing fully spiro-configured terfluorene compositions. In embodiments of methods according to this invention, substitutions are made to various fluorene monomers to prepare the pendant fluorene structures of the spiro-configured terfluorene. The pendant fluorene structures are then combined with a spirobifluorene to achieve the spiro-configured terfluorene compositions.

In embodiments of methods according to this invention, a benzene is spiro-linked to a fluorene. In some such embodiments, the benzene may be a functionalized dihalobenzene. In embodiments, the dihalobenzene may be a dibromobenzene. These benzenes can be functionalized, in whole or in part, for example, with phenyl groups. The spiro-linking can occur in the presence of a phase transfer catalyst. In embodiments, the phase transfer catalyst can be benzyltriethylammonium chloride. The resulting intermediate is a bromide of the pendant fluorene segment.

In embodiments, the pendant fluorene segments may be prepared for linking with the spirobifluorene by making one or more substitutions. First, for example, the halofluorene can be converted to a boronic acid of the pendant fluorene segment. In embodiments, the reaction may be conducted by reacting the pendant fluorene segment with a butyllithium, such as n-butyllithium. After reacting the pendant fluorene segment and the butyllithium, the resultant composition can be reacted with a trialkylborate. In embodiments, the trialkylborate may be tri-iso-propyl borate. Hydrolysis of the resulting compound yields a boronic acid of the pendant fluorene segment.

Alternatively, the pendant fluorene segment can be converted to a dioxaborolane of the pendant fluorene segment. In embodiments, the reaction may be conducted by reacting the pendant fluorene segment with a butyllithium, such as n-butyllithium. After reacting the pendant fluorene segment and the butyllithium, the resultant composition can be reacted with a dioxaborolane. In embodiments, the dioxaborolane may be 2-isopropoxy-4,4,5,5-tetramethyl-[1,3,2] dioxaborolane.

After obtaining the fluorene pendant segment boronic acid or dioxaborolane, the fluorene oligomer is linked with the spirobifluorene, such as a 2,2',7,7'-tetrabromo-9,9'-spirobifluorene. In embodiments, this conversion is accomplished by employing the Suzuki coupling reaction.

Because embodiments of oligomers according to this invention are monodisperse, they can be readily processed into thin films by vacuum deposition (e.g., sublimation) or other conventional deposition methods, such as spin coating.

Embodiments of oligomer compositions according to this invention may be used to form films, which can be used in electronics, optics, photonics and optoelectronics applications. For example, such films may be used in polymeric light emitting devices. In embodiments, films formed from oligomer compositions according to this invention are useful as emitting layers or charge carrier transport layers. Oligomer compositions according to this invention are used as fluorescent coatings or coatings employed to protect electronic devices.

Films formed from embodiments of oligomer compositions according to this invention can have a thickness that varies depending on the application in which they are employed. In exemplary embodiments, the films can have thicknesses of from about 20 nm to about 200 nm. In embodiments where the oligomer compositions are used to form emitting layers in light emitting devices, the films preferably have thicknesses of from about 10 to about 200 nm, such as from about 15 to about 120 nm. When embodiments of oligomer compositions according to this invention are used to form fluorescent coatings, the film thickness may desirably be from about 0.1 to about 10 microns, such as from about 0.5 to about 5 microns. When the oligomer compositions are used to form protective coatings, thicknesses may preferably be from about 0.1 to about 10 microns, such as from about 0.5 to about 5 microns.

Various methods can be employed to form substantially defect-free films using embodiments of oligomer compositions according to this invention. In various exemplary embodiments, films may be formed from such oligomer compositions by methods including, but not limited to: spin-coating, spray-coating, dip-coating and roller-coating. As described above, the films can also be applied by vacuum deposition.

In embodiments, oligomer compositions according to this invention may be dissolved in a solvent when they are applied to a substrate. Any solvent that is suitable for application of the oligomer composition as a film can be employed. In various exemplary embodiments, the solvent is an organic solvent. Such organic solvents can include, but are not limited to: chloroform, methylchloride, tetrahydrofuran and toluene. In various exemplary embodiments, solutions of oligomer compositions according to this invention can preferably contain from about 0.1 to about 20 weight percent of the oligomer composition. In embodiments, solutions of oligomer compositions according to this invention can contain from about 0.5 to about 10 weight percent.

Films formed from oligomer compositions according to this invention can also include various additives, including additives that are well known in the art.

Films comprising oligomer compositions according to this invention can be employed to form light-emitting devices. In embodiments, such light-emitting devices can include a film of an oligomer composition according to this invention situated between an anode and a cathode such that when current is applied to the device, holes are injected into the organic film from the anode, and electrons are injected into the organic film from the cathode. The combination of a hole and an electron gives rise to an exciton which may undergo radiative decay to the ground state by liberating a photon, thus generating light.

Methods and materials employed to form light-emitting devices are well known in the art. Any of these methods and/or materials may be employed, along with oligomer compositions according to this invention, to form light-emitting devices.

This invention is illustrated by the following Example, which is merely for the purpose of illustration. Each of the reference numerals following to the named compounds below refers to the chemical formula shown in the immediately preceding reaction scheme.

EXAMPLES
The following description refers to the reaction scheme shown below.
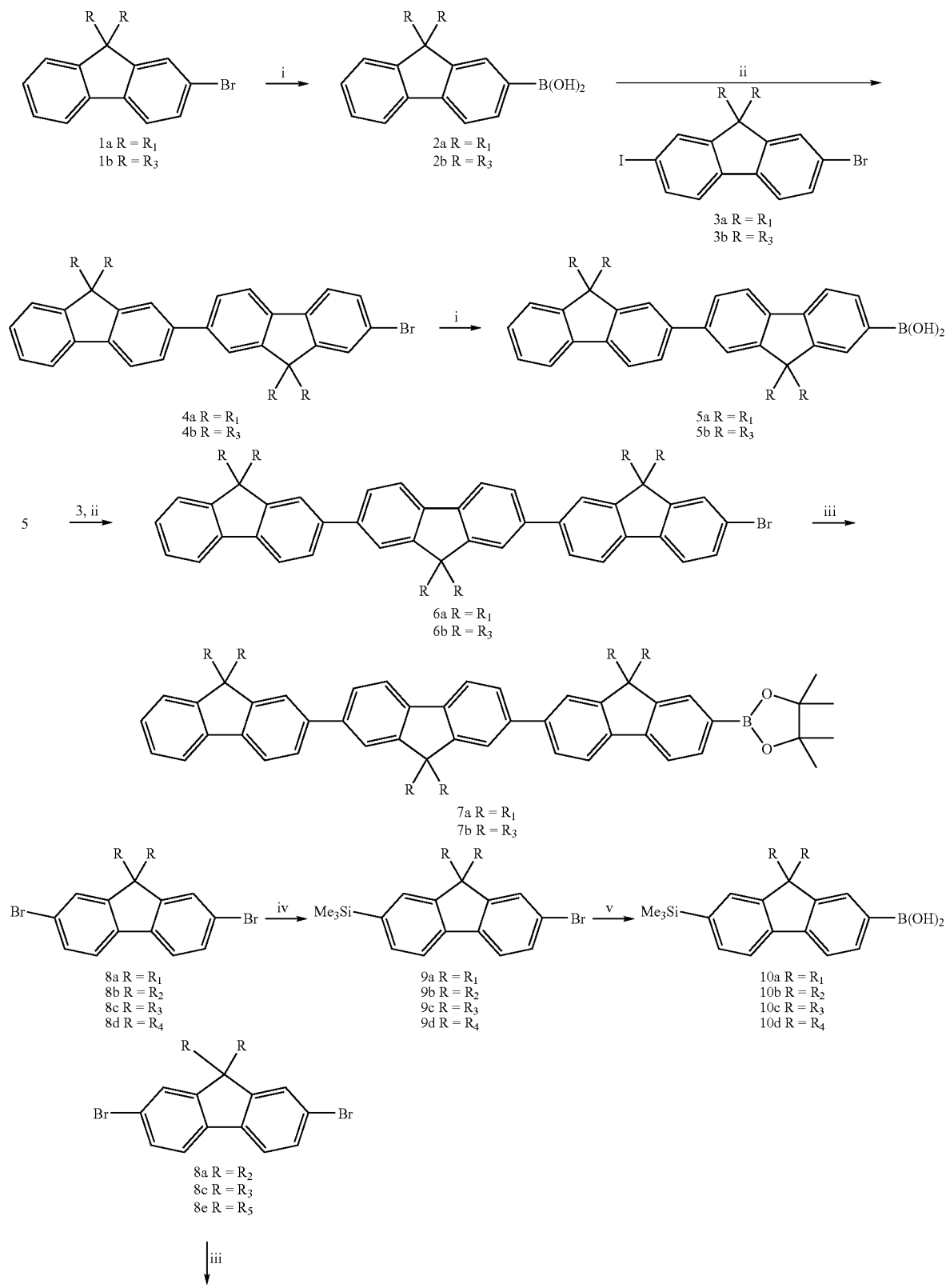

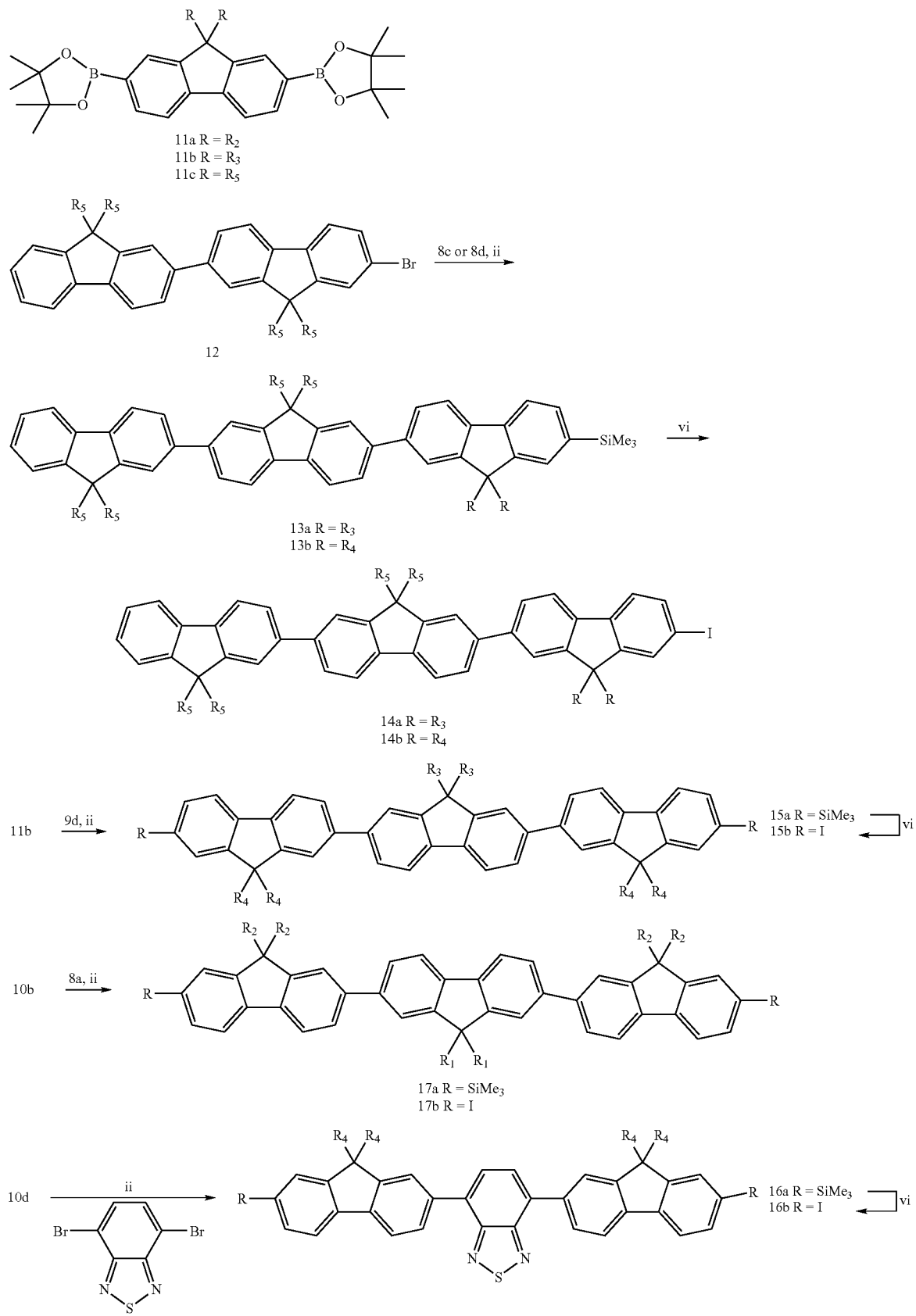

-continued

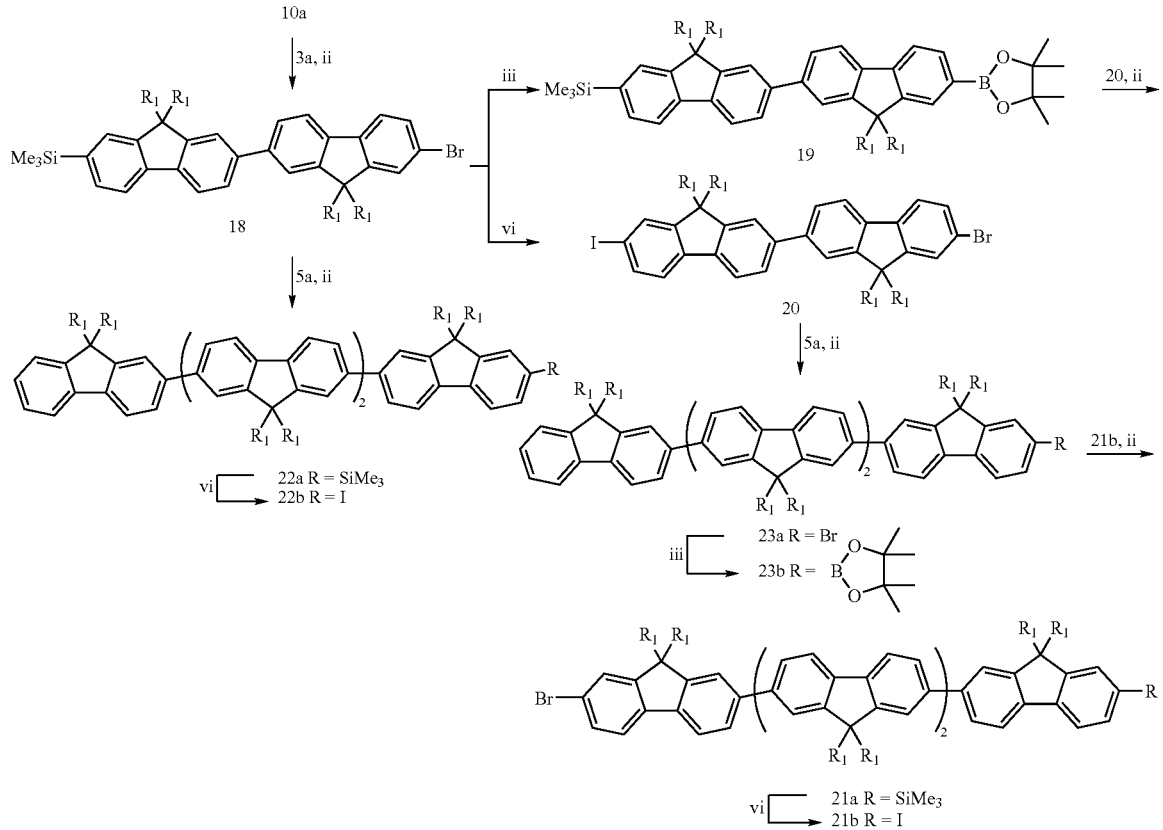

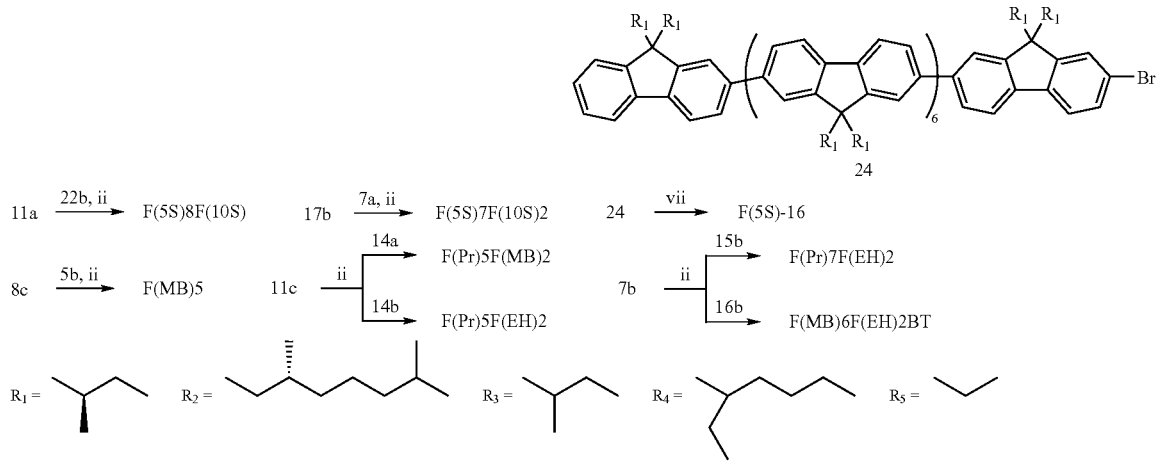

i) (1) n-BuLi, -78° C.; (2) (i-PrO)₃B, -78° C. to rt; (3) H₃O⁺, (ii) Pd(PPh₃)₄, Na₂CO₃ (2.0 M aq.), 90° C. (iii) (1) n-BuLi, -78° C.;
(2) 2-isopropoxy-4,4,5,5-tetramethyl-1,3,2-dioxaborolane, -78° C. to rt. (iv) (1) n-BuLi, -78° C.; (2) ClSiMe₃, -78° C. to rt. (v) (1) n-BuLi, -78° C.;
(2) (i-PrO)₃B, -78° C. to rt; (3) H₂O. (vi) ICl, 0° C. (vii) Ni(COD)/2,2'-bipyridine/COD, 80° C.

9,9-Bis(2S-methylbutyl)-fluoren-2-yl-boronic acid (2a). n-BuLi (2.5 M in hexane, 6.0 ml, 15.0 mmol) is added to a solution of 2-bromo-9,9bis(2S-methylbutyl) fluorene (1a) (5.20 g, 13.5 mmol) in anhydrous THF (50 ml) at -78° C. The reaction mixture is stirred for 1 h before tri-iso-propyl borate (3.80 ml, 3.10 g, 16.5 mmol) is added in one portion. The mixture is warmed to room temperature, stirred overnight and then quenched with HCl (2.0 M, 40 ml) before adding a large amount of water for extraction with ethyl ether. The organic extracts are washed with brine and dried over MgSO₄. Upon evaporating off the solvent, the residue is purified by column chromatography on silica gel with petroleum ether:ethyl acetate (2:1) as the eluent. 9,9-bis(2S-methylbutyl)-fluoren-2-yl-boronic acid (2a) (4.34 g, 92%) is obtained as a white solid.

¹H NMR spectral analysis (400 MHz, CDCl₃) of the obtained compound provides the following data: δ (ppm) 7.70–8.32 (m, 4H), 7.30–7.48 (m, 3H), 1.93–2.38 (m, 4H), 0.73–1.01 (m, 4H), 0.58–0.72 (m, 8H), 0.20–0.31 (m, 6H).

9,9 Bis(2-methylbutyl)-fluoren-2-yl-boronic acid (2b). The above procedure for the synthesis of 9,9-bis(2S-methylbutyl)-fluoren-2-yl-boronic acid (2a) is followed to prepare 9,9-bis(2-methylbutyl)-fluoren-2-yl-boronic acid (2b) as a white solid in a 91% yield.

¹H NMR spectral analysis (400 MHz, CDCl₃) of the obtained compound provides the following data: δ (ppm) 7.30–8.32 (m, 7H), 1.93–2.38 (m, 4H), 0.74–1.11 (m, 4H), 0.55–0.72 (m, 8H), 0.24–0.36 (m, 6H).

7-Bromo-9,9,9',9'-tetrakis(2S-methylbutyl)-2,2'-bifluorene (4a). A toluene (60 ml) and 2.0 M Na₂CO₃ solution (36.0 ml, 72.0 mmol) is added to a mixture of 9,9-is(2S-methylbutyl)-fluoren-2-yl-boronic acid (2a) (7.70 g, 22.0 mmol), 2-iodo-7-bromo-9,9-bis(2S-methylbutyl)fluorene (3a) (13.4 g, 26.2 mmol) and Pd(PPh₃)₄ (250 mg, 0.216 mmol) in a 250 ml Schlenk tube. The reaction mixture is stirred at 90° C. for 2 days. After the mixture is cooled to room temperature, petroleum ether (200 ml) is added. The organic layer is separated and washed with brine for drying over MgSO₄. Upon evaporating off the solvent, the residue is purified by column chromatography on silica gel with petroleum ether:methylene chloride (100:0, and then 95:5) as the eluent to yield 7-bromo-9,9,9',9'-tetrakis(2S-methylbutyl)-2,2'-bifluorene (4a) (9.95 g, 65%) as a white solid.

¹H NMR spectral analysis (400 MHz, CDCl₃) of the obtained compound provides the following data: δ (ppm) 7.52–7.81 (m, 3H), 7.59–7.65 (m, 5H), 7.54 (d, J=1.66 Hz, 1H), 7.50 (dd, J=8.04 Hz, 1.80 Hz, 1H), 7.29–7.43 (m, 3H), 2.11–2.25 (m, 1.97 (m, 4H), 0.84–1.02 (m, 8H), 0.60–0.73 (m, 16H), 0.26–0.35 (m, 12H).

7-Bromo-9,9,9',9'-tetrakis(2-methylbutyl)2,2'-bifluorene (4b). The procedure for the synthesis of 7-bromo-9,9,9',9'-tetrakis(2S-methylbutyl)-2,2'-bifluorene (4a) is followed to prepare 7-bromo-9,9,9',9'-tetrakis(2-methylbutyl)-2,2'-bifluorene (4b) as a white solid in a 71% yield.

¹H NMR spectral analysis (400 MHz, CDCl₃) of the obtained compound provides the following data: δ (ppm) 7.54–7.81 (m, 3H), 7.60–7.66 (m, 5H), 7.48–7.59 (m, 2H), 7.29–7.47 (m, 3H), 2.11–2.22 (m, 4H), 1.88–1.97 (m, 4H), 0.84–0.97 (m, 8H), 0.57–0.69 (m, 16H), 0.27–0.38 (m, 12H).

9,9,9',9'-Tetrakis(2S-methylbutyl)-2,2'-bifluoren-7-yl-boronic acid (5a). The procedure for the synthesis of 9,9-bis(2S-methylbutyl)-fluoren-2-yl-boronic acid (2a) is followed to prepare 9,9,9',9'-tetrakis(2S-methylbutyl)-2,2'-bifluoren-7-yl-boronic acid (5a) as a white solid in a 82% yield.

¹H NMR spectral analysis (400 MHz, CDCl₃) of the obtained compound provides the following data: δ (ppm) 7.91–8.36 (m, 2H), 7.61–7.85 (m, 8H), 7.29–7.45 (m, 3H), 1.97–2.42 (m, 8H), 0.60–1.20 (m, 24H), 0.26–0.36 (m, 12H).

9,9,9',9'-Tetrakis(2-methylbutyl)-2,2'-bifluoren-7-yl-boronic acid (5b). The procedure for the synthesis of 9,9-bis(2S-methylbutyl)-fluoren-2-yl-boronic acid (2a) is followed to prepare 9,9,9',9'-tetrakis(2-methylbutyl)-2,2'-bifluoren-7-yl-boronic acid (5b) as a white solid in a 74% yield.

¹H NMR spectral analysis (400 MHz, CDCl₃) of the obtained compound provides the following data: δ (ppm) 8.15–8.38 (m, 2H), 7.64–7.99 (m, 8H), 7.29–7.40 (m, 3H), 1.93–2.35 (m, 8H), 0.61–1.16 (m, 24H), 0.26–0.40 (m, 12H).

2-Bromo-9,9,9',9',9'',9''-hexakis(2S-methylbutyl)7,2';7',2''-terfluorene (6a). The procedure for the synthesis of 7-bromo-9,9,9',9'-tetrakis(2S-methylbutyl)2,2'-bifluorene (4a) is followed to prepare 2-bromo-9,9,9',9',9'',9''-hexakis(2S-methylbutyl) -7,2';7',2''-terfluorene (6a) as a white solid in a 68% yield.

¹H NMR spectral analysis (400 MHz, CDCl₃) of the obtained compound provides the following data: δ (ppm) 7.75–7.85 (m, 5H), 7.60–7.67 (m, 9H), 7.55 (d, J=1.65 Hz, 1H), 7.50 (dd, J=8.01 Hz, 1.62 Hz, 1H), 7.29–7.44 (m, 3H), 2.16–2.26 (m, 6H), 1.88–1.98 (m, 6H), 0.88–1.02 (m, 12H), 0.62–0.69 (m, 24H), 0.29–0.39 (m, 18H).

2-Bromo-9,9,9',9',9'',9''-hexakis(2-methylbutyl)-7,2';7',2''-terfluorene (6b). The procedure for the synthesis of 7-bromo-9,9,9',9'-tetrakis(2S-methylbutyl)2,2'-bifluorene (4a) is followed to prepare 2-bromo-9,9,9',9',9'',9''-hexakis(2-methylbutyl) -7,2';7',2''-terfluorene (6b) as a white solid in a 67% yield.

¹H NMR spectral analysis (400 MHz, CDCl₃) of the obtained compound provides the following data: δ (ppm) 7.84–7.86 (m, 5H), 7.60–7.68 (m, 9H), 7.48–7.56 (m, 2H), 7.29–7.47 (m, 3H), 2.16–2.26 (m, 6H), 1.88–2.14 (m, 6H), 0.88–1.12 (m, 12H), 0.60–0.75 (m, 24H), 0.29–0.39 (m, 18H).

2-[9,9,9',9', 9'',9''-Hexakis(2S-methylbutyl)-7,2';7',2''-terfluoren-2-yl]-4,4,5,5-tetramethyl-[1,3,2]dioxaborolane (7a). n-BuLi (2.5 M in hexane, 1.60 ml, 4.00 mmol) is added to a solution of 2-bromo-9,9,9',9',9'',9''-hexakis(2S-methylbutyl)-7,2';7',2''-terfluorene (6a) (3.50 g, 3.52 mmol) in anhydrous THF (30 ml) at −78° C., and the reaction mixture is stirred for 1 h before adding 2-isopropoxy-4,4,5,5-tetramethyl-[1,3,2]dioxaborolane (0.87 ml, 0.793 g, 4.26 mmol). The mixture is warmed to room temperature, stirred overnight and poured into a large amount of water for extraction with methylene chloride. The organic extracts are washed with brine and dried over MgSO₄. Upon evaporating off the solvent, the residue is purified by column chromatography on silica gel with petroleum ether:methylene chloride (4:1) as the eluent to yield 2-[9,9,9',9',9'',9''-hexakis(2S-methylbutyl)-7,2';7',2''-terfluoren-2-yl]-4,4,5,5-tetramethyl-[1,3,2]dioxaborolane (7a) (2.90 g, 68%) as a white solid.

¹H NMR spectral analysis (400 MHz, CDCl₃) of the obtained compound provides the following data: δ (ppm) 7.79–7.87 (m, 6H), 7.77 (d, J=7.65 Hz, 2H), 7.63–7.67 (m, 8H), 7.31–7.44 (m, 3H), 2.19–2.27 (m, 6H), 1.94–2.01 (m, 6H), 1.41 (s, 12H), 0.88–1.02 (m, 12H), 0.59–0.69 (m, 24H), 0.38 (d, J=6.68 Hz, 6H), 0.29–0.34 (m, 12H).

2-[9,9,9',9',9'',9''-Hexakis(2-methylbutyl)-7,2';7',2''-terfluoren-2-yl]-4,4,5,5-tetramethyl-[1,3,2]dioxaborolane (7b). The procedure for the synthesis of 2-[9,9,9',9',9'',9''-hexakis(2S-methylbutyl)-7,2';7',2''-terfluoren-2-yl]-4,4,5,5-tetramethyl-[1,3,2]dioxaborolane (7a) is followed to prepare 2-[9,9,9',9',9'',9''-hexakis(2-methylbutyl)-7,2';7',2''-terfluoren-2-yl]-4,4,5,5-tetramethyl-[1,3,2]dioxaborolane (7b) as a white powder in a 58% yield.

¹H NMR spectral analysis (400 MHz, CDCl₃) of the obtained compound provides the following data: δ (ppm) 7.78–7.89 (m, 6H), 7.76 (d, J=7.52 Hz, 2H) 7.60–7.72 (m, 8H), 7.29–7.47 (m, 3H), 2.15–2.25 (m, 6H), 1.91–2.01 (m, 6H), 1.42 (s, 12H), 0.57–0.98 (m, 36H), 0.28–0.42 (m, 18H).

2-Bromo-7-trimethylsilyl-9,9-bis(2S-methylbutyl)fluorene (9a). n-BuLi (2.5 M in hexane, 5.6 ml, 14.0 mmol) is added to a solution of 2,7-dibromo-9,9-bis(2S-methylbutyl)fluorene (8a) (6.52 g, 14.0 mmol) in anhydrous THF (100 ml) at −78° C. for 30 minutes. The reaction mixture is stirred for 1 h before adding Me₃SiCl (2.0 ml, 1.71 g, 15.8 mmol). The mixture is warmed to room temperature, stirred for 30 min and poured into a large amount of water for extraction with petroleum ether. The organic extracts are washed with brine and dried over MgSO₄. Upon evaporating off the solvent, the residue is purified by column chromatography on silica gel with petroleum ether as the eluent to yield 2-bromo-7-trimethylsilyl-9,9-bis(2S-methylbutyl)fluorene (9a) (5.89 g, 91%) as a colorless liquid.

$^1$H NMR spectral analysis (400 MHz, CDCl₃) of the obtained compound provides the following data: δ (ppm) 7.54–7.68 (m, 2H), 7.45–7.52 (m, 4H), 2.05–2.15 (m, 2H), 1.77–1.91 (m, 2H), 0.82–0.95 (m, 4H), 0.57–0.64 (m, 8H), 0.22–0.32 (m, 15).

$^{13}$C NMR spectral analysis (100 MHz, CDCl₃) of the obtained compound provides the following data: δ (ppm) 153.04, 149.16, 140.67, 140.22, 139.01, 131.73, 129.81, 128.79, 127.06, 121.08, 120.59, 118.92, 54.86, 47.72, 47.24, 31.20, 30.88, 30.42, 21.45, 20.87, 10.88, −1.09.

2-Bromo-7-trimethylsilyl-9,9-bis(3S, 7-dimethyloctyl) fluorene (9b). The procedure for the synthesis of 2-bromo-7-trimethylsilyl-9,9-bis(2S-methylbutyl)fluorene (9a) is followed to prepare 2-bromo-7-trimethylsilyl-9,9-bis(3S, 7-dimethyloctyl)fluorene (9b) as a colorless liquid in a 90% yield.

$^1$H NMR spectral analysis (400 MHz, CDCl₃) of the obtained compound provides the following data: δ (ppm) 7.66 (d, J=7.46 Hz, 1H), 7.58 (dd, J=7.14 Hz, 1.50 Hz, 1H), 7.40 (d, J=7.49 Hz, 1H), 7.44–7.47 (m, 3H), 1.9–2.0 (m, 4H), 1.44–1.50 (m, 2H), 1.0–1.1 (m, 12H), 0.8–0.9 (m, 14H), 0.68–0.72 (m, 6H), 0.34–0.67 (m, 4H), 0.31 (s, 9H).

2-Bromo-7-trimethylsilyl 9,9-bis(2-methylbutyl)fluorene (9c). The procedure for the synthesis of 2-bromo-7-trimethylsilyl-9,9-bis(2S-methylbutyl)fluorene (9a) is followed to prepare 2-bromo-7-trimethylsilyl-9,9-bis(2-methylbutyl) fluorene (9c) as a colorless liquid in a 92% yield.

$^1$H NMR spectral analysis (400 MHz, CDCl₃) of the obtained compound provides the following data: δ (ppm) 7.66 (dd, J=7.40 Hz, 0.93 Hz, 1H), 7.59 (d, J=8.12 Hz, 1H), 7.44–7.56 (m, 4H), 2.01–2.20 (m, 2H), 1.81–1.94 (m, 2H), 0.75–1.01 (m, 4H), 0.57–0.65 (m, 8H), 0.24–0.34 (m, 15H).

2-Bromo-7-trimethylsilyl-9,9-bis(2-ethylhexyl)fluorene (9d). The procedure for the synthesis of 2-bromo-7-trimethylsilyl-9,9-bis(2S-methylbutyl)fluorene (9a) is followed to prepare 2-bromo-7-trimethylsilyl-9,9-bis(2-ethylhexyl)fluorene (9d) as a colorless liquid in a 92% yield.

$^1$H NMR spectral analysis (400 MHz, CDCl₃) of the obtained compound provides the following data: δ (ppm) 7.65 (d, J=7.45 Hz, 1H), 7.57 (d, J=8.04 Hz, 1H), 7.43–7.54 (m, 4H), 1.92–2.04 (m, 4H), 0.80–0.93 (m, 22H), 0.47–0.57 (m, 8H), 0.30 (s, 9H).

2-Trimethylsilyl-9,9-bis(2S-methylbutyl)-fluoren-7-yl-boronic acid (10a). n-BuLi (2.5 M in hexane, 5.6 ml, 14.0 mmol) is added to a solution of 2-bromo-7-trimethylsilyl-9,9-bis(2S-methylbutyl)fluorene (9a) (5.85 g, 12.8 mmol) in anhydrous THF (40 ml) at −78° C. The reaction mixture is stirred for 1 hour before tri-iso-propyl borate (3.6 ml, 2.94 g, 15.6 mmol) is added in one portion. The mixture is warmed to room temperature, stirred overnight and poured into a large amount of water for extraction with ethyl ether. The organic extracts are washed with brine and dried over MgSO₄. Upon evaporating off the solvent, the residue is purified by column chromatography on silica gel with petroleum ether:ethyl acetate (2:1) as the eluent to yield 2-trimethylsilyl-9,9-bis(2S-methylbutyl) -fluoren-7-yl-boronic acid (10a) (4.07 g, 75%) as a white solid.

$^1$H NMR spectral analysis (400 MHz, CDCl₃) of the obtained compound provides the following data: δ (ppm) 8.29–8.36 (m, 2H), 7.95 (d, J=0.57 Hz, 1H), 7.85 (d, J=7.37 Hz, 1H), 7.64 (s, 1H), 7.59 (d, J=7.39 Hz, 1H), 2.27–2.42 (m, 2H), 1.99–2.09 (m, 2H), 0.86–1.09 (m, 4H), 0.61–0.78 (m, 8H), 0.23–0.39 (m, 15H).

$^{13}$C NMR spectral analysis (100 MHz, CDCl₃) of the obtained compound provides the following data: δ (ppm) 150.53, 150.06, 145.60, 141.46, 139.53, 134.35, 131.66, 130.92, 128.97, 119.56, 119.34, 54.56, 47.50, 47.40, 31.33, 31.08, 30.60, 30.54, 21.59, 21.37, 11.12, 11.00, −1.01.

2-Trimethylsilyl-9,9-bis(3S, 7-dimethyloctyl)-fluoren-7-yl-boronic acid (10b). The procedure for the synthesis of 2-trimethylsilyl-9,9-bis(2S -methylbutyl)fluoren-7-yl-boronic acid (10a) is followed to prepare 2-trimethylsilyl-9,9-bis(3S, 7-dimethyloctyl)-fluoren-7-yl-boronic acid (10b) as a viscous solid in a yield of 70%.

$^1$H NMR spectral analysis (400 MHz, CDCl₃) of the obtained compound provides the following data: δ (ppm) 8.31 (d, J=8.09 Hz, 1H), 8.24 (s, 1H), 7.92 (d, J=7.55 Hz, 1H), 7.82 (d, J=7.90 Hz, 1H), 7.57 (d, J=7.14 Hz, 1H), 7.56 (s, 1H), 2.06–2.15 (m, 4H), 1.42–1.49 (m, 2H), 1.00–1.30 (m, 12H), 0.82–1.0 (m, 2H), 0.49–0.81 (m, 22H), 0.36 (s, 9H).

2-Trimethylsilyl-9,9-bis(2-methylbutyl)-fluoren-7-yl-boronic acid (10c). The procedure for the synthesis of 2-trimethylsilyl-9,9-bis(2S-methylbutyl)-fluoren-7-yl-boronic acid (10a) is followed to prepare 2-trimethylsilyl-9,9-bis(2-methylbutyl)-fluoren-7-yl-boronic acid (10c) as a white solid in a 62% yield.

$^1$H NMR spectral analysis (400 MHz, CDCl₃) of the obtained compound provides the following data: δ (ppm) 8.23–8.34 (m, 2H), 7.92 (d, J=7.48 Hz, 1H), 7.82 (d, J=7.42 Hz, 1H), 7.53–7.66 (m, 2H), 2.21–2.40 (m, 2H), 1.95–2.09 (m, 2H), 0.78–1.12 (m, 4H), 0.58–0.77 (m, 8H), 0.28–0.39 (m, 15H).

2-Trimethylsilyl-9,9-bis(2-ethylhexyl)-fluoren-7-yl-boronic acid (10d). The procedure for the synthesis of 2-trimethylsilyl-9,9-bis(2S-methylbutyl)-fluoren-7-yl-boronic acid (10a) is followed to prepare 2-trimethylsilyl-9,9-bis(2-ethylhexyl)-fluoren-7-yl-boronic acid (10d) as a white solid in a 67% yield.

$^1$H NMR spectral analysis (400 MHz, CDCl₃) of the obtained compound provides the following data: δ (ppm) 8.26–8.31 (m, 2H), 7.89 (d, J=7.47 Hz, 1H), 7.80 (d, J=7.39 Hz, 1H), 7.62 (s, 1H), 7.54 (d, J=7.50 Hz, 1H), 2.05–2.21 (m, 4H), 0.50–1.00 (m, 30H), 0.34 (s, 9H).

2,2'-[9,9-Bis(3S,7-dimethyloctyl)-fluoren-2,7-diyl)]-bis [4,4,5,5-tetramethyl-[1,3,2]dioxaborolane] (11a). The procedure for the synthesis of 2-[9,9,9',9',9'',9''-hexakis(2S-methylbutyl)-7,2';7',2''-terfluoren-2-yl]-4,4,5,5-tetramethyl-[1,3,2]dioxaborolane (7a) is followed to prepare 2,2'-[9,9-bis(3S,7-dimethyloctyl)-fluoren-2,7-diyl)]-bis[4,4,5,5-tetramethyl-[1,3,2]dioxaborolane] (11a) as a viscous liquid in a yield of 50%.

$^1$H NMR spectral analysis (400 MHz, CDCl₃) of the obtained compound provides the following data: δ (ppm) 7.83 (d, J=7.48 Hz, 2H), 7.68 (s, 2H), 7.74 (d, J=7.60 Hz, 2H), 1.99–2.06 (m, 4H), 1.30–1.46 (m, 2H), 1.40 (s, 24H), 0.99–1.11 (m, 12H), 0.80 0.83 (m, 14H), 0.66 (d, J=6.52 Hz, 6H), 0.38–0.60 (m, 4H).

2,2'-[9,9-Bis(2-methylbutyl)-fluoren-2,7-diyl)]-bis[4,4,5, 5-tetramethyl-[1,3,2]dioxaborolane] (11b). The procedure for the synthesis of 2-[9,9,9',9',9'',9''-hexakis(2S-methylbutyl)-7,2';7',2''-terfluoren-2-yl]-4,4,5,5-tetramethyl-[1,3,2]dioxaborolane (7a) is followed to prepare 2,2'-[9,9-bis(2-methylbutyl)-fluoren-2,7-diyl)]-bis[4,4,5,5-tetramethyl-[1,3,2]dioxaborolane] (11b) as a white solid in a 75% yield.

$^1$H NMR spectral analysis (400 MHz, CDCl₃) of the obtained compound provides the following data: δ (ppm) 7.79–7.85 (m, 4H), 7.74 (d, J=7.73 Hz, 2H), 2.00–2.13 (m, 2H), 1.90–1.98 (m, 2H), 1.40 (s, 24H), 0.84–0.90 (m, 2H), 0.73–0.79 (m, 2H), 0.64–0.67 (m, 2H), 0.52–0.59 (m, 6H), 0.20–0.25 (m, 6H).

2,2'-(9,9-Bis(n-propyl)-fluoren-2,7-diyl)-bis[4,4,5,5-tetramethyl-[1,3,2]dioxaborolane] (11c). The procedure for the synthesis of 2-[9,9,9',9',9'',9''-hexakis(2S-methylbutyl)-7,2'; 7',2''-terfluoren-2-yl]-4,4,5,5-tetramethyl-[1,3,2]dioxaborolane (7a) is followed to prepare 2,2'-(9,9-bis(n-propyl)-fluoren-2,7-diyl)-bis[4,4,5,5-tetramethyl-[1,3,2]dioxaborolane] (11c) as a white solid in a 44% yield.

$^1$H NMR spectral analysis (400 MHz, CDCl$_3$) of the obtained compound provides the following data: δ (ppm) 7.82 (dd, J=7.50 Hz, 0.81 Hz, 2H), 7.77 (s, 2H), 7.74 (d, J=7.50 Hz, 2H), 1.98–2.21 (m, 4H), 1.41 (s, 24H), 0.52–0.68 (m, 10H).

2-Trimethylsilyl-9,9-bis(2-methylbutyl)-9',9',9'',9''-tetrakis(n-propyl)-7,2';7',2''-terfluorene (13a). The procedure for the synthesis of 7-bromo-9,9,9',9'-tetrakis(2S-methylbutyl)-2,2'-bifluorene (4a) is followed to prepare 2-trimethylsilyl-9,9-bis(2-methylbutyl)-9',9', 9'',9''-tetrakis(n-propyl)-7,2';7',2''-terfluorene (13a) as a white solid in a 87% yield.

$^1$H NMR spectral analysis (400 MHz, CDCl$_3$) of the obtained compound provides the following data: δ (ppm) 7.80–7.85 (m, 4H), 7.65–7.79 (m, 10H), 7.51–7.62 (m, 2H), 7.32–7.42 (m, 3H), 1.95–2.25 (m, 12H), 0.60–1.00 (m, 32H), 0.28–0.37 (m, 15H).

2-Trimethylsilyl-9,9-bis(2-ethylhexyl)-9',9',9'',9''-tetrakis(n-propyl)-7,2';7',2''-terfluorene (13b). The procedure for the synthesis of 7-bromo-9,9,9',9'-tetrakis(2S-methylbutyl)-2,2'-bifluorene (4a) is followed to prepare 2-trimethylsilyl-9,9-bis(2-ethylhexyl)-9',9',9'',9''-tetrakis(n-propyl)-7,2';7',2''-terfluorene (13b) as a white solid in a 88% yield.

$^1$H NMR spectral analysis (400 MHz, CDCl$_3$) of the obtained compound provides the following data: δ (ppm) 7.75–7.85 (m, 5H), 7.73 (d, J=7.44 Hz, 1H), 7.62–7.71 (m, 8H), 7.58 (s, 1H), 7.52 (d, J=7.53 Hz, 1H), 7.32–7.43 (m, 3H), 2.10–2.17 (m, 12H), 0.49–0.95 (m, 50H), 0.33 (s, 9H).

2-Iodo-9,9-bis(2-methylbutyl)-9',9',9'',9''-tetrakis(n-propyl) -7,2';7',2''-terfluorene (14a). ICl (1.0 M in methylene chloride, 2.80 ml, 2.80 mmol) is added dropwise to a solution of 2-trimethylsilyl-9,9-bis(2-methylbutyl)-9',9',9'', 9''-tetrakis(n-propyl)-7,2';7',2''-terfluorene (13a) (2.45 g, 2.80 mmol) in CCl$_4$ (15 ml) at 0° C. After stirring for 30 min, the reaction mixture is poured into a Na$_2$CO$_3$ aqueous solution (5 wt %) with vigorous stirring until discoloration for extraction with methylene chloride. The organic extracts are washed with brine before dried over MgSO$_4$. Upon evaporating off the solvent, the residue is washed with ethanol to yield 2-iodo-9,9-bis(2-methylbutyl)-9',9',9'',9''-tetrakis(n-propyl)-7,2';7',2''-terfluorene (14a) (2.36 g, 91%) as a light yellow solid.

$^1$H NMR spectral analysis (400 MHz, CDCl$_3$) of the obtained compound provides the following data: δ (ppm) 7.73–7.85 (m, 6H), 7.62–7.72 (m, 9H), 7.50–7.54 (m, 1H), 7.32–7.43 (m, 3H), 1.81–2.25 (m, 12H), 0.60–1.00 (m, 32H), 0.31–0.38 (m, 6H).

2-Iodo-9,9-bis(2-ethylhexyl)-9',9',9'',9''-tetrakis(n-propyl)7,2';7',2''-terfluorene (14b). The procedure for the synthesis of 2-iodo-9,9-bis(2-methylbutyl)-9',9',9'',9''-tetrakis(n-propyl)-7,2';7',2''-terfluorene (14a) is followed to prepare 2-Iodo-9,9-bis(2-ethylhexyl)-9',9',9'',9''-tetrakis(n-propyl)-7,2';7',2''-terfluorene (14b) as a white solid in a 80% yield.

$^1$H NMR spectral analysis (400 MHz, CDCl$_3$) of the obtained compound provides the following data: δ (ppm) 7.75–7.85 (m, 6H), 7.60–7.72 (m, 9H), 7.51 (d, J=7.97 Hz, 1H), 7.32–7.42 (m, 3H), 1.96–2.21 (m, 12H), 0.55–0.98 (m, 50H).

2,7''-Di(trimethylsilyl)-9,9,9''',9'''-tetrakis(2-ethylhexyl)-9',9'-bis(2-methylbutyl)-7,2';7',2''-terfluorene (15a). The procedure for the synthesis of 7-bromo 9,9,9',9'-tetrakis(2S-methylbutyl)-2,2'-bifluorene (4a) is followed to prepare 2,7''-di(trimethylsilyl)-9,9,9''',9'''-tetrakis(2-ethylhexyl)-9',9'-bis(2-methylbutyl)-7,2';7',2''-terfluorene (15a) as a viscous liquid in a 62% yield.

$^1$H NMR spectral analysis (400 MHz, CDCl$_3$) of the obtained compound provides the following data: δ (ppm) 7.78–7.84 (m, 4H), 7.72 (d, J=7.42 Hz, 2H), 7.60–7.69 (m, 8H), 7.57 (s, 2H), 7.51 (d, J=7.49 Hz, 2H), 2.19–2.25 (m, 2H), 1.95–2.12 (m, 10H), 0.50–1.02 (m, 72H), 0.32–0.35 (m, 24H).

2,7''-Diiodo-9,9,9''',9'''-tetrakis(2-ethylhexyl)-9',9'-bis(2-methylbutyl)-7,2';7',2''-terfluorene (15b). The procedure for the synthesis of 2-iodo-9,9-bis(2-methylbutyl)-9',9',9'',9''-tetrakis(n-propyl)-7,2';7',2''-terfluorene (14a) is followed to prepare 2,7''-diiodo-9,9,9''',9'''-tetrakis(2-ethylhexyl)-9',9'-bis(2-methylbutyl)-7,2';7',2''-terfluorene (15b) as a viscous liquid in a 89% yield.

$^1$H NMR spectral analysis (400 MHz, CDCl$_3$) of the obtained compound provides the following data: δ (ppm) 7.82 (d, J=8.33 Hz, 2H), 7.75–7.78 (m, 4H), 7.59–7.71 (m, 10H), 7.50 (d, J=8.03 Hz, 2H), 2.11–2.24 (m, 2H), 1.95–2.10 (m, 10H), 0.50–1.02 (m, 72H), 0.30–0.39 (m, 6H).

4, 7-Bis(2-trimethylsilyl-9,9-bis(2-ethylhexyl)-fluoren-7-yl)-2,1,3-benzothiadiazole (16a). The procedure for the synthesis of 7-bromo-9,9,9',9'-tetrakis(2S-methylbutyl)-2,2'-bifluorene (4a) is followed to prepare 4,7-di(2-trimethylsilyl-9,9-bis(2-ethylhexyl)-fluoren-7-yl)-2,1,3-benzothiadiazole (16a) as a yellow solid in a 68% yield.

$^1$H NMR spectral analysis (400 MHz, CDCl$_3$) of the obtained compound provides the following data: δ (ppm) 7.99–8.06 (m, 4H), 7.89 (d, J=7.88 Hz, 2H), 7.85 (d, J=0.88 Hz, 2H), 7.76 (d, J=7.43 Hz, 2H), 7.59 (s, 2H), 7.53 (d, J=7.50 Hz, 2H), 2.02–2.18 (m, 8H), 0.69–0.99 (m, 36H), 0.51–0.63 (m, 24H), 0.33 (s, 18H).

4, 7-Bis(2-iodo-9,9-bis(2-ethylhexyl)-fluoren-7-yl)-2,1, 3-benzothiadiazole (16b). The procedure for the synthesis of 2-iodo-9,9-bis(2-methylbutyl)-9',9',9'',9''-tetrakis(n-propyl)-7,2';7',2''-terfluorene (14a) is followed to prepare 4,7-di(2-iodo-9,9-bis(2-ethylhexyl)-fluoren-7-yl)-2,1,3-benzothiadiazole (16b) as a yellow solid in a 88% yield.

$^1$H NMR spectral analysis (400 MHz, CDCl$_3$) of the obtained compound provides the following data: δ (ppm) 7.99–8.06 (m, 4H), 7.86 (d, J=7.20 Hz, 2H), 7.85 (s, 2H), 7.77–7.82 (m, 2H), 7.71 (dd, J=7.97 Hz, 1.39 Hz, 2H), 7.54 (d, J=7.97 Hz, 2H), 1.99–2.18 (m, 8H), 0.69–0.99 (m, 36H), 0.51–0.64 (m, 24H).

2,7''-Di(trimethylsilyl)-9,9,9''',9'''-tetrakis(3S,7-dimethyloctyl)-9',9'-bis(2S-methylbutyl)-7,2';7',2''-terfluorene (17a). The procedure for the synthesis of 7-bromo-9,9,9',9'-tetrakis(2S-methylbutyl)-2,2'-bifluorene (4a) is followed to prepare 2,7''-di(trimethylsilyl)-9,9,9''',9'''-tetrakis(3S,7-dimethyloctyl)-9',9'-bis(2S-methylbutyl)-7,2';7',2''-terfluorene (17a) as a viscous liquid in a 91% yield.

$^1$H NMR spectral analysis (400 MHz, CDCl$_3$) of the obtained compound provides the following data: δ (ppm) 7.83 (d, J=7.93 Hz, 2H), 7.81 (d, J=7.78 Hz, 2H), 7.74 (d, J=7.45 Hz, 2H), 7.62–7.68 (m, 8H), 7.53 (d, J=7.50 Hz, 2H), 7.51 (s, 2H), 2.2–2.3 (m, 2H), 1.9–2.1 (m, 10H), 1.42–1.46 (m, 4H), 0.5–1.2 (m, 84H), 0.3–0.4 (m, 24H).

2,7''-Diiodo-9,9,9''',9'''-tetrakis(3S,7-dimethyloctyl)-9',9'-bis(2S-methylbutyl)-7,2';7',2''-terfluorene (17b). The procedure for the synthesis of 2-iodo-9,9-bis(2-methylbutyl)-9', 9'',9'''-tetrakis(n-propyl)-7,2';7',2''-terfluorene (14a) is followed to prepare 2,7''-diiodo-9,9,9''',9'''-tetrakis(3S,7- dimethyloctyl)-9',9'-bis(2S-methylbutyl-7,2';7',2''-terfluorene (17b) as a viscous liquid in a 83% yield.

$^1$H NMR spectral analysis (400 MHz, CDCl$_3$) of the obtained compound provides the following data: δ (ppm) 7.83 (d, J=8.46 Hz, 2H), 7.77 (d, J=7.86 Hz, 2H), 7.63–7.74 (m, 10H), 7.59 (s, 2H), 7.51 (d, J=8.20 Hz, 2H), 2.2–2.3 (m, 2H), 1.9–2.1 (m, 10H), 1.42–1.46 (m, 4H), 0.5–1.2 (m, 84H), 0.3–0.4 (m, 6H).

7-Bromo-7'-trimethylsilyl-9,9,9',9'-tetrakis(2S-methylbutyl)-2,2'-bifluorene (18). The procedure for the synthesis of 7-bromo-9,9,9',9'-tetrakis(2S-methylbutyl)-2,2'-bifluorene (4a) is followed to prepare 7-bromo-7'-trimethylsilyl-9,9,9',9'-tetrakis(2S-methylbutyl)-2,2'-bifluorene (18) as a white solid in a 69% yield.

$^1$H NMR spectral analysis (400 MHz, CDCl$_3$) of the obtained compound provides the following data: δ (ppm) 7.71–7.82 (m, 3H), 7.60–7.69 (m, 5H), 7.47–7.57 (m, 16H), 0.28–0.35 (m21H). 4H), 2.19–2.25 (m, 4H), 1.89–1.96 (m, 4H), 0.86–0.97 (m, 8H), 0.59–0.68

2-[7'-Trimethylsilyl-9,9,9',9'-tetrakis(2S-methylbutyl)-2,2'-bifluoren-7-yl]-4,4,5,5-tetramethyl-[1,3,2]dioxaborolane (19). The procedure for the synthesis of 2-[9,9,9',9',9'',9''-hexakis(2S-methylbutyl)-7,2';7',2''-terfluoren-2-yl]-4,4,5,5-tetramethyl-[1,3,2]dioxaborolane (7a) is followed to prepare 2-[7'-trimethylsilyl-9,9,9',9' -tetrakis(2S-methylbutyl)-2,2'-bifluoren-7-yl]-4,4,5,5-tetramethyl-[1,3,2]dioxaborolane (19) as a white solid in a 45% yield.

$^1$H NMR spectral analysis (400 MHz, CDCl$_3$) of the obtained compound provides the following data: δ (ppm) 7.72–7.86 (m, 6H), 7.61–7.65 (m, 4H), 7.51–7.56 (m, 2H), 2.18–2.24 (m, 4H), 1.91–1.95 (m, 4H), 1.41 (s, 12H), 0.85–0.97 (m, 8H), 0.58–0.67 (m, 16H), 0.28–0.34 (m, 21H).

7-Bromo-7'-iodo-9,9,9',9'-tetrakis(2S-methylbutyl)-2,2'-bifluorene (20). The procedure for the synthesis of 2-iodo-9,9-bis(2-methylbutyl)-9',9',9'',9''-tetrakis(n-propyl)-7,2';7'; 2''-terflourene (14a) is followed to prepare 7-Bromo-7'-iodo-9,9,9',9'-tetrakis(2S-methylbutyl)-2,2'-bifluorene (20) as a light yellow solid in a 88% yield.

$^1$H NMR spectral analysis (400 MHz, CDCl$_3$) of the obtained compound provides the following data: δ (ppm) 7.75–7.78 (m, 3H), 7.70 (dd, J=7.92 Hz, 1.50 Hz, 1H), 7.60–7.63 (m, 5H), 7.48–7.55 (m, 3H), 2.10–2.24 (m, 4H), 1.86–1.96 (m, 4H), 0.84–1.00 (m, 8H), 0.62–0.72 (m, 16H), 0.30–0.35 (m, 12H).

2-Bromo-7'''-trimethylsilyl-9,9,9',9',9'',9'',9''',9'''-octakis (2S-methylbutyl)-7,2';7',2'';7'',2'''-tetrafluorene (21a). The procedure for the synthesis of 7-bromo-9,9,9',9'-tetrakis(2S-methylbutyl)-2,2'-bifluorene (4a) is followed to prepare 2-bromo-7'''-trimethylsilyl-9,9,9',9',9'',9'',9''',9'''-octakis(2S-methylbutyl) -7,2';7',2'';7'',2'''-tetrafluorene (21a) as a white solid in a 42% yield.

$^1$H NMR spectral analysis (400 MHz, CDCl$_3$) of the obtained compound provides the following data: δ (ppm) 7.80–7.86 (m, 5H), 7.78 (d, J=7.76 Hz, 1H), 7.74 (d, J=7.46 Hz, 1H), 7.60–7.69 (m, 13H), 7.48–7.57 (m, 4H), 2.21–2.30 (m, 8H), 1.89–2.01 (m, 8H), 0.61–1.02 (48H), 0.28–0.39 (m, 33H).

2-Bromo-7'''-iodo-9,9,9',9',9'',9'',9''',9'''-octakis(2S-methylbutyl)-7,2';7',2'';7'',2'''-tetrafluorene (21b). The procedure for the synthesis of 2-iodo-9,9-bis(2-methylbutyl)-9',9',9'',9''-tetrakis(n-propyl)-7,2';7',2''-terfluorene (14a) is followed to prepare 2-bromo-7'''-iodo-9,9,9',9',9'',9'',9''',9'''-octakis(2S-methylbutyl)-7,2';7',2'';7'',2'''-tetrafluorene (21b) as a light yellow powder in a 94% yield.

$^1$H NMR spectral analysis (400 MHz, CDCl$_3$) of the obtained compound provides the following data: δ (ppm) 7.84 (d, J=6.79 Hz, 4H), 7.78 (d, J=7.72 Hz, 2H), 7.76 (d, J=1.33 Hz, 1H), 7.61–7.72 (m, 14H), 7.55 (d, J=1.67 Hz, 1H), 7.51 (d, J=7.94 Hz, 1H), 7.50 (dd, J=7.97 Hz, 1.68 Hz, 1H), 2.25–2.30 (m, 8H), 1.95–2.0 (m, 8H), 0.63–1.02 (m, 48H), 0.36–0.39 (m, 12H), 0.31–0.35 (m, 12H).

2-Trimethylsilyl-9,9,9',9',9'',9'',9''',9'''-octakis(2S-methylbutyl)-7,2';7',2'';7'',2'''-tetrafluorene (22a). The procedure for the synthesis of 7-bromo-9,9,9',9'-tetrakis(2S-methylbutyl)-2,2'-bifluorene (4a) is followed to prepare 2-trimethylsilyl-9,9,9',9',9'',9'',9''',9'''-octakis(2S-methylbutyl)-7,2';7',2'';7'',2'''-tetrafluorene (22a) as a white solid in a 75% yield.

$^1$H NMR spectral analysis (400 MHz, CDCl$_3$) of the obtained compound provides the following data: δ (ppm) 7.74–7.87 (m, 8H), 7.65–7.71 (m, 12H), 7.62 (s, 1H), 7.54 (d, J=7.46 Hz, 1H), 7.30–7.45 (m, 3H), 2.22–2.32(m, 8H), 1.92–2.03 (m, 8H), 0.92–1.04 (m, 16H), 0.63–0.72 (m, 32H), 0.31–0.42 (m, 33H).

2-Iodo-9,9,9',9',9'',9'',9''',9'''-octo(2S-2-methylbutyl)-7,2';7',2'';7'',2'''-tetrafluorene (22b). The procedure for the synthesis of 2-iodo-9,9-bis(2-methylbutyl)-9',9',9'',9''-tetrakis(n-propyl)-7,2';7',2''-terfluorene (14a) is followed to prepare 2-Iodo-9,9,9',9',9'',9'',9''',9'''-octo(2S-2-methylbutyl)-7,2';7',2'';7'',2'''-tetrafluorene (22b) as a light yellow powder in a 83% yield.

$^1$H NMR spectral analysis (400 MHz, CDCl$_3$) of the obtained compound provides the following data: δ (ppm) 7.75–7.86 (m, 8H), 7.60–7.72 (m, 13H), 7.52 (d, J=7.96 Hz, 1H), 7.29–7.44 (m, 3H), 2.16–2.32 (m, 8H), 1.88–2.02 (m, 8H), 0.89–1.02 (m, 16H), 0.62–0.70 (m, 32H), 0.29–0.40 (m, 24H).

2-Bromo-9,9,9',9',9'',9'',9''',9'''-octakis(2S-methylbutyl)-7,2';7',2'';7'',2'''-tetrafluorene (23a). The procedure for the synthesis of 7-bromo-9,9,9',9'-tetrakis(2S-methylbutyl)-2,2'-bifluorene (4a) is followed to prepare 2-bromo-9,9,9',9',9'',9'',9''',9'''-octakis(2S-methylbutyl)-7,2';7',2'';7'',2'''-tetrafluorene (23a) as a white solid in a 56% yield.

$^1$H NMR spectral analysis (400 MHz, CDCl$_3$) of the obtained compound provides the following data: δ (ppm) 7.75–7.86 (m, 8H), 7.60–7.69 (m, 13H), 7.55 (d, J=1.39 Hz, 1H), 7.29–7.44 (m, 3H), 2.16–2.31 (m, 8H), 1.88–2.02 (m, 8H), 0.89–1.02 (m, 16H), 0.62–0.70 (m, 32H), 0.29–0.40 (m, 24H).

2-[9,9,9',9',9'',9'',9''',9'''-Octakis(2S-methylbutyl)-7,2';7',2'';7'',2'''-tetrafluoren-2-yl]-4,4,5,5-tetramethyl-[1,3,2]dioxaborolane (23b). The procedure for the synthesis of 2-[9,9,9',9',9'',9''-hexakis(2S-methylbutyl)-7,2';7',2''-terfluoren-2-yl]-4,4,5,5-tetramethyl-[1,3,2]dioxaborolane (7a) is followed to prepare 2-[9,9,9',9',9'',9'',9''',9'''-octakis(2S-methylbutyl)-7,2';7',2'';7'',2'''-tetrafluoren-2-yl]-4,4,5,5-tetramethyl-[1,3,2]dioxaborolane (23b) as a white powder in a 55% yield.

$^1$H NMR spectral analysis (400 MHz, CDCl$_3$) of the obtained compound provides the following data: δ (ppm) 7.70–7.9(m, 10H), 7.56–7.70 (m, 12H), 7.26–7.41 (m, 3H), 2.1–2.3 (m, 8H), 1.8–2.0 (m, 8H), 1.37 (s, 12H), 0.5–1.1 (m, 48H), 0.2–0.4 (m, 24H).

2-Bromo-octa[9,9-bis(2S-methylbutyl)fluorene] (24). The procedure for the synthesis of 7-bromo-9,9,9',9'-tetrakis(2S-methylbutyl)-2,2'-bifluorene (4a) is followed to prepare 2-bromo-octa[9,9-bis(2S-methylbutyl)fluorene] (24) as a white solid in a 52% yield.

$^1$H NMR spectral analysis (400 MHz, CDCl$_3$) of the obtained compound provides the following data: δ (ppm) 7.75–7.87 (m, 15H), 7.61–7.7 (m, 29H), 7.55 (d, J=1.53 Hz, 1H), 7.50 (dd, J=7.98 Hz, 1.74 Hz, 1H), 7.31–7.44 (m, 3H), 2.22–2.38 (m, 16H), 1.94–2.01 (m, 16H), 0.62–1.04 (m, 96H), 0.29–0.34 (m, 12H), 0.37–0.41 (m, 36H).

2,7-Bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)). A toluene (3 ml) and 2.0 M Na$_2$CO$_3$ aqueous solution (1.8 ml, 3.6 mmol) are added to a mixture of 2,2'-[9,9-bis(3S,7-dimethyloctyl)fluoren-2,7-diyl)]-bis[4,4,5,5-tetramethyl-[1,3,2]dioxaborolane] (11a) (0.247 g, 0.354 mmol), 2-iodo-9,9,9',9',9'',9'',9''',9'''-octo(2S-2-methylbutyl)-7,2';7',2'';7'',2'''-tetrafluorene (22b) (1.00 g, 0.743 mmol) and Pd(PPh3)4 (20 mg, 1.7×10$^{-2}$ mmol) in a 25 ml flask. The resultant mixture is stirred at 90° C. for 2 days. While cooled to room temperature, the mixture is poured into water and extracted with methylene chloride. The organic extracts are washed with brine and dried over MgSO$_4$. After the solvent is removed, the residue is purified by column chromatography on silica gel with petroleum ether:chloroform (5:1) to give 2,7-bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)) (0.403 g, 40%) as a white powder.

$^1$H NMR spectral analysis (400 MHz, CDCl$_3$) of the obtained compound provides the following data: δ (ppm) 7.83–7.88 (m, 14H), 7.82 (d, J=8.50 Hz, 2H), 7.78 (d, J=7.30 Hz, 2H), 7.64–7.71 (m, 32H), 7.29–7.43 (m, 6H), 1.90–2.33 (m, 36H), 1.40–1.52 (m, 2H), 0.60–1.30 (m, 132H), 0.35–0.44 (m, 36H), 0.30–0.35 (two d, 12H).

Elemental analysis of the compound (C$_{217}$H$_{274}$) is calculated to be C, 90.42%; H, 9.58%; and found to be C, 90.53%; H, 9.36%. The calculated molecular weight of the obtained compound is 2882.5. The molecular weight, as determined by MALDI-TOF-MS (dithranol): m/z ([M]$^+$) is 2881.9.

2,7-bis[9,9-bis (3S,7-dimethyloctyl)-9',9',9'',9'',9''',9'''-hexakis(2S-methylbutyl)-7,2';7',2'';7'',2'''-tetrafluoren-2-yl]-9,9-bis(2S-methylbutyl)fluorene (F(5S)7F(10S)2). The procedure for the synthesis of 2,7-bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)) is followed to prepare 2,7-bis[9,9-bis (3S,7-dimethyloctyl)-9',9',9'',9'',9''',9'''-hexakis(2S-methylbutyl)-7,2';7',2'';7'',2'''-tetrafluoren-2-yl]-9,9-bis(2S-methylbutyl)fluorene (F(5S)7F(10S)2) as a white solid in a 30% yield.

$^1$H NMR spectral analysis (400 MHz, CDCl$_3$) of the obtained compound provides the following data: δ (ppm) 7.84–7.88 (m, 14H), 7.82 (d, J=8.47 Hz, 2H), 7.77 (d, J=7.32 Hz, 2H), 7.64–7.72 (m, 32H), 7.29–7.44 (m, 6H), 1.97–2.33 (m, 36H), 1.42–1.47 (m, 4H), 0.63–1.3 (m, 156H), 0.38–0.42 (m, 30H), 0.30–0.34 (m, 12H).

Elemental analysis of the obtained compound (C$_{227}$H$_{294}$) is calculated to be C, 90.20%; H, 9.80%; and found to be C, 89.90%; H, 9.61%.

Hexadeca[9,9-bis(2S-methylbutyl)fluorene] (F(5S)-16). A mixture of Ni(COD) (0.100 g, 0.364 mmol), 2,2'-bipyridine (0.057 g, 0.364 mmol), 1,5-cyclooctadiene (0.040 g, 0.364 mmol) in dried DMF (2.0 ml) and toluene (2.0 ml) is stirred at 80° C. for 30 minutes. 2-bromo-octa[9,9-bis(2S-methylbutyl)fluorene] (24) (0.302 g, 0.120 mmol) in toluene (6.0 ml) is added in one portion. The reaction mixture is stirred at 80° C. for 5 days. While the mixture is cooled to room temperature, chloroform (100 ml) and 2.0 M HCl (100 ml) are added. The mixture is thoroughly stirred until the organic phase is clear. The organic layer is separated and washed with brine for drying over MgSO$_4$. Upon evaporating off the solvent, the residue is recrystallized with toluene. The solid is collected by filtration to yield hexadeca[9,9-bis(2S-methylbutyl)fluorene] (F(5S)-16) (0.177 g, 61%) as a white powder.

$^1$H NMR spectral analysis (400 MHz, CDCl$_3$) of the obtained compound provides the following data: δ (ppm) 7.83–7.88 (broad, 28H), 7.81 (d, J=8.51 Hz, 2H), 7.77 (d, J=7.31 Hz, 2H), 7.63–7.71 (m, 60H), 7.29–7.44 (m, 6H), 2.17–2.32 (m, 32H), 1.90–2.03 (m, 32H), 0.92–1.06 (m, 64H), 0.80 (broad, 32H), 0.63–0.72 (m, 96H), 0.37–0.42 (m, 84H), 0.29–0.34 (m, 12H).

Elemental analysis of the compound (C$_{368}$H$_{450}$) is calculated to be C, 90.69%; H, 9.31%; and found to be C, 90.54%; H, 9.33%.

Penta[9,9-bis(2-methylbutyl)fluorene] (F(MB)5). The procedure for the synthesis of 2,7-bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)) is followed to prepare penta[9,9-bis(2-methylbutyl)fluorene] (F(MB)5) as a white solid in a 76% yield.

$^1$H NMR spectral analysis (400 MHz, CDCl$_3$) of the obtained compound provides the following data: δ (ppm) 7.82–7.87 (m, 6H), 7.82 (d, J=8.10 Hz, 2H), 7.77 (d, J=7.35 Hz, 2H), 7.62–7.74 (m, 16H), 7.30–7.48 (m, 6H), 2.17–2.31 (m, 10H), 1.90–2.01 (m, 10H), 0.55–1.10 (m, 60H), 0.32–0.43 (m, 30H).

Elemental analysis of the compound (C$_{115}$H$_{142}$) is calculated to be C, 90.31%; H, 9.39%; and found to be C, 90.56%; H, 9.31%. The calculated molecular weight of the obtained compound is 1524.4. The molecular weight, as determined by MALDI-TOF-MS (dithranol): m/z ([M]$^+$) is 1524.1.

2,7-Bis[9,9-bis(2-methylbutyl)-9',9',9'',9''-tetrakis(n-propyl)-7,2';7',2''-terfluoren-2-yl]-9,9-bispropyl fluorene (F(Pr)5F(MB)2). The procedure for the synthesis of 2,7-bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)) is followed to prepare 2,7-bis[9,9-bis(2-methylbutyl)-9',9',9'',9''-tetrakis(n-propyl)-7,2';7',2''-terfluoren-2-yl]-9,9-bispropyl fluorene (F(Pr)5F(MB)2) as a light yellow solid in a 56% yield.

$^1$H NMR spectral analysis (400 MHz, CDCl$_3$) of the obtained compound provides the following data: δ (ppm) 7.78–7.89 (m, 13H), 7.66–7.77 (m, 25H), 7.32–7.44 (m, 6H), 2.28–2.35 (m, 4H), 2.00–2.15 (m, 24H), 1.00–1.07 (m, 4H), 0.63–0.99 (m, 70H), 0.39–0.45 (m, 12H).

Elemental analysis of the compound (C$_{141}$H$_{158}$) is calculated to be C, 91.40%; H, 8.60%; and found to be C, 91.47%; H, 8.51%. The calculated molecular weight of the obtained compound is 1852.8. The molecular weight, as determined by MALDI-TOF-MS (dithranol): m/z ([M]$^+$) is 1852.3.

2,7-Bis[9,9-bis(2-ethylhexyl)-9',9',9'',9''-tetrakis(n-propyl)-7,2';7',2''-terfluoren-2-yl]-9,9-bispropyl fluorene (F(Pr)5F(EH)2). The procedure for the synthesis of 2,7-bis[9,9,9',9',9'',9'',9''',9'''-octakis(2S-methylbutyl)-7,2';7',2'';7'',2'''-tetrafluoren-2-yl]-9,9-bis(3S,7-dimethyloctyl)fluorene (F(5S)8F(10S)) is followed to prepare 2,7-bis[9,9-bis(2-ethylhexyl)-9',9',9'',9''-tetrakis(n-propyl)-7,2';7',2''-terfluoren-2-yl]-9,9-bispropyl fluorene (F(Pr)5F(EH)2) as a white solid in a 33% yield.

$^1$H NMR spectral analysis (400 MHz, CDCl$_3$) of the obtained compound provides the following data: δ (ppm) 7.83–7.88 (m, 10H), 7.82 (d, J=7.86 Hz, 2H), 7.77 (dd, J=7.60 Hz, 0.96 Hz, 2H), 7.64–7.73 (m, 24H), 7.33–7.43 (m, 6H), 2.01–2.19 (m, 28H), 0.61–0.99 (m, 110H).

Elemental analysis of the compound (C$_{153}$H$_{182}$) is calculated to be C, 90.92%; H, 9.08%; and found to be C, 90.64%; H, 9.16%. The calculated molecular weight of the obtained compound is 2021.1. The molecular weight, as determined by MALDI-TOF-MS (dithranol): m/z ([M]$^+$) is 2020.5.

2,7-Bis[9,9 bis(2-ethylhexyl)-9',9',9'',9'',9''',9'''-hexakis(2-methylbutyl)-7,2';7',2'';7'',2'''-tetrafluoren-2-yl]-9,9-bis(2-methylbutyl)fluorene (F(MB)7F(EH)2). The procedure for the synthesis of 2,7-bis[9,9,9',9',9'',9'',9''',9'''-octakis(2S- methylbutyl)-7,2';7',2";7",2'''-tetrafluoren-2-yl]-9,9-bis(3S,7-dimethyloctyl)fluorene (F(5S)8F(10S)) is followed to prepare 2,7-bis[9,9-bis(2-ethylhexyl)-9',9',9",9",9''',9'''-hexakis(2-methylbutyl)-7,2';7',2";7",2'''-tetrafluoren-2-yl]-9,9-bis(2-methylbutyl)fluorene (F(MB)7F(EH)2) as a white solid in a 28% yield.

$^1$H NMR spectral analysis (400 MHz, CDCl$_3$) of the obtained compound provides the following data: δ (ppm) 7.83–7.87 (m, 14H), 7.82 (d, J=8.28 Hz, 2H), 7.77 (d, J=7.41 Hz, 2H), 7.61–7.73 (m, 32H), 7.29–7.48 (m, 6H), 1.88–2.38 (m, 36H), 0.58–1.18 (m, 144H), 0.26–0.46 (m, 42H).

Elemental analysis of the compound (C$_{219}$H$_{278}$) is calculated to be C, 90.37%; H, 9.63%; and found to be C, 90.37%; H, 9.49%. The calculated molecular weight of the obtained compound is 2910.6. The molecular weight, as determined by MALDI-TOF-MS (dithranol): m/z ([M]$^+$) 2910.1.

4,7-Bis[9,9-bis(2-ethylhexyl)-9',9',9",9",9''',9'''-hexakis(2-methylbutyl)-7,2';7',2";7",2'''-tetrafluoren-2-yl]-2,1,3-benzothiadiazole (F(MB)6F(EH)2BT). The procedure for the synthesis of 2,7-bis[9,9,9',9',9",9",9''',9'''-octakis(2S-methylbutyl)-7,2';7',2";7",2'''-tetrafluoren-2-yl]-9,9-bis(3S,7-dimethyloctyl)fluorene (F(5S)8F(10S)) is followed to prepare 4,7-bis[9,9-bis(2-ethylhexyl)-9',9',9",9",9''',9'''-hexakis(2-methylbutyl)-7,2';7',2";7",2'''-tetrafluoren-2-yl]-2,1,3-benzothiadiazole (F(MB)6F(EH)2BT) as a orange solid in a 39% yield.

$^1$H NMR spectral analysis (400 MHz, CDCl$_3$) of the obtained compound provides the following data: δ (ppm) 8.05–8.13 (m, 4H), 7.95 (d, J=7.89 Hz, 2H), 7.90 (s, 2H), 7.83–7.89 (m, 101H), 7.82 (d, J=8.07 Hz, 2H), 7.77 (d, J=7.32 Hz, 2H), 7.62–7.75 (m, 24H), 7.29–7.49 (m, 6H), 2.12–2.32 (m, 20H), 1.90–2.02 (m, 12H), 0.52–1.02 (m, 132H), 0.30–0.48 (m, 36H).

Elemental analysis of the compound (C$_{202}$H$_{252}$N$_2$S) is calculated to be C, 88.54%; H, 9.27%; N, 1.02%; and found to be C, 88.54%; H, 8.88%; N, 1.01%.

The following description refers to the reaction scheme shown below.

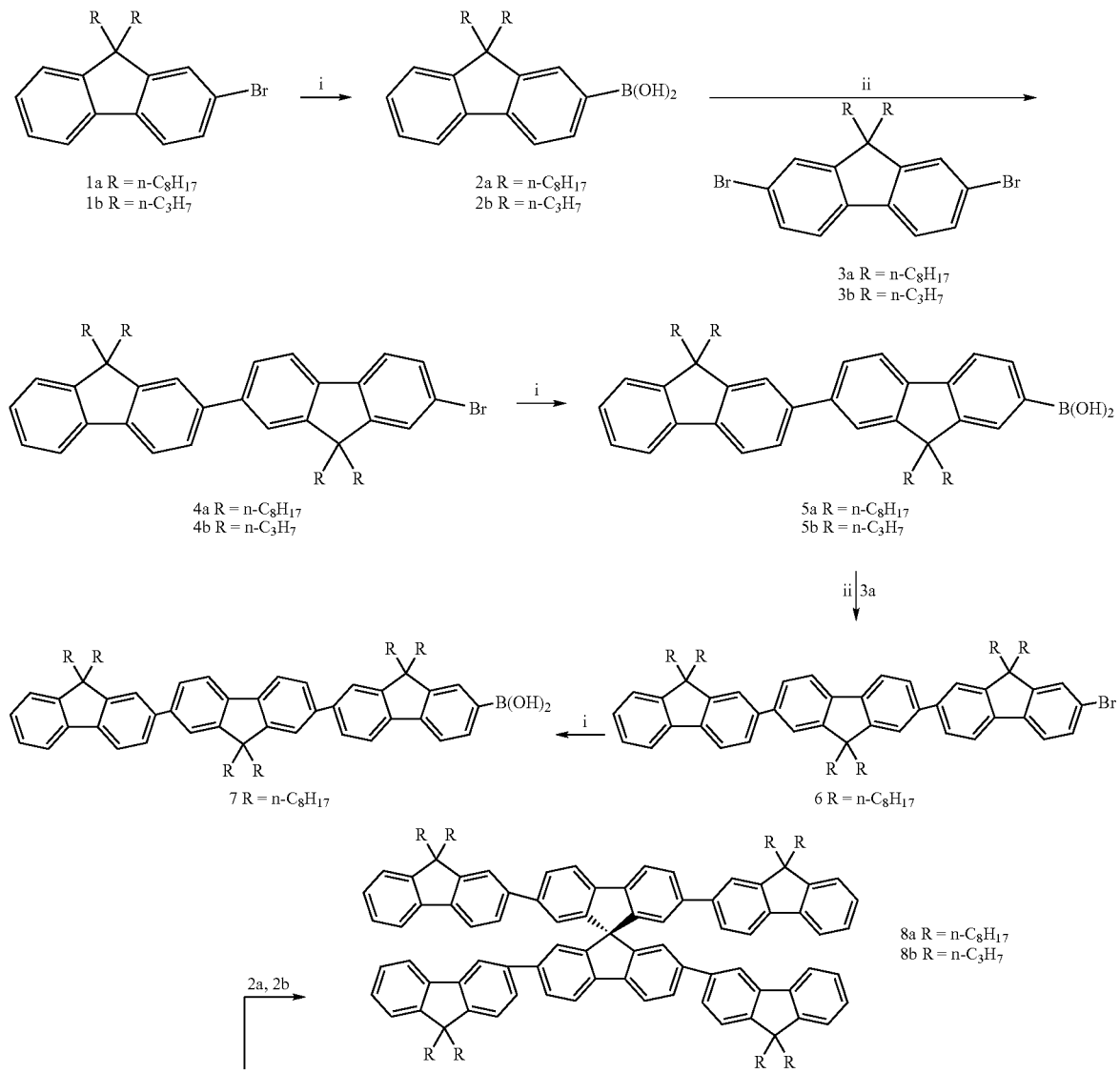

-continued

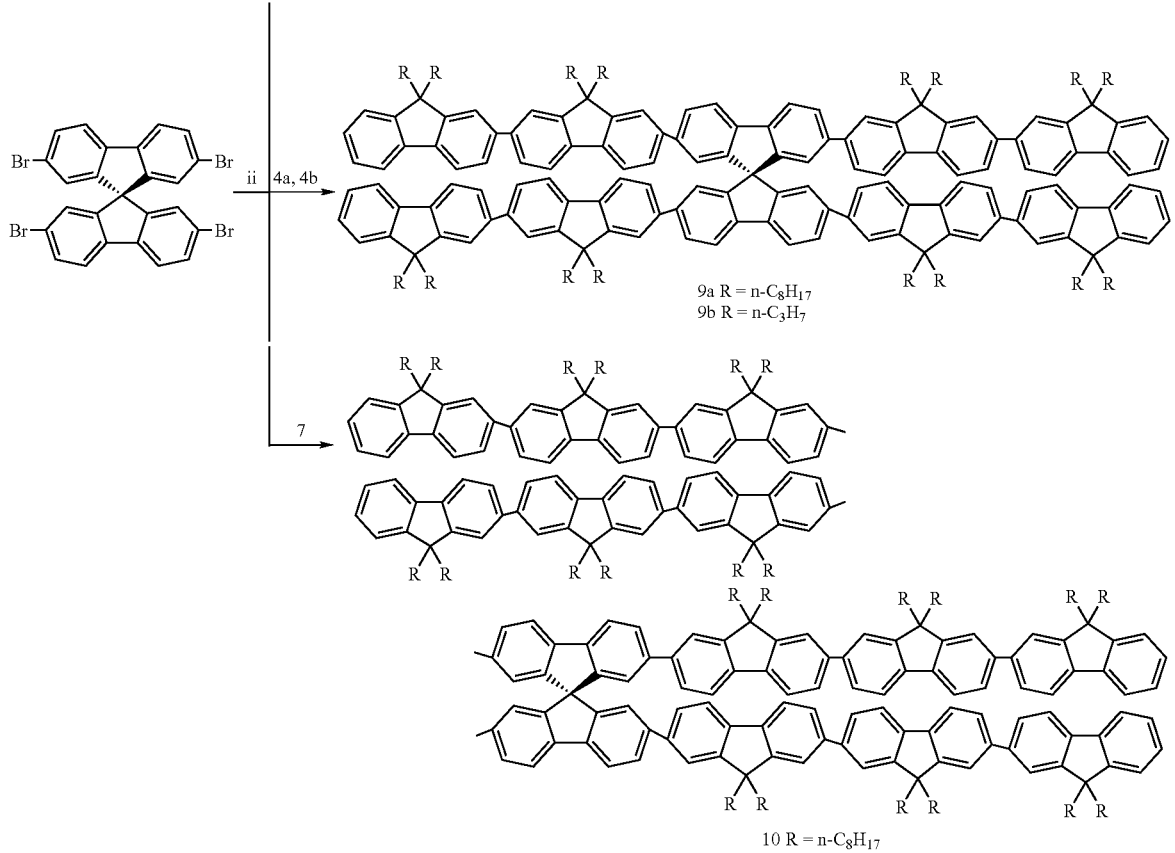

9a R = n-C$_8$H$_{17}$
9b R = n-C$_3$H$_7$

10 R = n-C$_8$H$_{17}$ $^a$1. (i) n-BuLi, -78° C. (ii) (i-PrO)$_3$B, -78° C. to RT, (iii) HCl (2 M): 2 Pd(PPh$_3$)$_4$, Na$_2$CO$_3$ (2.0 M aq.), toluene, 90° C.

9,9-Bis(n-octyl)fluoren-2-yl-boronic acid (2a). n-BuLi (2.5 M in hexane, 12.0 mL, 30.0 mmol) is slowly added to a solution of 2-bromo-9,9-bis(n-octyl)fluorene (12.0 g, 25.6 mmol) in anhydrous THF (50 mL) at −78° C. At this temperature, the reaction mixture is stirred for 1 h before adding tri-iso-propyl borate (9.0 mL, 7.34 g, 39.0 mmol). The resulting mixture is then warmed to room temperature, stirred overnight followed by quenching with 100 mL HCl (2.0 M), and poured into a large amount of water. After extraction with ethyl ether three times, the organic portions are washed with brine before drying over anhydrous MgSO$_4$. Solid residues collected by evaporating off the solvent are purified by column chromatography on silica gel with petroleum ether/ethyl acetate (2:1) to yield 9,9-bis(n-octyl)fluoren-2-yl-boronic acid (2a) as a white solid (10.0 g, 89%).

$^1$H NMR spectral analysis (400 MHz, CDCl$_3$) of the obtained compound provides the following data: δ (ppm) 7.70–8.35 (m, fluorenyl H, 4H), 7.34–7.44 (m, fluorenyl H, 3H), 1.90–2.15 (m, —CH$_2$C$_7$H$_{15}$, 4H), 1.00–1.30 (m, —CH$_2$CH$_2$(CH$_2$)$_5$CH$_3$, 20H), 0.83 (m, —CH$_3$, 6H), 0.71 (broad, —CH$_2$CH$_2$C$_6$H$_{13}$, 2H), 0.60 (broad, —CH$_2$CH$_2$C$_6$H$_{13}$, 2H).

9,9-Bis(n-propyl)fluoren-2-yl-boronic acid (2b). The procedure for obtaining 9,9-bis(n-octyl)fluoren-2-yl-boronic acid (2a) is followed to prepare 9,9-bis(n-propyl)fluoren-2-yl-boronic acid (2b) from 2-bromo-9,9-bis(n-propyl)fluorene (1b) (6.00 g, 18.2 mmol) as a white solid (4.10 g, 76%).

$^1$H NMR spectral analysis (400 MHz, CDCl$_3$) of the obtained compound provides the following data: δ (ppm) 7.83–8.35 (m, fluorenyl H, 4H), 7.34–7.47 (m, fluorenyl H, 3H), 1.90–2.20 (m, —CH$_2$C$_2$H$_5$, 4H), 0.60–0.90 (m, —CH$_2$C$_2$H$_5$, 10H).

7-Bromo-9,9,9',9'-tetra-n-octyl-2,2'-bifluorene (4a). A mixture of 9,9-bis(n-octyl)fluoren-2-yl-boronic acid (2a) (2.0 g, 4.60 mmol), 2,7-dibromo-9,9-bis(n-octyl)fluorene (3a) (4.0 g, 7.32 mmol), Pd(PPh$_3$)$_4$ (50 mg, 0.043 mmol), Na$_2$CO$_3$ (2.0 M aqueous solution, 12.0 mL, 24.0 mmol), and toluene (20 mL) is stirred at 90° C. for 2 days. After the mixture is cooled to room temperature, 200 mL of petroleum ether is added to the reaction mixture. The organic portion is separated and washed with brine before drying over anhydrous MgSO$_4$. The solvent is evaporated off, and the solid residues are purified by column chromatography on silica gel with petroleum ether to afford 7-bromo-9,9,9',9'-tetra-n-octyl-2,2'-bifluorene (4a) as a white solid (2.52 g, 66%).

$^1$H NMR spectral analysis (400 MHz, CDCl$_3$) of the obtained compound provides the following data: δ (ppm) 7.75 (d, J=7.84 Hz, fluorenyl H, 1H), 7.71 (d, J=7.72 Hz, fluorenyl H, 2H), 7.55–7.63 (m, fluorenyl H, 5H), 7.43–7.47 (m, fluorenyl H, 2H), 7.29–7.36 (m, fluorenyl H, 3H), 1.93–2.02 (m, —CH2C7H15, 8H), 1.00–1.30 (m, —CH$_2$CH$_2$(CH$_2$)$_5$CH$_3$, 40H), 0.76–0.81 (m, —CH$_3$, 12H), 0.67 broad, —CH$_2$CH$_2$C$_6$H—,8H).

7-Bromo-9,9,9',9'-tetra-n-propyl-2,2'-bifluorene (4b). The procedure for preparing 7-bromo-9,9,9',9'-tetra-n-octyl-2,2'- bifluorene (4a) is followed to prepare 7-bromo-9,9,9',9'-tetra-n-propyl-2,2'-bifluorene (4b) from 9,9-bis(n-propyl)fluoren-2-yl-boronic acid (2b) (2.23 g, 7.58 mmol) and 2,7-dibromo-9,9-bis(n-propyl)fluorene (3b) (10.0 g, 24.5 mmol), except petroleum ether/methylene chloride (95:5) is used for column chromatography. The procedure yields 7-bromo-9,9,9',9'-tetra-n-propyl-2,2'-bifluorene (4b) as a white solid (3.18 g, 72%).

$^1$H NMR spectral analysis (400 MHz, CDCl$_3$) of the obtained compound provides the following data: δ (ppm) 7.79 (d, J=7.82 Hz, fluorenyl H, 1H), 7.76 (d, J=7.84 Hz, fluorenyl H, 2H), 7.60–7.70 (m, fluorenyl H, 5H), 7.52 (d, J=1.45 Hz, fluorenyl H, 1H), 7.49 (d, J=7.99 Hz, 1.75 Hz, fluorenyl H, 1H), 7.33–7.42 (m, fluorenyl H, 3H), 1.90–2.10 (broad, —CH$_2$C$_2$H$_5$, 8H), 0.74 (broad, —CH$_2$C$_2$H$_5$, 20H).

9,9,9',9'-tetra-n-octyl-2,2'-bifluoren-7-yl-boronic acid (5a). The procedure for 9,9-bis(n-octyl)fluoren-2-yl-boronic acid (2a) is followed to prepare 9,9,9',9'-tetra-n-octyl-2,2'-bifluoren-7-yl-boronic acid (5a) from 7-bromo-9,9,9',9'-tetra-n-octyl-2,2'-bifluorene (4a) (3.10 g, 3.61 mmol) as a white solid (2.52 g, 85%).

$^1$H NMR spectral analysis (400 MHz, CDCl$_3$) of the obtained compound provides the following data: δ (ppm) 7.92–8.41 (m, fluorenyl H, 3H), 7.63–7.85 (m fluorenyl H, 7H), 7.33–7.41 (m, fluorenyl H, 3H), 2.00–2.30 (m, —CH$_2$C$_7$H$_{15}$, 8H), 1.00–1.30 (m, —CH$_2$CH$_2$(CH$_2$)$_5$CH$_3$, 40H), 0.60–0.87 (m, —CH$_2$CH$_2$C$_6$H$_{13}$ and —CH$_3$, 20H).

9,9,9',9'-tetra-n-propyl-2,2'-bifluoren-7-yl-boronic acid (5b). The procedure for 9,9-bis(n-octyl)fluoren-2-yl-boronic acid (2a) is followed to prepare 9,9,9',9'-tetra-n-propyl-2,2'-bifluoren-7-yl-boronic acid (5b) from 7-bromo-9,9,9',9'-tetra-n-propyl-2,2'-bifluorene (4b) (2.97 g, 5.14 mmol) as white solids (1.32 g, 47%).

$^1$H NMR spectral analysis (400 MHz, CDCl$_3$) of the obtained compound provides the following data: δ (ppm) 7.92–8.41 (m, fluorenyl H, 3H), 7.64–7.85 (m, fluorenyl H, 7H), 7.34–7.44 (m, fluorenyl H, 3H), 2.00–2.30 (m, —CH$_2$C$_2$H$_5$, 8H), 0.72–0.93 (m, —CH$_2$C$_2$H$_5$, 20H).

7-Bromo-9,9,9',9',9'',9''-hexa-n-octyl-2,7';2',7''-terfluorene (6). The procedure for preparing 7-bromo-9,9,9',9'-tetra-n-octyl-2,2'-bifluorene (4a) is followed to prepare 7-bromo-9,9,9',9',9'',9''-hexa-n-octyl-2,7';2',7''-terfluorene (6) from 9,9,9',9'-tetra-n-octyl-2,2'-bifluoren-7-yl-boronic acid (5a) (1.40 g, 1.70 mmol) and 2,7-dibromo-9,9-bis(n-octyl)fluorene (3a) (1.86 g, 3.4 mmol) as a white solid (1.25 g, 59%).

$^1$H NMR spectral analysis (400 MHz, CDCl$_3$) of the obtained compound provides the following data: δ (ppm) 7.76–7.85 (m, fluorenyl H, 5H), 7.61–7.71 (m, fluorenyl H, 9H), 7.49–7.52 (m, fluorenyl H, 2H), 7.32–7.41 (m, fluorenyl H, 3H), 2.00–2.15 (m, —CH$_2$C$_7$H$_{15}$, 8H), 1.00–1.34 (m, —CH$_2$CH$_2$(CH$_2$)$_5$CH$_3$, 60H), 0.80–0.93 (m, —CH$_3$, 18H), 0.73 (broad, —CH$_2$CH$_2$C$_6$H$_{13}$, 12H).

9,9,9',9',9'',9''-hexa-n-octyl-2,7';2',7''-terfluoren-7-yl-boronic acid (7). The procedure for 9,9-bis(n-octyl)fluoren-2-yl-boronic acid (2a) is followed to prepare 9,9,9',9',9'',9''-hexa-n-octyl-2,7';2',7''-terfluoren-7-yl-boronic acid (7) (0.891 g, 79%) from 7-bromo-9,9,9',9',9'',9''-hexa-n-octyl-2,7';2',7''-terfluorene (6) (1.16 g, 0.93 mol) as a white solid.

$^1$H NMR spectral analysis (400 MHz, CDCl$_3$) of the obtained compound provides the following data: δ (ppm) 7.85–8.42 (m, fluorenyl H, 2H), 7.7–7.83 (m, fluorenyl H, 14H), 7.36–7.4 (m, fluorenyl H, 3H), 2.00–2.24 (m, —CH$_2$C$_7$H$_{15}$, 8H), 1.00–1.30 (m, —CH$_2$CH$_2$(CH$_2$)$_5$CH$_3$, 60H), 0.79–0.86 (m, —CH$_3$, 18H), 0.75 (broad, —CH$_2$CH$_2$C$_6$H$_{13}$, 12H).

2,2',7,7'-Tetrakis(9,9-bis(n-octyl)fluoren-7-yl)-9,9'-spirobifluorene (8a). Toluene and a 2.0 M aqueous solution of Na$_2$CO$_3$ (60 equiv; toluene/water at a 6:4 ratio) are added to a Schlenk tube containing 2,2',7,7'-tetrabromo-9,9'-spirobifluorene (1 equiv), 9,9-bis(n-octyl)fluoren-2-yl-boronic acid (2a) (1.00 g, 2.30 mmol) (6 equiv), and Pd(PPh$_3$)$_4$ (5 mol %). The reaction mixture is stirred thoroughly at 90° C. for 2 days followed by the addition of a large amount of methylene chloride. The organic portion is washed with brine, dried over anhydrous MgSO$_4$, and concentrated by evaporating off the solvent. The resulting product is further purified by column chromatography on silica gel using petroleum ether/methylene chloride (8:1) as the eluent, resulting in a yield of 66% (0.49 g).

$^1$H NMR spectral analysis (400 MHz, CDCl$_3$) of the obtained compound provides the following data: δ (ppm) 8.05 (d, J) 7.96 Hz, spirobifluorenyl H, 4H), 7.78 (dd, J=7.97 Hz, 1.44 Hz, spirobifluorenyl H, 4H), 7.67 (dd, J=7.13 Hz, 1.31 Hz, fluorenyl H, 4H), 7.63 (d, J=7.92 Hz, fluorenyl H, 4H), 7.51 (d, J=1.05 Hz, fluorenyl H, 4H), 7.43 (dd, J=7.95 Hz, 1.39 Hz, fluorenyl H, 4H), 7.25–7.34 (m, fluorenyl H, 12H), 7.21 (d, J=1.03 Hz, spirobifluorenyl H, 4H), 1.96 (t, J=8.22 Hz, —CH$_2$C$_7$H$_{15}$, 16H), 1.00–1.30 (m, CH$_2$CH$_2$(CH$_2$)$_5$CH$_3$, 80H), 0.80 (t, J=7.11 Hz, —CH$_3$, 24H), 0.63 (broad, —CH$_2$CH$_2$C$_6$H$_{13}$, 16H).

Elemental analysis of the obtained compound (C$_{141}$H$_{176}$) is calculated to be C, 89.90%; H, 9.61%; and found to be C, 90.51%; H, 9.38%.

2,2',7,7'-Tetrakis(9,9-bis(n-propyl)fluoren-7-yl)-9,9'-spirobifluorene (8b). Toluene and a 2.0 M aqueous solution of Na$_2$CO$_3$ (60 equiv; toluene/water at a 6:4 ratio) are added to a Schlenk tube containing 2,2',7,7'-tetrabromo-9,9'-spirobifluorene (1 equiv), 9,9-bis(n-propyl)fluoren-2-yl-boronic acid (2b) (1.80 g, 6.12 mmol) (6 equiv), and Pd(PPh$_3$)$_4$ (5 mol %). The reaction mixture is stirred thoroughly at 90° C. for 2 days followed by the addition of a large amount of methylene chloride. The organic portion is washed with brine, dried over anhydrous MgSO$_4$, and concentrated by evaporating off the solvent. The resulting product is further purified by column chromatography on silica gel using petroleum ether/methylene chloride (4:1) as the eluent, resulting in a yield of 76% (1.00 g).

$^1$H NMR spectral analysis (400 MHz, CDCl$_3$) of the obtained compound provides the following data: δ (ppm) 8.06 (d, J=7.97 Hz, spirobifluorenyl H, 4H), 7.79 (dd, J=7.96 Hz, 1.46 Hz, spirobifluorenyl H, 4H), 7.67 (dd, J=5.80 Hz, 1.58 Hz, fluorenyl H, 4H), 7.63 (d, J=7.91 Hz, fluorenyl H, 4H), 7.52 (d, J=0.92 Hz, fluorenyl H, 4H), 7.44 (dd, J=7.94 Hz, 1.39 Hz, fluorenyl H, 4H), 7.26–7.35 (m, fluorenyl H, 12H), 7.21 (d, J=1.28 Hz, spirobifluorenyl H, 4H), 1.95 (t, J=7.76 Hz, —CH$_2$C$_2$H$_5$, 16H), 0.62 (m, —CH$_2$C$_2$H$_5$, 40H).

Elemental analysis of the obtained compound (C$_{101}$H$_{96}$) is calculated to be C, 92.61%; H, 7.39%; and found to be C, 92.28%; H, 7.50%.

2,2',7,7'-tetrakis(9,9,9',9'-tetra-n-octyl-2,2'-bifluoren-7-yl)-9,9'-spirobifluorene (9a). Toluene and a 2.0 M aqueous solution of Na$_2$CO$_3$ (60 equiv; toluene/water at a 6:4 ratio) are added to a Schlenk tube containing 2,2',7,7'-tetrabromo-9,9'-spirobifluorene (1 equiv), 9,9,9',9'-tetra-n-octyl-2,2'-bifluoren-7-yl-boronic acid (5a) (1.0 g, 1.21 mmol) (6 equiv), and Pd(PPh$_3$)$_4$ (5 mol %). The reaction mixture is stirred thoroughly at 90° C. for 2 days followed by the addition of a large amount of methylene chloride. The organic portion is washed with brine, dried over anhydrous MgSO$_4$, and concentrated by evaporating off the solvent. The resulting product is further purified by column chromatography on silica gel using petroleum ether/methylene chloride (7:1) as the eluent, resulting in a yield of 50% (0.32 g).

$^1$H NMR spectral analysis (400 MHz, CDCl$_3$) of the obtained compound provides the following data: δ (ppm) 8.09 (d, J=7.95 Hz, spirobifluorenyl H, 4H), 7.83 (dd, J=7.92 Hz, 1.02 Hz, spirobifluorenyl H, 4H), 7.74–7.80 (m, fluorenyl H, 12H), 7.69 (d, J=7.93 Hz, fluorenyl H, 4H), 7.56–7.65 (m, fluorenyl H, 20H), 7.49 (d, J=7.93 Hz, fluorenyl H, 4H), 7.30–7.39 (m, fluorenyl H, 12H), 7.26 (s, spirobifluorenyl H, 4H), 2.04 (broad, —CH$_2$C$_7$H$_{15}$, 32H), 1.00–1.34 (m, —CH$_2$CH$_2$(CH$_2$)$_5$CH$_3$, 160H), 0.66–0.84 (m, —CH$_3$, 48H), 0.64 (broad, —CH$_2$CH$_2$C$_6$H$_{13}$, 32H).

Elemental analysis of the obtained compound (C$_{257}$H$_{336}$) is calculated to be C, 90.11%; H, 9.89%; and found to be C, 89.59%; H, 9.82%.

2,2',7,7'-Tetrakis(9,9,9',9'-tetra-n-propyl-2,2'-bifluoren-7-yl)-9,9'-spirobifluorene (9b). Toluene and a 2.0 M aqueous solution of Na$_2$CO$_3$ (60 equiv; toluene/water at a 6:4 ratio) are added to a Schlenk tube containing 2,2',7,7'-tetrabromo-9,9'-spirobifluorene (1 equiv), 9,9,9',9'-tetra-n-propyl-2,2'-bifluoren-7-yl-boronic acid (5b) (1.25 g, 2.30 mmol) (6 equiv), and Pd(PPh$_3$)$_4$ (5 mol %). The reaction mixture is stirred thoroughly at 90° C. for 2 days followed by the addition of a large amount of methylene chloride. The organic portion is washed with brine, dried over anhydrous MgSO$_4$, and concentrated by evaporating off the solvent. The resulting product is further purified by column chromatography on silica gel petroleum using hexane/chloroform (2:1) as the eluent, resulting in a yield of 72% (0.66 g).

$^1$H NMR spectral analysis (400 MHz, CDCl$_3$) of the obtained compound provides the following data: δ (ppm) 8.10 (d, J=7.96 Hz, spirobifluorenyl H, 4H), 7.84 (dd, J=8.02 Hz, 1.03 Hz, spirobifluorenyl H, 4H), 7.73–7.79 (m, fluorenyl H, 12H), 7.69 (d, J= 7.92 Hz, fluorenyl H, 4H), 7.57–7.65 (m, 20H), 7.49 (dd, J=7.95 Hz, 1.24 Hz, fluorenyl H, 4H), 7.30–7.41 (m, fluorenyl H, 12H), 7.26 (d, J=1.19 Hz, spirobifluorenyl H, 4H), 2.04 (broad, —CH$_2$C$_2$H$_5$, 32H), 0.66–0.75 (m, CH$_2$C$_2$H$_5$, 80H).

Elemental analysis of the obtained compound (C$_{177}$H$_{176}$) is calculated to be C, 92.30%; H, 7.70%; and found to be C, 92.05%; H, 7.80%.

2,2',7,7'-Tetrakis(9,9,9',9',9'',9''-hexa-n-octyl-2,7';2',7''-terfluoren-7-yl)-9,9'-spirobifluorene (10). Toluene and a 2.0 M aqueous solution of Na$_2$CO$_3$ (60 equiv; toluene/water at a 6:4 ratio) are added to a Schlenk tube containing 2,2',7,7'-tetrabromo-9,9'-spirobifluorene (1 equiv), 9,9,9',9',9'',9''-hexa-n-octyl-2,2';7',2''-terfluoren-7-yl-boronic acid (5b) (0.800 g, 0.660 mmol) (6 equiv), and Pd(PPh$_3$)$_4$ (5 mol %). The reaction mixture is stirred thoroughly at 90° C. for 2 days followed by the addition of a large amount of methylene chloride. The organic portion is washed with brine, dried over anhydrous MgSO$_4$, and concentrated by evaporating off the solvent. The resulting product is further purified by column chromatography on silica gel petroleum petroleum ether/methylene chloride (6:1) as the eluent, resulting in a yield of 46% (0.25 g).

$^1$H NMR spectral analysis (400 MHz, CDCl$_3$) of the obtained compound provides the following data: δ (ppm) 8.11 (d, J=7.94 Hz, spirobifluorenyl H, 4H), 7.76–7.86 (m, spirobifluorenyl and fluorenyl H, 24H), 7.58–7.72 (m, fluorenyl H, 40H), 7.51 (d, J=8.27 Hz, fluorenyl H, 4H), 7.32–7.41 (m, fluorenyl H, 12H), 7.24 (s, spirobifluo-renyl H, 4H), 2.07 (broad, —CH$_2$C$_7$H$_{15}$, 48H), 1.00–1.30 (m, —CH$_2$CH$_2$(CH$_2$)$_5$CH$_3$, 240H), 0.60–0.90 (m, —CH$_3$ and —CH$_2$CH$_2$C$_6$H$_{13}$, 120H).

Elemental analysis of the obtained compound (C$_{373}$H$_{496}$) is calculated to be C, 89.96%; H, 10.04%; and found to be C, 89.86%; H, 10.04%.

The following description refers to the reaction scheme shown below.

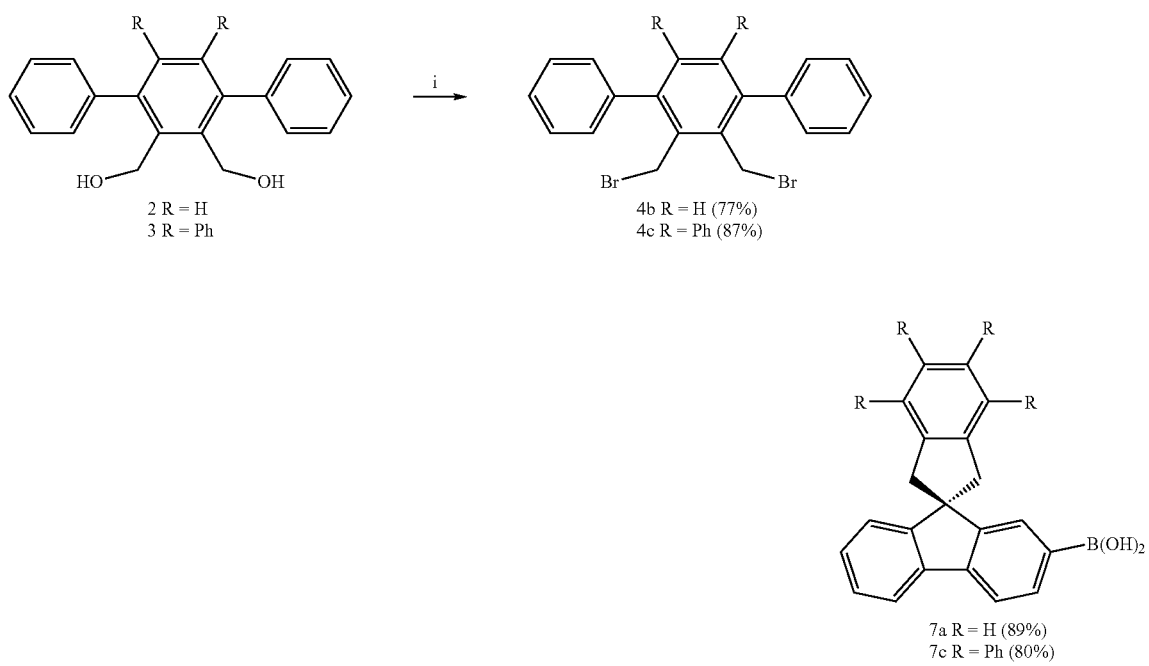

-continued

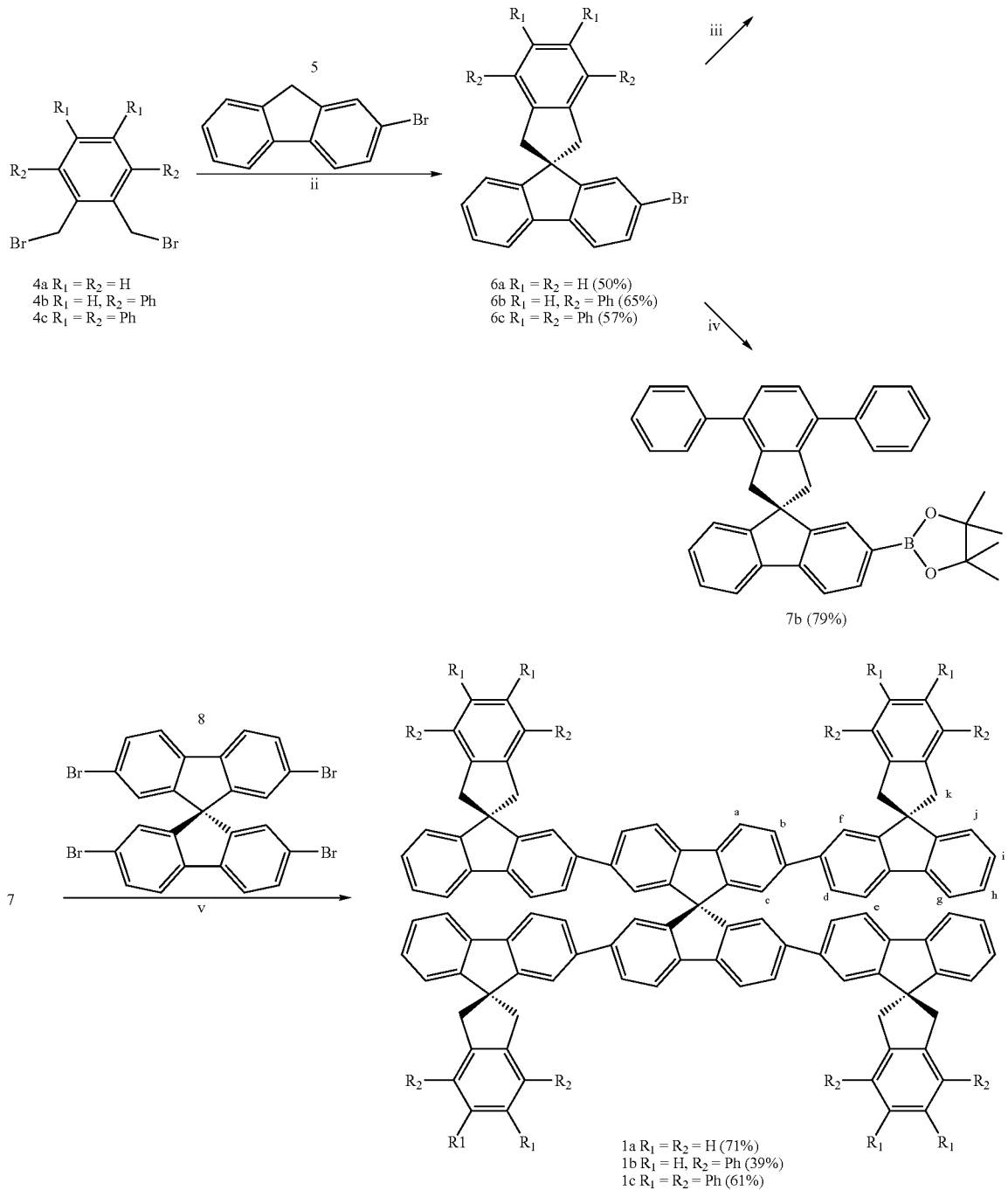

a(i) CBr₄, PPh₃, THF, and rt; (ii) NaOH (50 wt % aq), PTC, DMSO, and rt; (iii) (1) n-BuLi, -78° C., (2) (i-PrO)₃B, -78° C. to rt, and (3) HCl (2 M); (iv) (1) n-BuLi, -78° C., (2) 2-isopropoxy-4,4,5,5-tetramethyl-1,3,2-dioxaborolane, -78° C. to rt, and (3) H₂O; (v) Pd(PPh₃)₄, Na₂CO₃ (2.0 M aq), toluene, and 90° C.

2',3'-Bis(bromomethyl)-p-terphenyl (4b). PPh₃ (28.3 g, 0.108 mmol) is added to a solution of 1,1';4',1''-terphenyl-2'3'-dimethanol (2) (12.5 g, 43.2 mmol) and CBr₄ (35.8 g, 0.107 mol) in anhydrous THF (80 mL) in two portions. The resultant mixture is stirred for 30 min before adding a large amount of water. The mixture is extracted with methylene chloride. The organic extracts are washed with brine and dried over anhydrous MgSO₄. The solvent is removed by evaporation to produce a white solid. Further purification is accomplished by column chromatography on silica gel using petroleum ether/methylene chloride (4:1) as the eluent to yield 13.9 g (77%) of 2',3'-bis(bromomethyl)-p-terphenyl (4b).

$^1$H NMR spectral analysis (400 MHz, CDCl$_3$) of the obtained compound provides the following data: δ (ppm) 7.40–7.60 (m, Ph-H, 10H), 7.30–7.40 (m, Ph-H, 2H), 4.70–4.90 (m, —CH$_2$—, 4H).

1,2-Bis(bromomethyl)-3,4,5,6-tetraphenylbenzol (4c). The same procedures described for the synthesis and purification of 2',3'-bis(bromomethyl)-p-terphenyl (4b) are followed to produce 1,2-bis(bromomethyl)-3,4,5,6-tetraphenylbenzol (4c) as a white solid in a 87% yield.

$^1$H NMR spectral analysis (400 MHz, CDCl$_3$) of the obtained compound provides the following data: δ (ppm) 7.10–7.24 (m, Ph-H, 10H), 6.70–6.90 (m, Ph-H, 10H), 4.66 (s, —CH$_2$—, 4H).

$^{13}$C NMR spectral analysis (100 MHz, CDCl$_3$) of the obtained compound provides the following data: δ (ppm) 142.81, 142.46, 139.50, 138.60, 134.30, 130.71, 130.05, 127.42, 126.85, 125.50, 29.66.

2-Bromospiro(fluorene-9,2'-indene) (6a). A 50 wt % aqueous NaOH solution (10 mL) is added to a solution of 2-bromofluorene (5) (3.0 g, 12.2 mmol) and 1,2-bis(bromomethyl)benzene (4a) (3.24 g, 12.2 mmol) in toluene (20 mL). Subsequently, benzyltriethylammonium chloride (140 mg, 0.614 mmol) is added as a phase transfer catalyst. The reaction mixture is vigorously stirred overnight and then poured into 200 mL water for extraction with methylene chloride. The combined organic extracts are washed with brine before drying over anhydrous MgSO$_4$. After the solvent has evaporated, the solid residue is purified by column chromatography on silica gel using petroleum ether as the eluent to yield a white solid product in 50% yield (2.14 g).

$^1$H NMR spectral analysis (400 MHz, CDCl$_3$) of the obtained compound provides the following data: δ (ppm) 7.73 (dd, fluorenyl-H, 1H), 7.62 (d and broad, fluorenyl-H, 1H), 7.49 (dd, fluorenyl-H, 1H), 7.30–7.43 (m, Ar—H, 2H), 7.22–7.28 (m, Ar—H, 6H), 3.46 (m, —CH$_2$—, 4H).

$^{13}$C NMR spectral analysis (100 MHz, CDCl$_3$) of the obtained compound provides the following data: δ (ppm) 154.54, 152.10, 142.34, 138.61, 138.54, 130.47, 127.96, 127.53, 127.01, 125.73, 124.77, 122.42, 121.16, 119.86, 57.41, 45.21.

2-Bromo-4',7'-diphenylspiro(fluorene-9,2'-indene) (6b). A 50 wt % aqueous NaOH solution (35 mL) is added to a solution of 2-bromofluorene (5) (2.36 g, 9.63 mmol) and 2',3'-bis(bromomethyl)-p-terphenyl (4b) (4.0 g, 9.61 mmol) in toluene (70 mL). Subsequently, benzyltriethylammonium chloride (110 mg, 0.483 mmol) is added as a phase transfer catalyst. The reaction mixture is vigorously stirred for 5 h when an additional amount of 2-bromofluorene (5) (0.90 g, 3.92 mmol) is added. The reaction was allowed to continue until 2',3'-bis(bromomethyl)-p-terphenyl (4b) is completely consumed, as monitored by thin-layer chromatography. The reaction mixture is then shaken with water (200 mL) and methylene chloride (200 mL). The organic phase is separated, and the aqueous phase is extracted with methylene chloride. The combined organic extracts are washed with brine and dried over anhydrous MgSO$_4$. After the solvent is evaporated, the solid residue is washed with a large amount of acetone to yield 2.66 g of (6b) as a white solid product.

After the acetone is evaporated, the solid residue is further purified on a silica gel column using petroleum ether/methylene chloride (4:1) as the eluent, yielding additional 0.45 g of (6b). The total yield is 65%.

$^1$H NMR spectral analysis (400 MHz, CDCl$_3$) of the obtained compound provides the following data: δ (ppm) 7.65 (d, fluorenyl-H, 1H), 7.28–7.58 (m, Ar—H, 16H), 7.18–7.24 (m, Ar—H, 2H), 3.66 (d, —CH$_2$—, 2H), 3.54 (d, —CH$_2$—, 2H).

$^{13}$C NMR spectral analysis (100 MHz, CDCl$_3$) of the obtained compound provides the following data: δ (ppm) 153.73, 151.96, 140.76, 140.58, 138.80, 138.47, 137.74, 130.55, 128.55, 128.41, 128.17, 127.97, 127.58, 127.17, 125.85, 122.23, 121.22, 119.99, 57.66, 45.27.

2-Bromo-4',5',6',7'-tetraphenylspiro(fluorene-9,2'-indene) (6c). The procedures described above for the synthesis and purification of 2-bromo-4',7'-diphenylspiro(fluorene-9,2'-indene) (6b) are followed to produce 2.32 g of 2-bromo-4',5', 6',7'-tetraphenylspiro(fluorene-9,2'-indene) (6c) at a 58% yield.

1H NMR spectral analysis (400 MHz, CDCl$_3$) of the obtained compound provides the following data: δ (ppm) 7.60–7.70 (m, fluorenyl-H, 2H), 7.55 (d, fluorenyl-H, $^1$H), 7.42–7.48 (m, fluorenyl-H, 2H), 7.29–7.38 (m, fluorenyl-H, 3H), 7.0–7.20 (m, Ph-H, 10H), 6.80–7.00 (m, Ph-H, 10H), 3.47 (d, —CH$_2$—, 2H), 3.36 (d, —CH$_2$—, 2H).

$^{13}$C NMR spectral analysis (100 MHz, CDCl$_3$) of the obtained compound provides the following data: δ (ppm) 154.36, 152.72, 140.25, 140.10, 139.97, 139.90, 138.68, 138.30, 137.64, 131.58, 131.50, 130.33, 129.78, 128.00, 127.52, 127.40, 126.60, 126.09, 125.80, 125.30, 122.14, 121.13, 121.08, 119.77, 56.68, 45.72.

[Spiro(fluorene-9,2'-inden)-2-yl]-boronic acid (7a). n-BuLi (1.2 equiv) is added to a solution of 2-bromospiro (fluorene-9,2'-indene) (6a) in anhydrous THF at −78° C. After stirring the mixture for 1 h, triisopropyl borate (1.5 equiv) is added. The reaction mixture is allowed to warm to room temperature and then is stirred overnight. 2.0 N HCl (10 equiv) is added to quench the reaction. The reaction mixture is mixed with a large amount of water for extraction with ether. The organic extracts are washed with brine before drying over anhydrous MgSO$_4$. After the solvent is evaporated, the crude product of (7a) is washed with hexane several times to yield a white powder (89%).

$^1$H NMR spectral analysis (400 MHz, CDCl$_3$) of the obtained compound provides the following data: δ (ppm) 7.60–8.16 (m, fluorenyl-H, 4H), 7.28–7.45 (m, Ar—H, 4H), 7.21–7.28 (m, Ar—H, 3H), 3.25–3.75 (m, —CH$_2$—, 4H).

2-[4',7'-Diphenylspiro(fluorene-9,2'-inden)-2-yl]-4,4,5,5-tetramethyl-[1,3,2]-dioxaborolane, (7b). n-BuLi (1.2 equiv) is added to a solution of 2-bromo-4',7'-diphenylspiro(fluorene-9,2'-indene) (6b) in anhydrous THF at −78° C. After stirring the mixture for 1 h, 2-isopropyl-4,4,5,5-tetramethyl-1,3,2-dioxaborolane (1.5 equiv) is added. The reaction mixture is allowed to warm to room temperature and then is stirred overnight. The reaction mixture is mixed with a large amount of water for extraction with ether. The organic extracts are washed with brine before drying over anhydrous MgSO$_4$. The crude product of 2-[4',7'-diphenylspiro(fluorene-9,2'-inden)-2-yl]-4,4,5,5-tetramethyl-[1,3,2]-dioxaborolane (7b) is purified by column chromatography on silica gel using methylene chloride as the eluent yielding a white powder (79%).

$^1$H NMR spectral analysis (400 MHz, CDCl$_3$) of the obtained compound provides the following data: δ (ppm) 8.10 (s, fluorenyl-H, 1H), 7.83 (d, fluorenyl-H, 1H), 7.70 (dd, fluoren-yl-H, 2H), 7.47–7.53 (m, Ar—H, 6H), 7.35–7.41 (m, Ar—H, 4H), 7.20–7.32 (m, Ar—H, 3H), 7.00–7.10 (m, Ar—H, 1H), 6.95 (d, Ar—H, 1H), 4.0 (d, —CH$_2$—, 2H), 3.28 (d, —CH$_2$—, 2H), 1.40 (s, —CH$_3$, 12H).

[4'5',6',7'-Tetraphenylspiro(fluorene-9,2'-inden)-2-yl]-boronic acid (7c). n-BuLi (1.2 equiv) is added to a solution of 2-bromo-4',5',6',7'-tetraphenylspiro(fluorene-9,2'-indene) (6c) in anhydrous THF at −78° C. After stirring the mixture for 1 h, triisopropyl borate (1.5 equiv) is added. The reaction mixture is allowed to warm to room temperature and then is stirred overnight. 2.0 N HCl (10 equiv) is added to quench the reaction. The reaction mixture is mixed with a large amount of water for extraction with ether. The organic extracts are washed with brine before drying over anhydrous MgSO$_4$. After the solvent is evaporated, the crude product of (7c) is washed with hexane several times to yield a white powder (80%).

$^1$H NMR spectral analysis (400 MHz, CDCl$_3$) of the obtained compound provides the following data: δ (ppm) 8.28–8.40 (m, fluorenyl-H, 1H), 7.25–8.00 (m, fluorenyl-H, 6H), 6.85–7.20 (m, Ph-H, 20H), 3.25–3.75 (m, —CH$_2$—, 4H).

2,2',7,7'-Tetrakis[spiro(fluorene-9,2'-inden)-2-yl]-9,9'-spirobifluorene (1a). Toluene and a 2.0 M aqueous solution of Na$_2$CO$_3$ (50 equiv; toluene/water at 6:4) are added to Shlenck tube containing 2,2',7,7'-tetrabromo-9,9'-spirobifluorene (8) (1 equiv), (7a) (5-6 equiv) and Pd(PPh$_3$)$_4$ (8 mol %). The reaction mixture is stirred vigorously at 90 IC for 2 days followed by the addition of a large amount of methylene chloride. The organic phase is separated and washed with brine before drying over anhydrous MgSO$_4$. After the solvent is evaporated, the crude product of (1a) is purified by column chromatography on silica gel using petroleum ether/methylene chloride (2:1) as the eluent. The resulting product is precipitated from a cholorform solution into methanol followed by thorough drying to yield a white powder (71%).

$^1$H NMR spectral analysis (400 MHz, CDCl$_3$) of the obtained compound provides the following data: δ (ppm) 7.93 (d, Ha, 4H), 7.66–7.71 (m, Hd,e, 8H), 7.63 (dd, Hb, 4H), 7.47 (dd, Hf, 4H), 7.10–7.40 (m, Hg,h,i,j and Ph-H, 32H), 6.94 (d, Hc, 4H), 3.45 (d, Hk, 8H). 3.34 (d, Hk, 8H).

$^{13}$C NMR spectral analysis (100 MHz, CDCl$_3$) of the obtained compound provides the following data: δ (ppm) 152.81, 152.53, 149.64, 142.72, 140.89, 140.59, 140.11, 139.03, 138.80, 127.38, 127.28, 126.90, 126.73, 126.41, 124.58, 122.51, 122.10, 120.90, 120.32, 119.88, 119.76, 66.12, 57.46, 45.22.

Elemental analysis of the obtained compound (C$_{109}$H$_{72}$) is calculated to be C, 94.75%; H, 5.25%; and found to be C, 94.41%; H, 5.30%.

2,2',7,7'-Tetrakis[4',7'-diphenylspiro(fluorene-9,2'-inden)-2-yl]-9,9'-spirobifluorene, (1b). Toluene and a 2.0 M aqueous solution of Na2CO3 (50 equiv; toluene/water at 6:4) are added to Shlenck tube containing 2,2',7,7'-tetrabromo-9,9'-spirobifluorene (8) (1 equiv), (7b) (5-6 equiv) and Pd(PPh$_3$)$_4$ (8 mol %). The reaction mixture is stirred vigorously at 90° C. for 2 days followed by the addition of a large amount of methylene chloride. The organic phase is separated and washed with brine before drying over anhydrous MgSO$_4$. After the solvent is evaporated, the crude product of (1b) is washed repeatedly with toluene. The resulting product is precipitated from a cholorform solution into methanol followed by thorough drying to yield a white powder (39%).

$^1$H NMR spectral analysis (400 MHz, CDCl$_3$) of the obtained compound provides the following data: δ (ppm) 8.16 (d, Ha, 4H), 7.89 (dd, Hb, 4H), 7.60–7.70 (m, Hd,e,f, 12H), 7.00–7.36 (m, Hg,h,i,j and Ph-H, 64H), 6.94 (d, Hc, 4H), 3.62 (d, Hk, 8H), 3.34 (d, Hk, 8H).

Elemental analysis of the obtained compound (C$_{157}$H$_{104}$) is calculated to be C, 94.73%; H, 5.27%; and found to be C, 94.47%; H, 5.37%.

2,2',7,7'-Tetrakis[4',5',6',7'-tetraphenylspiro(fluorene-9,2'-inden)-2-yl]-9,9'-spirobifluorene (1c). Toluene and a 2.0 M aqueous solution of Na$_2$CO$_3$ (50 equiv; toluene/water at 6:4) are added to Shlenck tube containing 2,2',7,7'-tetrabromo-9,9'-spirobifluorene (8) (1 equiv), (7c) (5-6 equiv) and Pd(PPh$_3$)$_4$ (8 mol %). The reaction mixture is stirred vigorously at 90° C. for 2 days followed by the addition of a large amount of methylene chloride. The organic phase is separated and washed with brine before drying over anhydrous MgSO$_4$. After the solvent is evaporated, the crude product (1c) is purified by column chromatography on silica gel using petroleum ether/methylene chloride (2:1) as the eluent. The resulting product is precipitated from a cholorform solution into methanol followed by thorough drying to yield a white powder (61%).

$^1$H NMR spectral analysis (400 MHz, CDCl$_3$) of the obtained compound provides the following data: δ (ppm) 8.05 (d, Ha, 4H), 7.75 (dd, Hb, 4H), 7.55–7.80 (m, Hd,e,f, 12H), 7.20–7.50 (m, Hg,h,i,j, 16H), 7.14 (d, Hc, 4H), 6.80–7.05 (m, Ph-H, 80H), 3.60 (d, Hk, 8H), 3.20 (d, Hk, 8H).

$^{13}$C NMR spectral analysis (100 MHz, CDCl$_3$) of the obtained compound provides the following data: δ (ppm) 154.05, 152.01, 149.84, 140.99, 140.73, 140.20, 140.05, 139.95, 139.74, 139.10, 138.75, 137.59, 131.63, 131.57, 129.81, 127.60, 127.47, 127.24, 127.06, 126.66, 126.60, 126.01, 125.27, 122.55, 121.76, 120.98, 120.56, 119.95, 119.76, 66.43, 56.74, 45.82.

Elemental analysis of the obtained compound (C$_{205}$H$_{136}$) is calculated to be C, 94.73%; H, 5.27%; and found to be C, 94.43%; H, 5.14%.

While this invention has been described in conjunction with specific embodiments above, it is evident that many alternatives, combinations, modifications, and variations are apparent to those skilled in the art. Accordingly, the preferred embodiments of this invention, as set forth above are intended to be illustrative. Various changes and combinations can be made without departing from the spirit and scope of this invention.

What is claimed is:

1. A composition comprising a plurality of light-emitting organic oligomers, each of the oligomers comprising:
   a first segment of fluorene residues in a first sequence;

a second segment of fluorene residues in a second sequence; and an aromatic unit linking the first and second segments;

wherein the oligomers of the composition are substantially uniform in chain length and chemical composition.

2. The composition of claim 1, wherein the first and second fluorene components each comprise at least one fluorene residue.

3. The composition of claim 2, wherein each said at least one fluorene residue comprises two pendant groups in a 9-carbon position.

4. The composition of claim 3, wherein at least one of the pendant groups is achiral.

5. The composition of claim 3, wherein at least one of the pendant groups is chiral.

6. The composition of claim 3, wherein the pendant groups are alkyl groups or alkoxy groups.

7. The composition of claim 3, wherein the pendant groups comprise from about 2 to about 20 carbon atoms.

8. The composition of claim 3, wherein at least one of the pendant groups has a branched structure.

9. The composition of claim 3, wherein at least one of the pendant groups has a straight-chain structure.

10. The composition of claim 3, wherein each said at least one fluorene residue is linked to at least one other fluorene residue or the aromatic component at a 2- carbon or a 7-carbon position.

11. The composition of claim 1, wherein each of the first and second fluorene components comprises an endgroup selected from the group consisting of hydrogen, benzene and an alkyl group.

12. The composition of claim 1, wherein the aromatic group is selected from the group consisting of:

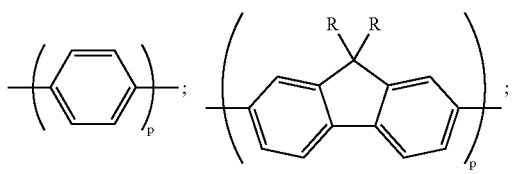

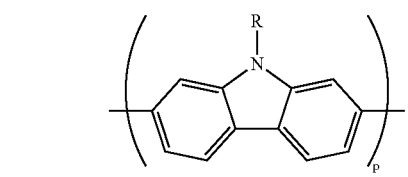

p = 1–10; R = $C_qH_{2q+1}$ or $O(CH_2CH_2)_qCH_3$

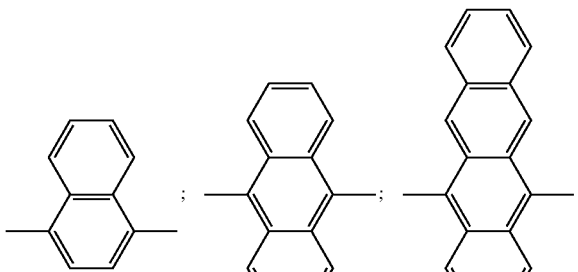

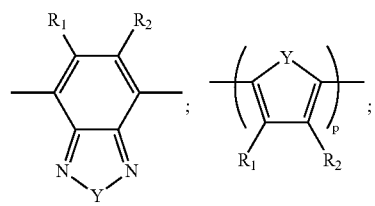

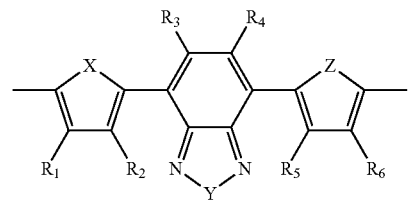

p = 1–10; $R_1, R_2, R_3, R_4, R_5, R_6$ = H, $C_qH_{2q+1}$ or $O(CH_2CH_2)_qCH_3$
X, Y, Z = O, S or N

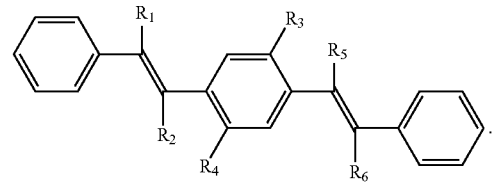

$R_1, R_2, R_5, R_6$ = H or CN
$R_3, R_4$ = H, CN, $OC_qH_{2q+1}$ or $C_qH_{2q+1}$

13. The composition of claim 1, wherein the oligomers are represented by the following formula:

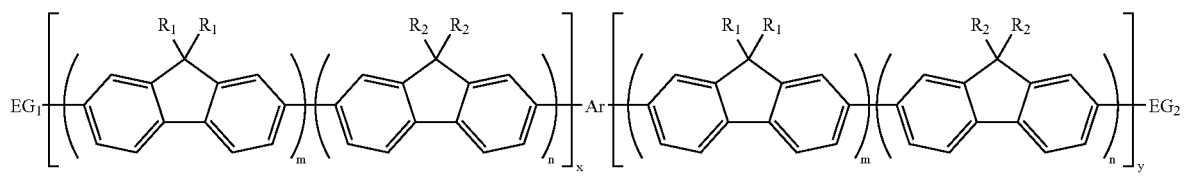

where:
- R$_1$ and R$_2$ are substituted or unsubstituted alkyl and/or alkoxy groups;
- EG$_1$ and EG$_2$ are endgroups;
- Ar is a group including one or more aromatic substituents; and
- m and n are from about 0 to about 10 and m+n is at least 1;
- x and y are from about 1 to about 5; and
- (m+n)(x+y) is from about 2 to about 20.

14. The composition of claim 13, wherein at least one of R$_1$ and R$_2$ is achiral.

15. The composition of claim 13, wherein at least one of R$_1$ and R$_2$ is chiral.

* * * * *